United States Patent
Oh et al.

(10) Patent No.: US 9,324,758 B2
(45) Date of Patent: Apr. 26, 2016

(54) DEPTH PIXEL INCLUDED IN THREE-DIMENSIONAL IMAGE SENSOR AND THREE-DIMENSIONAL IMAGE SENSOR INCLUDING THE SAME

(71) Applicants: Min-Seok Oh, Osan-si (KR); Hae-Kyung Kong, Yongin-si (KR); Tae Chan Kim, Yongin-si (KR); Jung Chak Ahn, Yongin-si (KR); Moo Sup Lim, Yongin-si (KR)

(72) Inventors: Min-Seok Oh, Osan-si (KR); Hae-Kyung Kong, Yongin-si (KR); Tae Chan Kim, Yongin-si (KR); Jung Chak Ahn, Yongin-si (KR); Moo Sup Lim, Yongin-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 14/077,602

(22) Filed: Nov. 12, 2013

(65) Prior Publication Data
US 2014/0252437 A1    Sep. 11, 2014

(30) Foreign Application Priority Data
Mar. 11, 2013 (KR) .................. 10-2013-0025702

(51) Int. Cl.
*H01L 31/062* (2012.01)
*H01L 27/146* (2006.01)

(52) U.S. Cl.
CPC ...... *H01L 27/14643* (2013.01); *H01L 27/1461* (2013.01); *H01L 27/14603* (2013.01); *H01L 27/14612* (2013.01); *H01L 27/14641* (2013.01)

(58) Field of Classification Search
CPC .............. H01L 27/14643; H01L 27/14603; H01L 27/14641; H01L 27/14612; H01L 27/1461
See application file for complete search history.

(56) References Cited

U.S. PATENT DOCUMENTS

| | | | |
|---|---|---|---|
| 6,777,659 B1 | 8/2004 | Schwarte | |
| 7,053,357 B2 | 5/2006 | Schwarte | |
| 7,060,957 B2 | 6/2006 | Lange et al. | |
| 7,352,454 B2 | 4/2008 | Bamji et al. | |
| 7,464,351 B2 | 12/2008 | Bamji et al. | |
| 7,671,391 B2 | 3/2010 | Kawahito | |
| 7,834,305 B2 | 11/2010 | Hagio et al. | |
| 7,884,310 B2 | 2/2011 | Buettgen | |
| 7,994,465 B1 | 8/2011 | Bamji et al. | |
| 8,106,472 B2 | 1/2012 | Kaufmann et al. | |
| 8,115,158 B2 | 2/2012 | Buettgen | |
| 8,598,638 B2 * | 12/2013 | Kenichi | 257/290 |
| 2005/0269604 A1* | 12/2005 | Koizumi et al. | 257/291 |
| 2008/0035957 A1* | 2/2008 | Park et al. | 257/204 |
| 2009/0065830 A1* | 3/2009 | Hyun | 257/292 |
| 2009/0284731 A1* | 11/2009 | Jin et al. | 356/4.01 |
| 2011/0025893 A1 | 2/2011 | Kim et al. | |
| 2011/0089471 A1 | 4/2011 | Buettgen et al. | |
| 2011/0157354 A1 | 6/2011 | Kawahito | |

(Continued)

*Primary Examiner* — A. Sefer
(74) *Attorney, Agent, or Firm* — Harness, Dickey & Pierce, P.L.C.

(57) ABSTRACT

A depth pixel includes a photo detection region, first and second photo gates and first and second floating diffusion regions. The photo detection region collects photo charges based on light reflected by an object. The collected photo charges are drifted in a first direction and a second direction different from the first direction based on an internal electric field in the photo detection region. The first photo gate is activated in response to a first photo control signal. The first floating diffusion region accumulates first photo charges drifted in the first direction if the first photo gate is activated. The second photo gate is activated in response to the first photo control signal. The second floating diffusion region accumulates second photo charges drifted in the second direction if the second photo gate is activated.

25 Claims, 37 Drawing Sheets

(56) References Cited

U.S. PATENT DOCUMENTS

| | | | |
|---|---|---|---|
| 2011/0198481 A1* | 8/2011 | Kim | H01L 27/14614 250/208.1 |
| 2012/0001681 A1* | 1/2012 | Du Plessis | 327/535 |
| 2012/0133737 A1* | 5/2012 | Min et al. | 348/46 |
| 2013/0087875 A1* | 4/2013 | Kobayashi et al. | 257/432 |
| 2014/0117429 A1* | 5/2014 | Nomoto et al. | 257/292 |

* cited by examiner

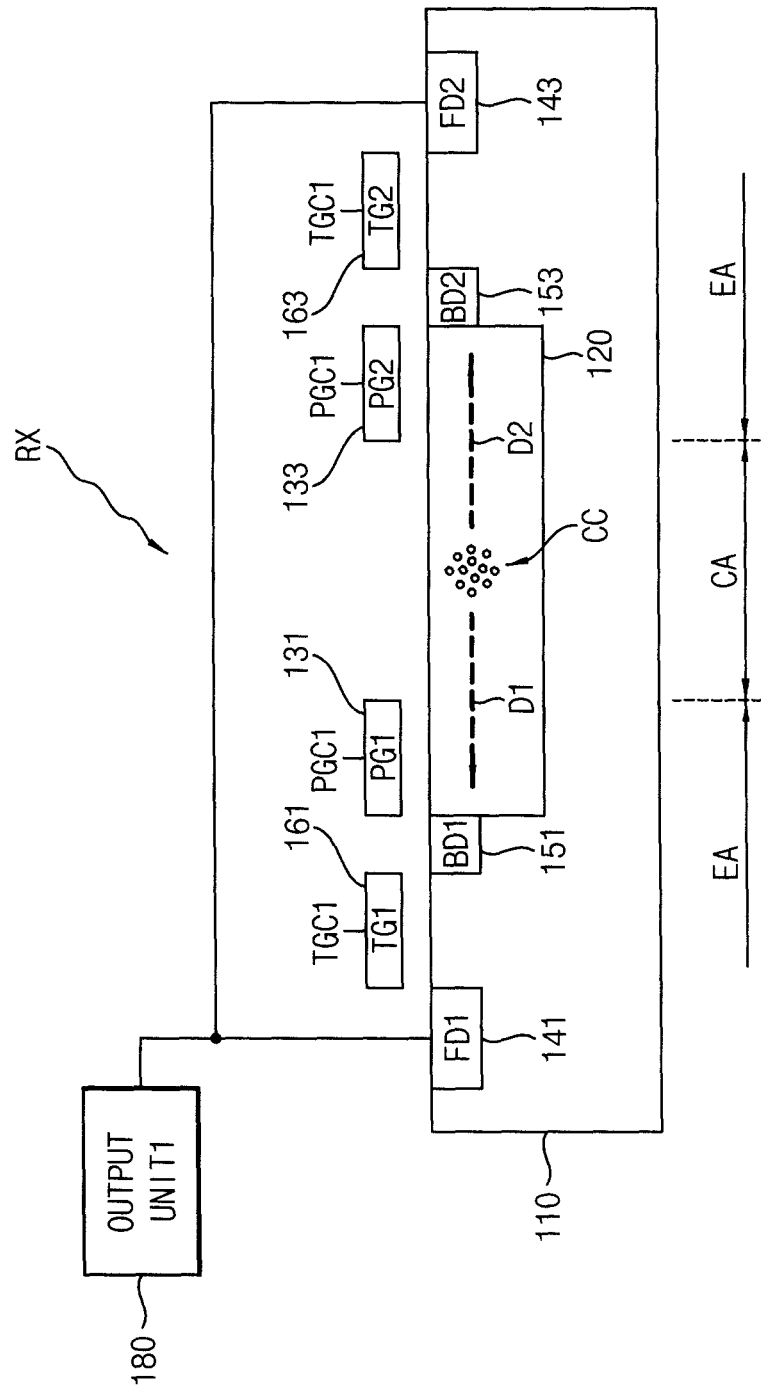

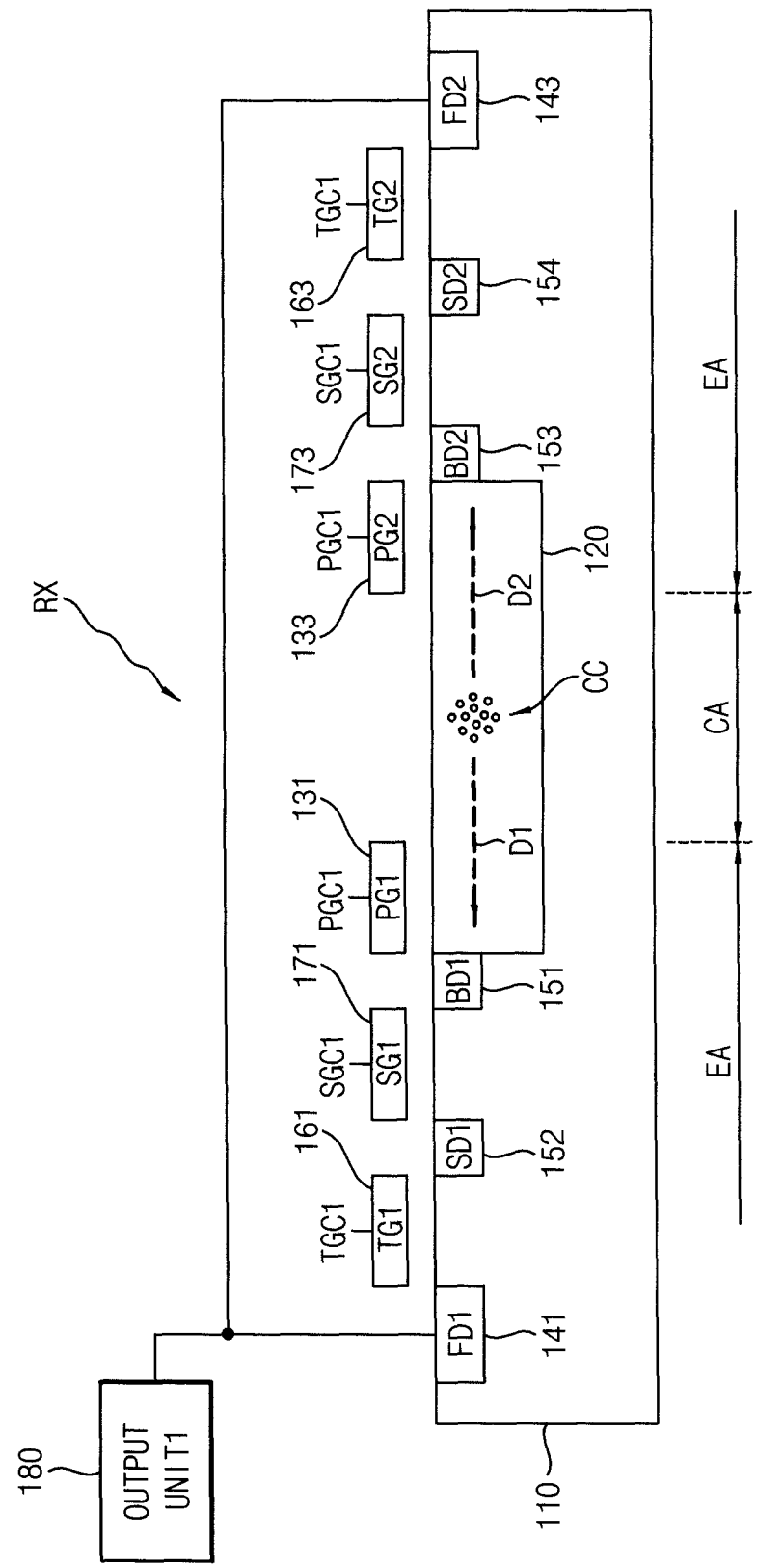

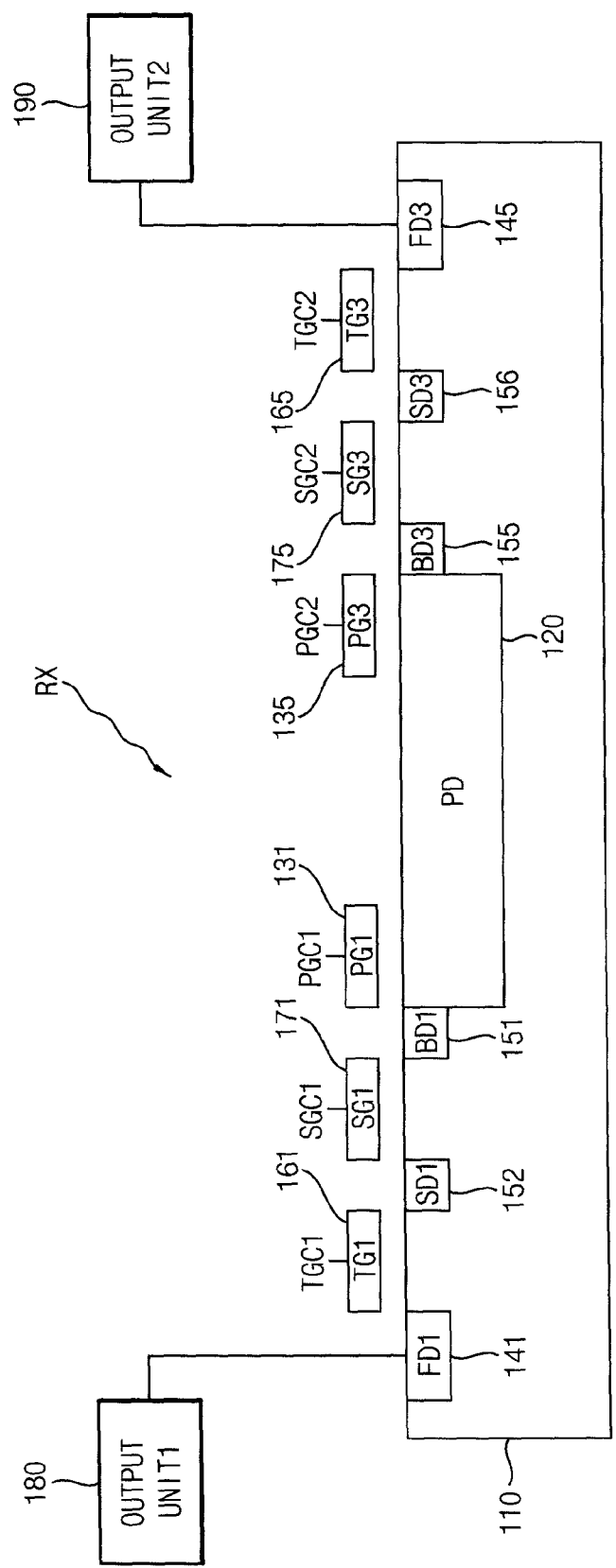

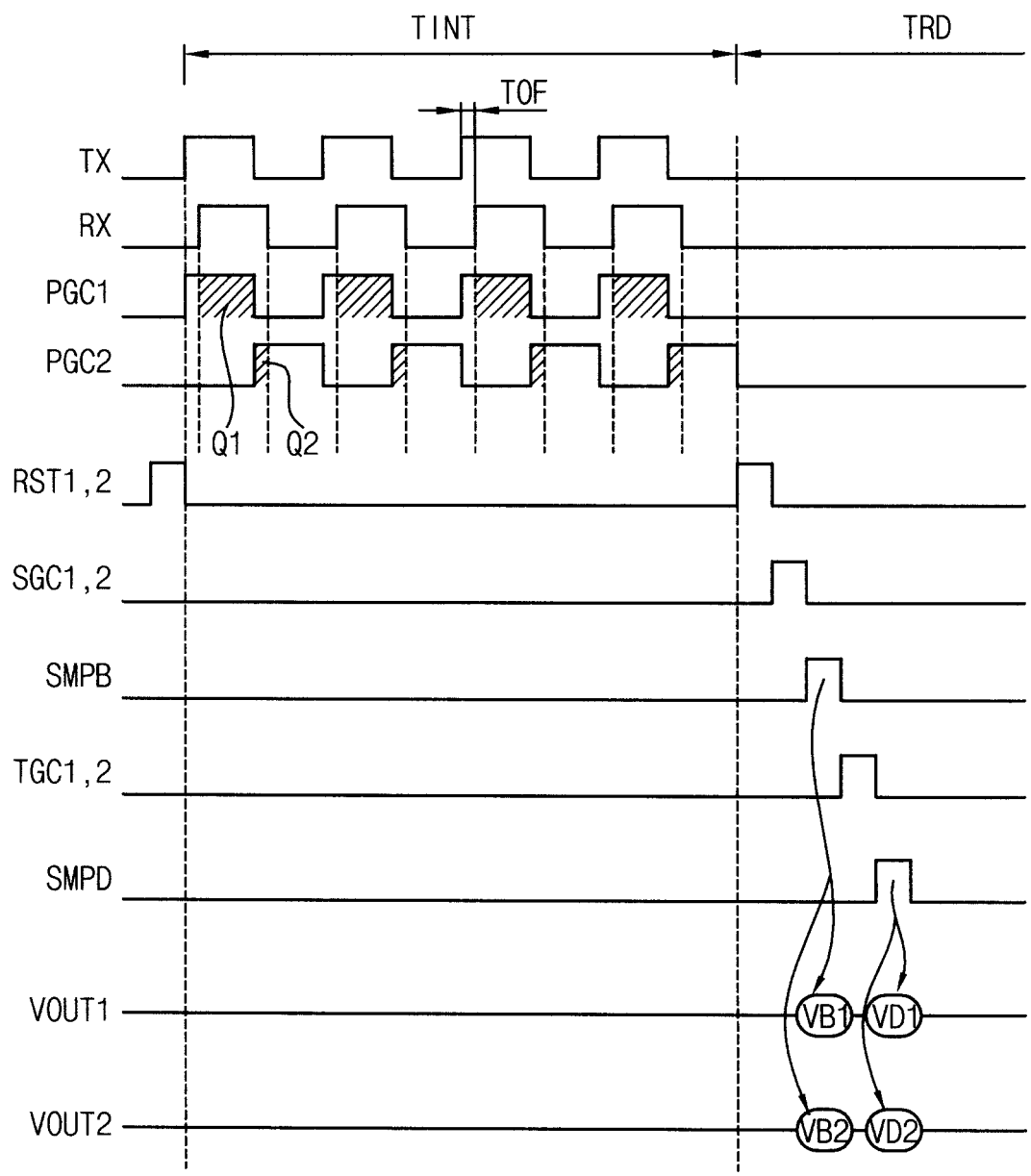

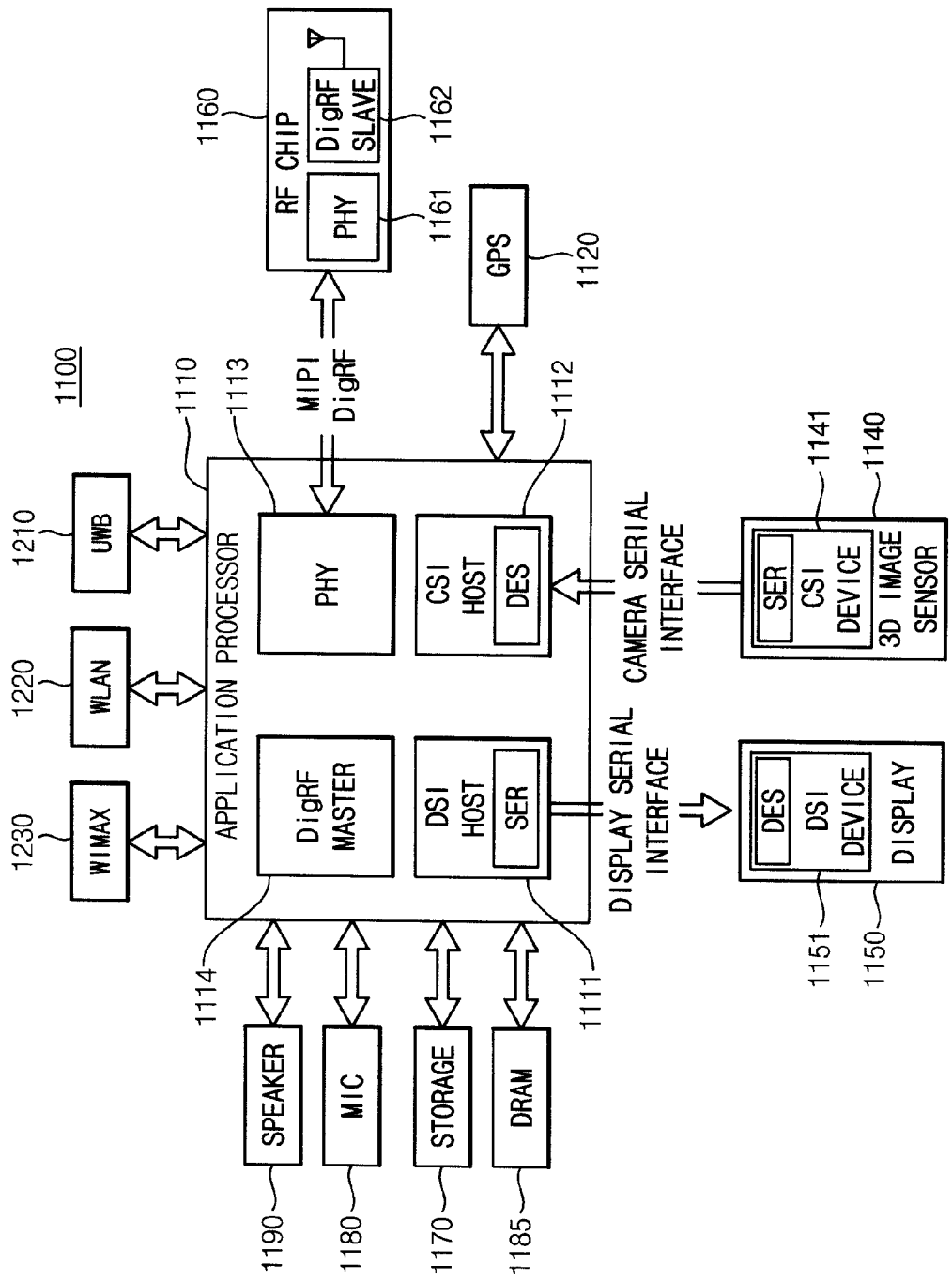

DEPTH PIXEL INCLUDED IN THREE-DIMENSIONAL IMAGE SENSOR AND THREE-DIMENSIONAL IMAGE SENSOR INCLUDING THE SAME

CROSS-REFERENCE TO RELATED APPLICATION

This application claims priority under 35 USC §119 to Korean Patent Application No. 2013-0025702, filed on Mar. 11, 2013 in the Korean Intellectual Property Office (KIPO), the contents of which are herein incorporated by reference in their entirety.

BACKGROUND

1. Technical Field

Example embodiments relate generally to image sensors, and more particularly to depth pixels included in three-dimensional (3D) image sensors and/or 3D image sensors including the depth pixels.

2. Description of the Related Art

An image sensor is a semiconductor device that transforms a light signal input from outside to an electric signal (i.e., performs photoelectric transformations) to provide image information corresponding to the light signal. Recently, a three-dimensional (3D) image sensor that provides distance information as well as the image information based on the light signal has been suggested. Typically, the 3D image sensor may measure a distance between each unit pixel and an object by measuring a time of flight (TOF) that corresponds to an elapsed time during which an optical pulse (i.e., a laser pulse) is emitted toward the object by a light source, and then input to the unit pixel after being reflected by the object.

SUMMARY

Accordingly, inventive concepts are provided to substantially obviate one or more problems due to limitations and disadvantages of the related art.

Some example embodiments provide a depth pixel included in a three-dimensional (3D) image sensor capable of having relatively high sensitivity even if a size of a photo gate decreases.

Some example embodiments provide a three-dimensional (3D) image sensor capable of having relatively high sensitivity even if a size of a photo gate of a depth pixel decreases.

According to at least one example embodiment, a depth pixel included in a three-dimensional (3D) image sensor includes a photo detection region, a first photo gate, a first floating diffusion region, a second photo gate and a second floating diffusion region. The photo detection region collects photo charges based on light reflected by an object and is configured to direct the collected photo charges in a first direction and a second direction different from the first direction based on an internal electric field in the photo detection region. The first photo gate is over the photo detection region and is activated in response to a first photo control signal. The first floating diffusion region accumulates first photo charges of the collected photo charges if the first photo gate is activated. The first photo charges are drifted in the first direction. The second photo gate is over the photo detection region, is spaced apart from the first photo gate, and is activated in response to the first photo control signal. The second floating diffusion region accumulates second photo charges of the collected photo charges if the second photo gate is activated. The second photo charges are drifted in the second direction.

The photo detection region may be formed in a semiconductor substrate by doping impurities having a conductive type different from that of the semiconductor substrate. A doping density in the photo detection region may gradually decrease as a first distance from the first photo gate or a second distance from the second photo gate increases.

The first photo gate and the second photo gate may be over an edge area of the photo detection region. A doping density of the edge area of the photo detection region may be higher than a doping density of a central area of the photo detection region.

The first direction may be from the central area of the photo detection region to the first photo gate. The second direction may be from the central area of the photo detection region to the second photo gate.

The depth pixel may further include a first gate. The first gate may be over the photo detection region and may be between the first photo gate and the second photo gate. The first gate is configured to control the internal electric field based on a first voltage.

The first photo gate and the second photo gate may be over respective edge areas of the photo detection region. The first gate may be over a central area of the photo detection region.

The first direction may be from the first gate to the first photo gate. The second direction may be from the first gate to the second photo gate.

The first voltage may be a negative voltage if the photo detection region collects electrons of electron-hole pairs and the first voltage may be a positive voltage if the photo detection region collects holes of the electron-hole pairs.

A size of the first photo gate and a size of the second photo gate may be smaller than a size of the photo detection region.

The depth pixel may further include a first output unit. The first output unit may generate a first output voltage corresponding to a sum of the first photo charges and the second photo charges.

The first output unit may include a first reset transistor, a first drive transistor and a first select transistor. The first reset transistor may reset the first floating diffusion region and the second floating diffusion region in response to a first reset signal. The first drive transistor may amplify a voltage of the first floating diffusion region and a voltage of the second floating diffusion region. The first select transistor may output the voltages amplified by the first drive transistor as the first output voltage.

The depth pixel may further include a third photo gate, a third floating diffusion region, a fourth photo gate and a fourth floating diffusion region. The third photo gate may be over the photo detection region and may be activated in response to a second photo control signal. The third floating diffusion region may accumulate third photo charges of the collected photo charges if the third photo gate is activated. The third photo charges may be drifted in the first direction. The fourth photo gate may be over the photo detection region, may be spaced apart from the third photo gate, and may be activated in response to the second photo control signal. The fourth floating diffusion region may accumulate fourth photo charges of the collected photo charges when the fourth photo gate is activated. The fourth photo charges may be drifted in the second direction.

The depth pixel may further include a first temporary storage region, a second temporary storage region and first and second transfer gates. The first temporary storage region may store the first photo charges if the first photo gate is activated. The second temporary storage region may store the second photo charges if the second photo gate is activated. The first and second transfer gates may be activated in response to a first transfer control signal. The first and second photo charges stored in the first and second temporary storage regions may be transferred to the first and second floating diffusion regions, respectively, if the first and second transfer gates are activated.

The first and second temporary storage regions may be adjacent to the photo detection region or spaced apart from the photo detection region.

The depth pixel may further include first and second bridge diffusion regions, first and second storage regions, first and second storage gates and first and second transfer gates. The first and second bridge diffusion regions may be adjacent to the photo detection region, and may store the first and second photo charges, respectively, if the first and second photo gates are activated. The first and second storage regions may be spaced apart from the first and second bridge diffusion regions, respectively. The first and second storage gates may be activated in response to a first storage control signal. The first and second transfer gates may be activated in response to a first transfer control signal. The first and second photo charges stored in the first and second bridge diffusion regions may be transferred to the first and second storage regions, respectively, if the first and second storage gates are activated. The first and second photo charges stored in the first and second storage regions may be transferred to the first and second floating diffusion regions, respectively, if the first and second transfer gates are activated.

According to at least one example embodiment, a depth pixel included in a three-dimensional (3D) image sensor includes a photo detection region, a first photo gate and a first floating diffusion region. The photo detection region collects photo charges based on a reception light reflected by an object and directs the collected photo charges in a first direction based on an internal electric field in the photo detection region. The first photo gate is over the photo detection region and is activated in response to a first photo control signal. The first floating diffusion region accumulates first photo charges of the collected photo charges if the first photo gate is activated. The first photo charges are drifted in the first direction. The photo detection region has a conductive type different from that of a semiconductor substrate, and doping density in the photo detection region gradually decreases as a first distance from the first photo gate increases.

The depth pixel may further include a first gate. The first gate may be over the photo detection region and configured to control the internal electric field based on a first voltage applied to the first gate.

The first photo gate and the first gate may be over respective edge areas of the photo detection region.

The first direction may be from the first gate to the first photo gate.

The depth pixel may further include a second photo gate and a second floating diffusion region. The second photo gate may be over the photo detection region, may be spaced apart from the first photo gate, and may be activated in response to a second photo control signal. The second floating diffusion region may accumulate second photo charges of the collected photo charges if the second photo gate is activated. The second photo charges may be drifted in the first direction.

The depth pixel may further include a first temporary storage region and a first transfer gate. The first temporary storage region may store the first photo charges if the first photo gate is activated. The first transfer gate may be activated in response to a first transfer control signal. The first photo charges stored in the first temporary storage region may be transferred to the first floating diffusion region if the first transfer gate is activated.

The depth pixel may further include a first bridge diffusion region, a first storage region, a first storage gate and a first transfer gate. The first bridge diffusion region may be adjacent to the photo detection region and may store the first photo charges if the first photo gate is activated. The first storage region may be spaced apart from the first bridge diffusion region. The first storage gate may be activated in response to a first storage control signal. The first transfer gate may be activated in response to a first transfer control signal. The first photo charges stored in the first bridge diffusion region may be transferred to the first storage region if the first storage gate is activated. The first photo charges stored in the first storage region may be transferred to the first floating diffusion region if the first transfer gate is activated.

According to at least one example embodiment, a three-dimensional (3D) image sensor includes a light source module and a pixel array. The light source module emits a transmission light. An object is illuminated with the transmission light. The pixel array includes a plurality of depth pixels and generates depth information from the 3D image sensor to the object based on light reflected by the object. A first depth pixel of the plurality of depth pixels includes a photo detection region, a first photo gate, a first floating diffusion region, a second photo gate and a second floating diffusion region. The photo detection region collects photo charges based on the reception light and directs the collected photo charges in a first direction and a second direction different from the first direction based on an internal electric field in the photo detection region. The first photo gate is over the photo detection region and is activated in response to a first photo control signal. The first floating diffusion region accumulates first photo charges of the collected photo charges if the first photo gate is activated. The first photo charges are drifted in the first direction. The second photo gate is over the photo detection region, is spaced apart from the first photo gate, and is activated in response to the first photo control signal. The second floating diffusion region accumulates second photo charges of the collected photo charges if the second photo gate is activated. The second photo charges are drifted in the second direction.

The first photo gate and the first floating diffusion region may be shared by the first depth pixel and a second depth pixel of the plurality of depth pixels. The second depth pixel may be adjacent to the first depth pixel.

According to at least one example embodiment, a three-dimensional (3D) image sensor includes a light source module and a pixel array. The light source module emits a transmission light. An object is illuminated with the transmission light. The pixel array includes a plurality of depth pixels and generates depth information from the 3D image sensor to the object based on a reception light reflected by the object. A first depth pixel of the plurality of depth pixels includes a photo detection region, a first photo gate and a first floating diffusion region. The photo detection region collects photo charges based on the reception light and directs the collected photo charges in a first direction based on an internal electric field in the photo detection region. The first photo gate is over the photo detection region and is activated in response to a first photo control signal. The first floating diffusion region accumulates first photo charges of the collected photo charges if the first photo gate is activated. The first photo charges are drifted in the first direction. The photo detection region has a conductive type different from that of a semiconductor substrate, and doping density in the photo detection region gradually decreases as a first distance from the first photo gate increases.

At least one example embodiment discloses an image sensor including a photo detection region configured to obtain charges based on light received, the photo detection region having a central area and an edge area, a doping density in the edge area being greater than a doping density in the central area.

In an example embodiment, the doping density increases from the central area to the edge area.

In an example embodiment, the image sensor further includes a first floating diffusion region and a first photo gate between the photo detection region and the first floating diffusion region, first floating diffusion region configured to accumulate the charges based on an operational state of the first photo gate.

In an example embodiment, the first photo gate is smaller than the photo detection region.

In an example embodiment, the image sensor further includes a second floating diffusion region and a second photo gate between the photo detection region and the second floating diffusion region, the second floating diffusion region and the second photo gate being on a different side of the photo detection region than the first floating diffusion region and the second floating diffusion region.

In an example embodiment, the second photo gate is smaller than the photo detection region.

In an example embodiment, the image sensor further includes a first gate between the first photo gate and the second photo gate.

In an example embodiment, the image sensor further includes a first gate over the photo detection region.

Accordingly, the depth pixel included in the three-dimensional image sensor may include the photo detection region and at least one photo gate, and the internal electric field may be formed in the photo detection region. The photo charges that are collected based on the reception light may be bidirectionally or unidirectionally drifted based on the internal electric field, and thus the depth pixel may effectively store and transfer the collected photo charges even if the size of the at least one photo gate decreases. Accordingly, the depth pixel may have relatively low power consumption, a demodulation contrast of the depth pixel may be maintained even if the depth has relatively high modulation frequency, dark currents and noises in the depth pixel may be reduced, and the depth pixel and the 3D image sensor including the depth pixel may have relatively improved performance.

BRIEF DESCRIPTION OF THE DRAWINGS

Illustrative, non-limiting example embodiments will be more clearly understood from the following detailed description taken in conjunction with the accompanying drawings.

FIGS. 13A and 13B are diagrams for describing a structure of the depth pixel of FIG. 12.

FIGS. 18A and 18B are diagrams for describing a structure of the depth pixel of FIG. 17.

FIG. 19 is a timing diagram for describing an operation of the depth pixel of FIG. 17.

FIG. 38 is a block diagram illustrating an example of an interface employable in the computing system of FIG. 37.

DETAILED DESCRIPTION OF EXAMPLE EMBODIMENTS

Figure 1:
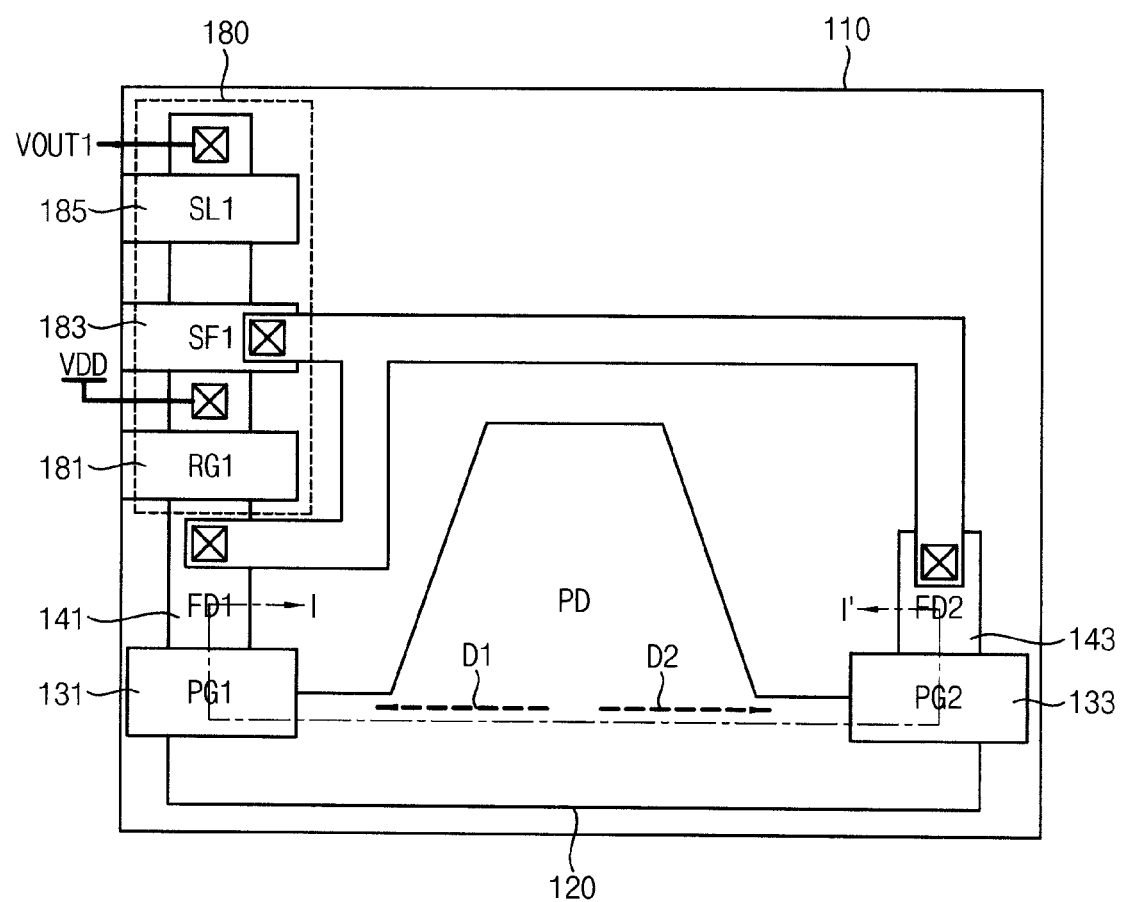
FIG. 1 is a plan view illustrating a depth pixel included in a three-dimensional (3D) image sensor according to an example embodiment.

Various example embodiments will be described more fully with reference to the accompanying drawings, in which embodiments are shown. Inventive concepts may, however, be embodied in many different forms and should not be construed as limited to example embodiments set forth herein. Rather, example embodiments are provided so that this disclosure will be thorough and complete, and will fully convey the scope of inventive concepts to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
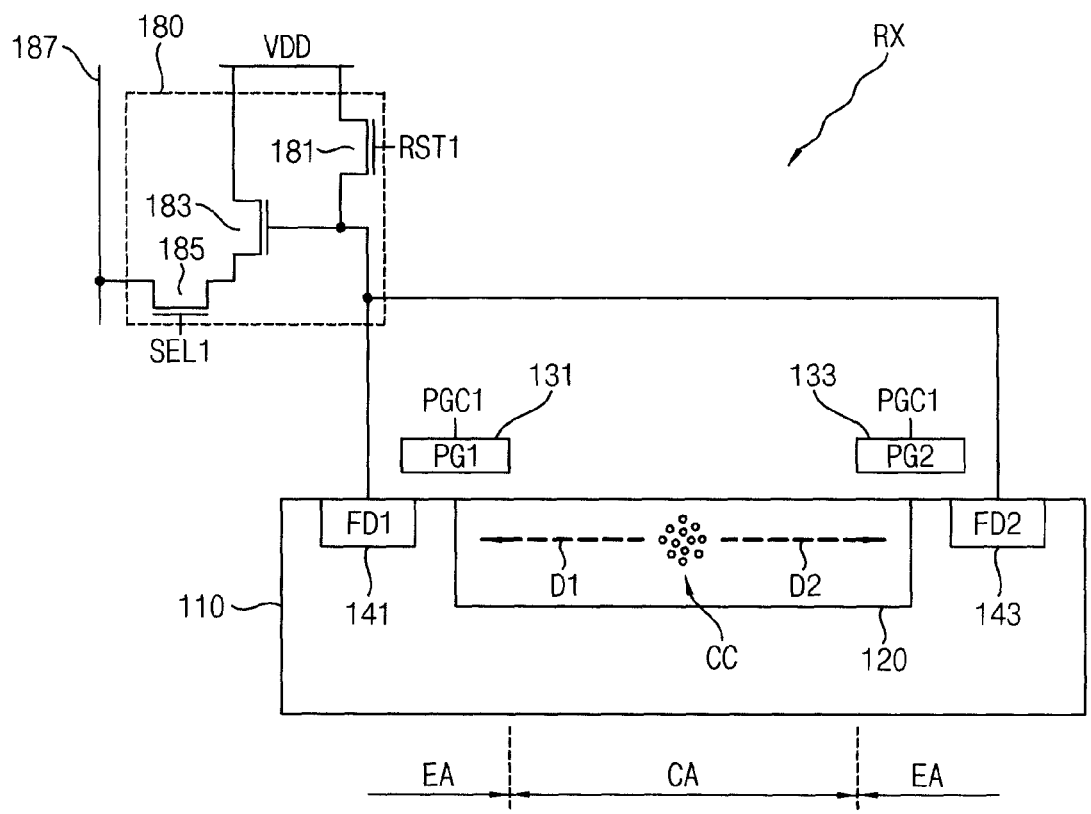
FIGS. 2 and 3 are diagrams for describing a structure of the depth pixel of FIG. 1.
Figure 3:
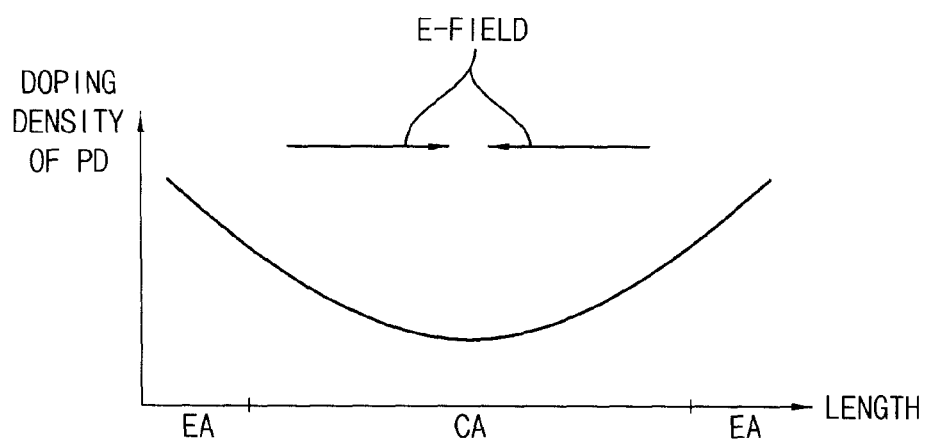

FIG. 1 is a plan view illustrating a depth pixel included in a three-dimensional (3D) image sensor according to at least one example embodiment. FIGS. 2 and 3 are diagrams for describing a structure of the depth pixel of FIG. 1. FIG. 2 is a cross-sectional view of the depth pixel taken along a line I-I' of FIG. 1. FIG. 3 illustrates a doping density profile in a photo detection region included in the depth pixel of FIG. 1.

Referring to FIGS. 1, 2 and 3, a depth pixel 100a included in a 3D image sensor includes a photo detection region 120, a first photo gate 131, a first floating diffusion region 141, a second photo gate 133 and a second floating diffusion region 143. The depth pixel 100a may further include a first output unit 180.

The depth pixel 100a may be formed through the complementary metal-oxide-silicon (CMOS) processes based on a semiconductor substrate 110. For example, the photo detection region 120 and the floating diffusion regions 141 and 143 may be formed using, e.g., an ion implantation process, or the like. The photo gates 131 and 133 may be formed over the semiconductor substrate 110 using a deposition process, an etch process, etc. Although not illustrated in FIGS. 1 and 2, an insulation layer, such as an oxide layer, may be formed between the upper surface of the semiconductor substrate 110 and the gates 131 and 133.

The photo detection region 120 is formed in the semiconductor substrate 110. The photo detection region 120 collects photo charges CC based on a reception light RX reflected by an object. An internal electric field is formed in the photo detection region 120 such that the collected photo charges CC are drifted in a first direction D1 and a second direction D2 different from the first direction D1 (e.g., bidirectionally) based on the internal electric field.

The first photo gate 131 is formed over the semiconductor substrate 110, e.g., over the photo detection region 120. The second photo gate 133 is formed over the semiconductor substrate 110, e.g., over the photo detection region 120, and is spaced apart from the first photo gate 131. The first and second photo gates 131 and 133 are turned on in response to a first photo control signal PGC1.

The gates 131 and 133 may include polysilicon or transparent conducting oxide (TCO). For example, the gates 131 and 133 may include indium tin oxide (ITO), indium zinc oxide (IZO), zinc oxide (ZnO), titanium dioxide ($TiO_2$), etc.

More particularly, e.g., in one or more embodiments in which the reception light RX incident on the depth pixel 100a passes through the upper surface of the semiconductor substrate 110 as illustrated in FIG. 2, the photo gates 131 and 133 may include TCO. In one or more embodiments in which the reception light incident on the depth pixel 100a passes through the bottom surface of the semiconductor substrate 110, the photo gates 131 and 133 may include non-transparent conducting oxide.

The first floating diffusion region 141 is formed in the semiconductor substrate 110. The first floating diffusion region 141 accumulates first photo charges of the collected photo charges CC when the first photo gate 131 is turned on. The first photo charges are drifted in the first direction D1. In other words, the photo detection region 120 and the first floating diffusion region 141 may be electrically connected to each other in response to the first photo control signal PGC1 applied to the first photo gate 131. Such electrical connection may be a channel that is formed near the upper surface portion of the semiconductor substrate 110 between the two regions. Similarly, the second floating diffusion region 143 is formed in the semiconductor substrate 110. The second floating diffusion region 143 accumulates second photo charges of the collected photo charges CC when the second photo gate 133 is turned on. The second photo charges are drifted in the second direction D2.

The first and the second photo gates 131 and 133 may be formed over an edge area EA of the photo detection region 120. The photo detection region 120 and the floating diffusion regions 141 and 143 may be formed in the semiconductor substrate 110 by doping impurities having a conductive type different from that of the semiconductor substrate 110. Doping density in the photo detection region 120 may gradually decrease as a first distance from the first photo gate 131 or a second distance from the second photo gate 133 increases.

In an example embodiment, the photo detection region 120 and the floating diffusion regions 141 and 143 may be doped with impurities of the n-type when the semiconductor substrate 110 is the p-type. In this case, the photo detection region 120 may collect electrons of electron-hole pairs (e.g., the first and second photo charges may be the electrons). In addition, as illustrated in FIG. 3, doping density of the edge area EA of the photo detection region 120 may be higher than doping density of a central area CA of the photo detection region 120 (e.g., the edge area EA may be (n+)-type region and the central area CA may be n-type or (n−)-type region), and thus the internal electric field E-FIELD may be formed based on such doping density profile. As shown in FIG. 3, a doping density continuously increases from the central area CA to the edge area EA. The first and second photo charges (e.g., the electrons) may be drifted in the first and second directions D1 and D2 based on the internal electric field E-FIELD, respectively. The first direction D1 may be from the central area CA of the photo detection region 120 to the first photo gate 131, and the second direction D2 may be from the central area CA of the photo detection region 120 to the second photo gate 133.

In another example embodiment, the photo detection region 120 and the floating diffusion regions 141 and 143 may be doped with impurities of the p-type when the semiconductor substrate 110 is the n-type. In this case, the photo detection region 120 may collect holes of the electron-hole pairs (e.g., the first and second photo charges may be the holes). Doping density of the edge area EA of the photo detection region 120 may be higher than doping density of a central area CA of the photo detection region 120 (e.g., the edge area EA may be (p+)-type region and the central area CA may be p-type or (p−)-type region), and thus the internal electric field, which has opposite directions with respect to the E-FIELD in FIG. 3, may be formed based on such doping density profile. The first and second photo charges (e.g., the holes) may be drifted in the first and second directions D1 and D2 based on the internal electric field, respectively.

In an example embodiment, a size of the first photo gate 131 and a size of the second photo gate 133 may be smaller than a size of the photo detection region 120, respectively. Since the collected photo charges CC are drifted in the first and second directions D1 and D2 based on the internal electric field, the depth pixel 100a may store and transfer the collected photo charges CC even if the sizes of the photo gates 131 and 133 decrease. When the sizes of the photo gates 131 and 133 decrease, capacitances of the photo gates 131 and 133 may decrease and surface defects caused by manufacturing processes may be reduced. As the capacitances of the photo gates 131 and 133 decrease, the depth pixel 100a may have relatively low power consumption, and a demodulation contrast of the depth pixel 100a may be maintained even if the depth pixel 100a has relatively high modulation frequency. As the surface defects are reduced, dark currents caused by the surface defects and noises caused by the dark currents may be reduced. Therefore, the depth pixel 100a and the 3D image sensor including the depth pixel 100a may have relatively improved performance. Although not illustrated in FIGS. 1 and 2, the photo detection region 120 and the photo gates 131 and 133 may be implemented with one of various shapes, respectively.

The first output unit 180 may reset the first and second floating diffusion regions 141 and 143 in response to a first reset signal RST1 and may generate a first output voltage VOUT1 corresponding to a sum of the first photo charges accumulated in the first floating diffusion region 141 and the second photo charges accumulated in the second floating diffusion region 143.

The first output unit 180 may include a first reset transistor 181, a first drive transistor 183 and a first select transistor 185. The first reset transistor 181 may reset the first and second floating diffusion regions 141 and 143 in response to the first reset signal RST1. The first drive transistor 183 may amplify a voltage of the first floating diffusion region 141 and a voltage of the second floating diffusion region 143. The first select transistor 185 may output the voltages amplified by the first drive transistor 183 as the first output voltage VOUT1 in response to a first select signal SEL1. The first output voltage VOUT1 may be provided to a first output line 187.

Figure 4:
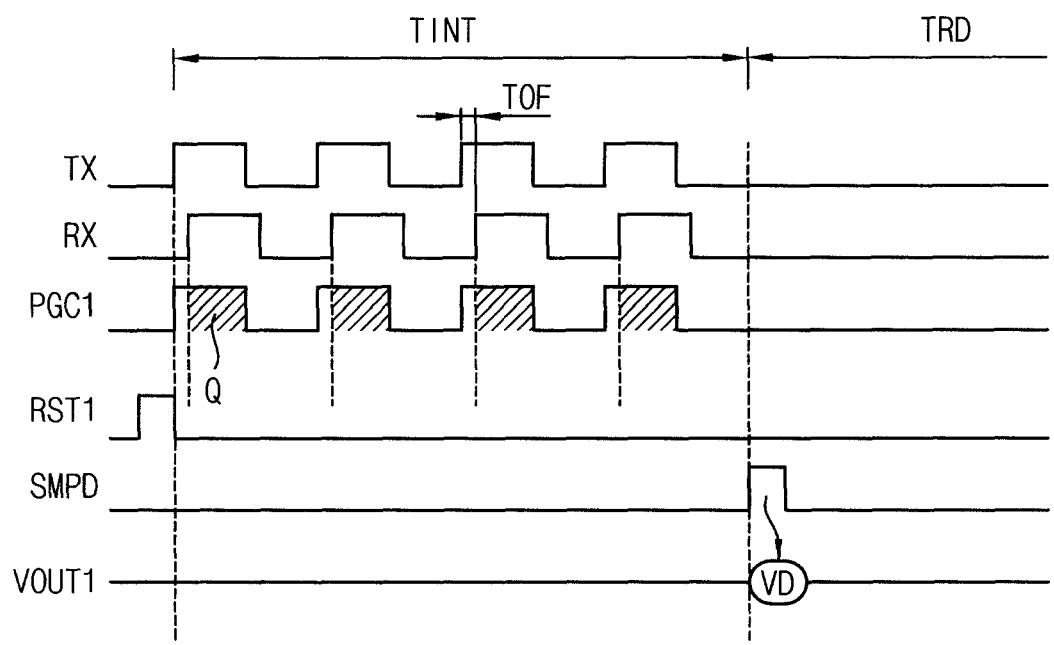
FIG. 4 is a timing diagram for describing an operation of the depth pixel of FIG. 1.

FIG. 4 is a timing diagram for describing an operation of the depth pixel of FIG. 1.

Referring to FIGS. 1, 2 and 4, the first reset signal RST1 is activated to reset the first and second floating diffusion regions 141 and 143 before an integration time interval TINT.

Figure 31:
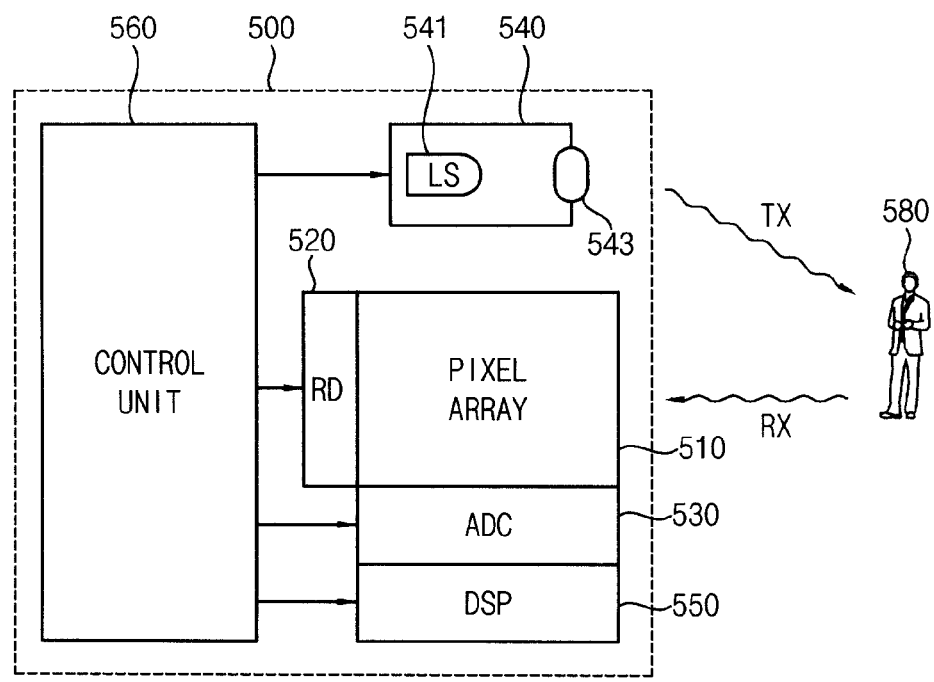
FIG. 31 is a block diagram illustrating a 3D image sensor according to an example embodiment.
Figure 34:
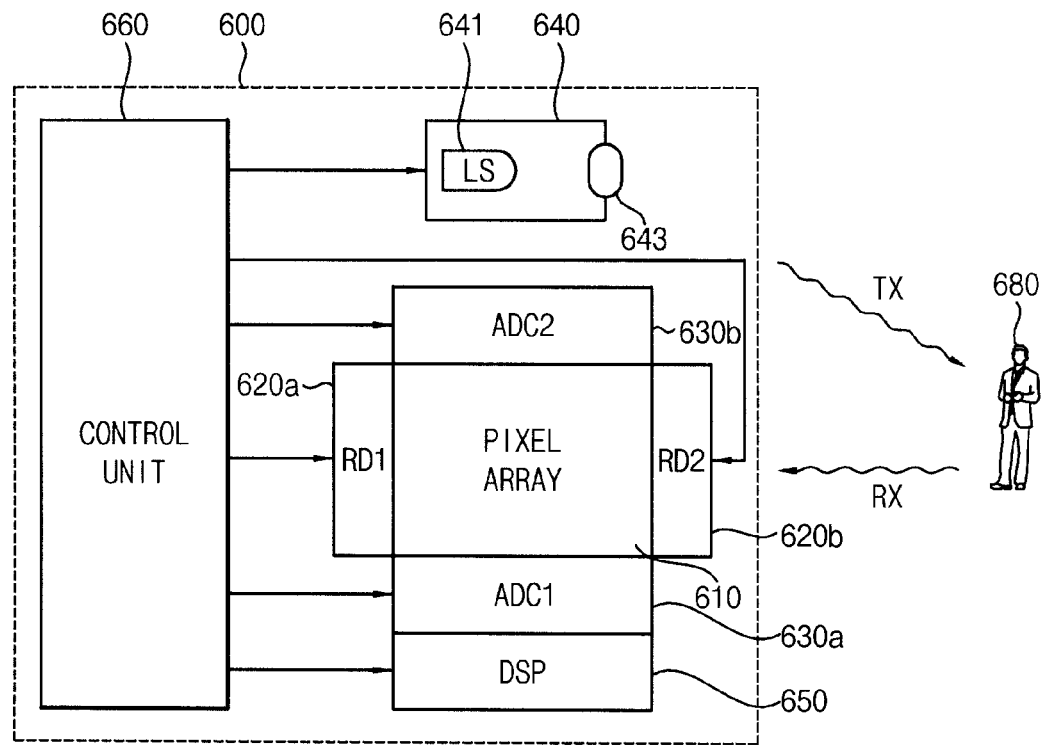
FIG. 34 is a block diagram illustrating a 3D image sensor according to an example embodiment.

An object is illuminated with a transmission light TX during an integration time interval TINT, as illustrated in FIGS. 31 and 34. The 3D image sensor may include a light source or a light emitting device to generate the transmission light TX having periodically varying intensity. The transmission light TX is reflected by the object and returned to the depth pixel 100a as the reception light RX. The reception light RX is delayed by a time of flight (TOF) with respect to the transmission light TX.

During the integration time interval TINT, the photo charges CC are collected in the photo detection region 120 by the reception light RX. The photo charges CC are drifted in the first and second directions D1 and D2 based on the internal electric field. The first photo control signal PGC1 has periodically varying intensity and has a phase (e.g., the same phase) with respect to the transmission light TX. The first photo charges, that are drifted in the first direction D1, are accumulated in the first floating diffusion region 141 in response to the first photo control signal PGC1. The second photo charges, that are drifted in the second direction D2, are accumulated in the second floating diffusion region 143 in response to the first photo control signal PGC1. The sum of the first and second photo charges may be substantially the same as photo charges Q during an activation interval of the first photo control signal PGC1.

The TOF may be obtained by measuring the photo charges Q corresponding to the phase of the first photo control signal PGC1. When the distance from the 3D image sensor to the object is D and a light velocity is c, the distance may be calculated using the relation D=(TOF*c)/2. Even though FIG. 4 illustrates the one photo control signal PGC1, a plurality of photo control signals having different phases may be used to obtain more exact TOF.

During a readout time interval TRD, a sampling control signal SMPD is activated to sample the voltages of the first and second floating diffusion regions 141 and 143 as a demodulation voltage VD. The demodulation voltage VD may correspond to the sum of the first and second photo charges (e.g., the photo charges Q) and may correspond to an effective signal component (e.g., an effective voltage).

Although FIG. 4 illustrates that the first reset signal RST1 is deactivated during the integration time interval TINT, the first reset signal RST1 may be activated before the integration time interval TINT and may maintain the activation state during the whole integration time interval TINT, according to at least one example embodiment.

Figure 5:
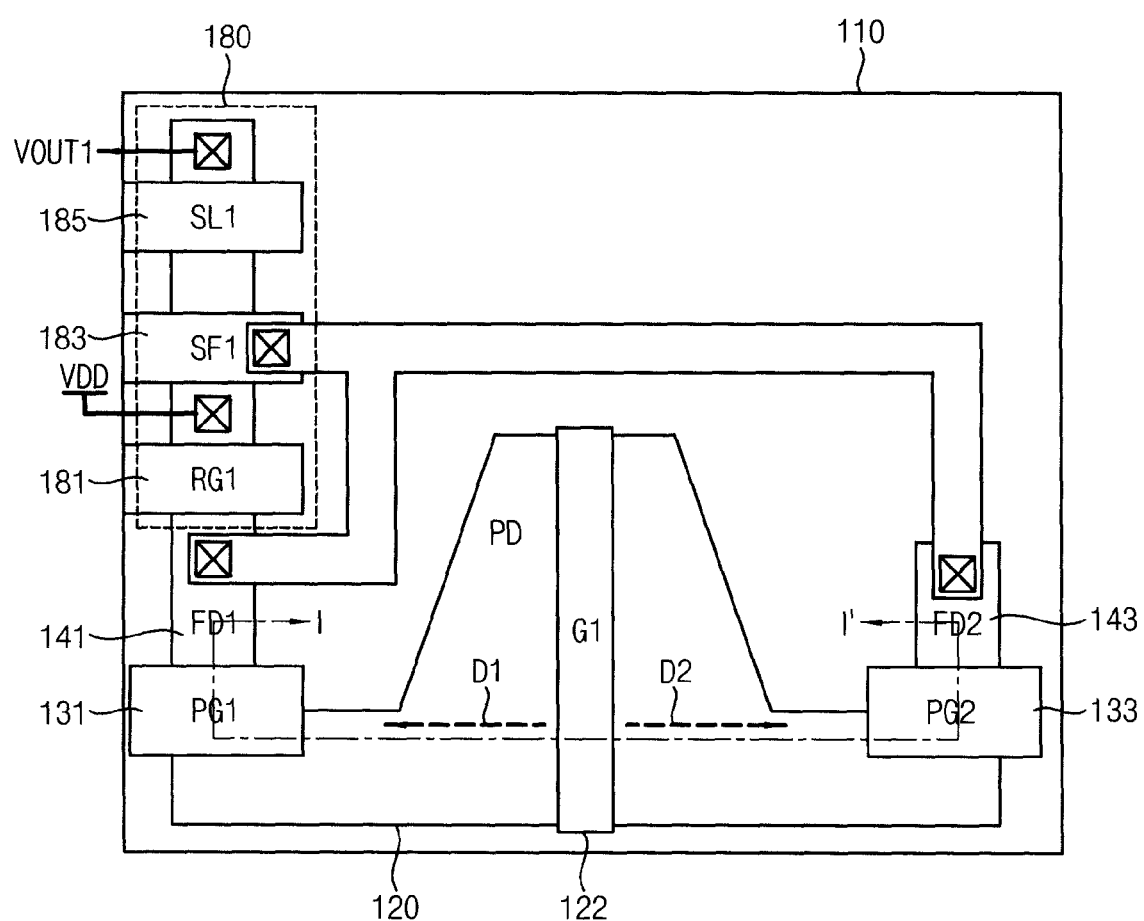
FIG. 5 is a plan view illustrating a depth pixel included in a 3D image sensor according to an example embodiment.
Figure 6:
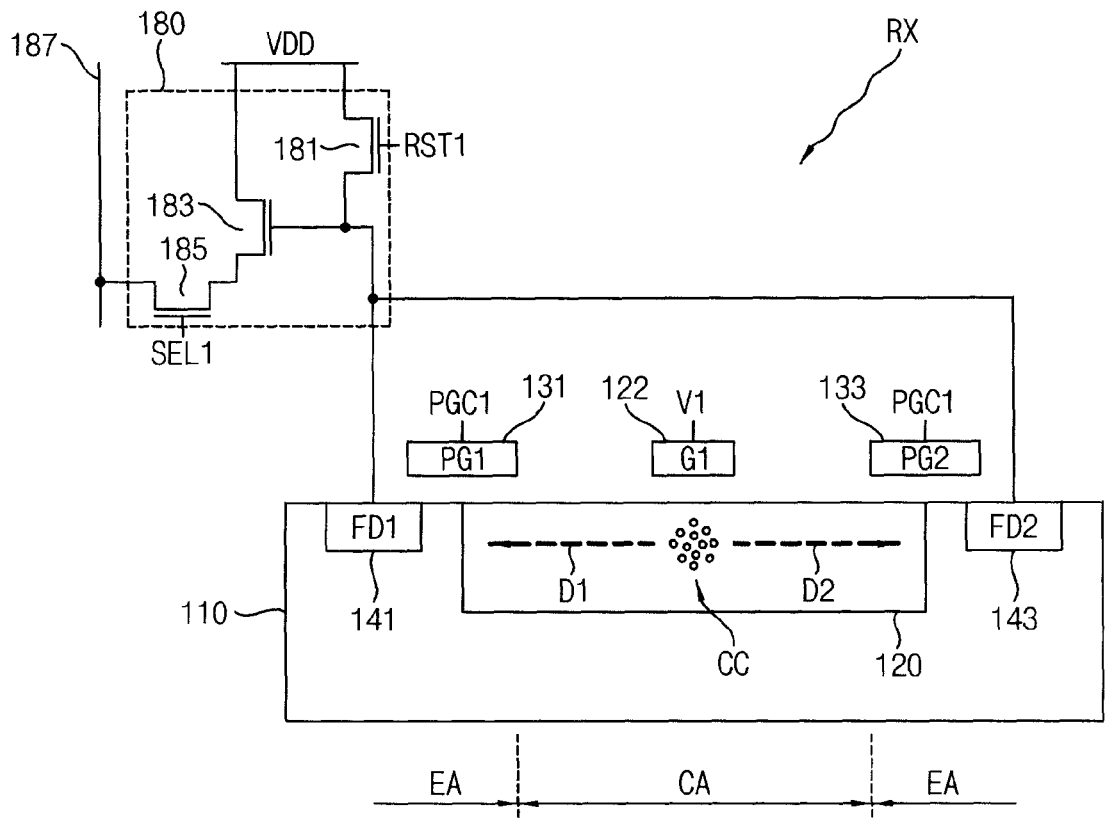
FIGS. 6 and 7 are diagrams for describing a structure of the depth pixel of FIG. 5.
Figure 7:
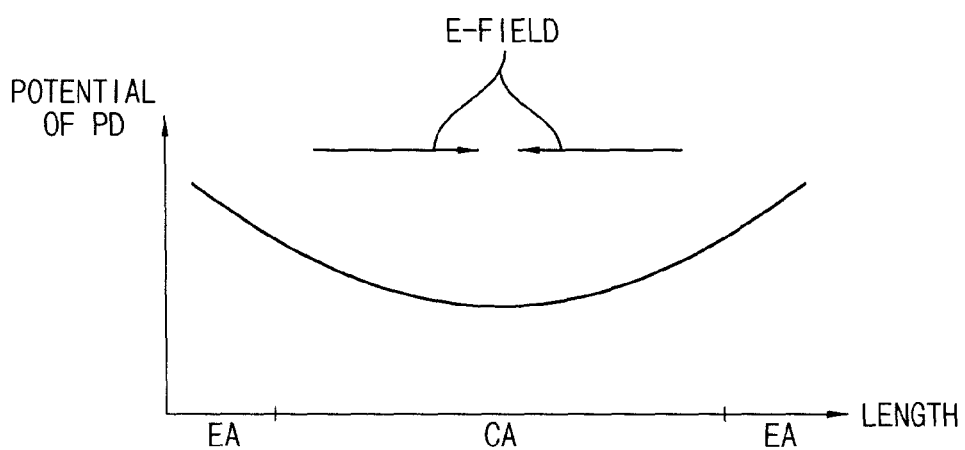

FIG. 5 is a plan view illustrating a depth pixel included in a 3D image sensor according to at least one example embodiment. FIGS. 6 and 7 are diagrams for describing a structure of the depth pixel of FIG. 5. FIG. 6 is a cross-sectional view of the depth pixel taken along a line I-I' of FIG. 5. FIG. 7 illustrates a potential level profile in a photo detection region included in the depth pixel of FIG. 5.

Referring to FIGS. 5, 6 and 7, a depth pixel 100b included in a 3D image sensor includes a photo detection region 120, a first photo gate 131, a first floating diffusion region 141, a second photo gate 133 and a second floating diffusion region 143. The depth pixel 100b may further include a first output unit 180 and a first gate 122.

In comparison with the depth pixel 100a of FIG. 1, the depth pixel 100b of FIG. 5 may further include the first gate 122. The photo gates 131 and 133, the floating diffusion regions 141 and 143 and the first output unit 180 included in the depth pixel 100b of FIG. 5 may be substantially the same as the photo gates 131 and 133, the floating diffusion regions 141 and 143 and the first output unit 180 included in the depth pixel 100a of FIG. 1, respectively. The depth pixel 100b of FIG. 5 may operate based on the timing diagram of FIG. 4.

The first gate 122 may be formed over the photo detection region 120 and may be between the first photo gate 131 and the second photo gate 133. For example, the first and second photo gates 131 and 133 may be formed over the edge area EA of the photo detection region 120, respectively, and the first gate 122 may be formed over the central area CA of the photo detection region 120. The first gate 122 may be formed using the processes (e.g., the deposition process, the etch process, etc) that is used for the photo gates 131 and 133.

The internal electric field may be induced in the photo detection region 120 based on a first voltage V1 applied to the first gate 122. The first voltage V1 may be a negative voltage or a positive voltage.

In an example embodiment, when the semiconductor substrate 110 is the p-type and the photo detection region 120 is doped with impurities of the n-type (e.g., when the photo detection region 120 collects the electrons of the electron-hole pairs), the first voltage V1 may be the negative voltage. In this case, as illustrated in FIG. 7, a potential level in the photo detection region 120 may gradually decrease as the first distance from the first photo gate 131 or the second distance from the second photo gate 133 increases. In other words, a potential level of the edge area EA of the photo detection region 120 may be higher than a potential level of the central area CA of the photo detection region 120, and thus the internal electric field E-FIELD may be formed based on such potential level profile. The first and second photo charges (e.g., the electrons) may be drifted in the first and second directions D1 and D2 based on the internal electric field E-FIELD, respectively. The first direction D1 may be from the first gate 122 to the first photo gate 131, and the second direction D2 may be from the first gate 122 to the second photo gate 133.

In another example embodiment, when the semiconductor substrate 110 is the n-type and the photo detection region 120 is doped with impurities of the p-type (e.g., when the photo detection region 120 collects the holes of the electron-hole pairs), the first voltage V1 may be the positive voltage. In this case, the potential level in the photo detection region 120 may gradually increase as the first distance from the first photo gate 131 or the second distance from the second photo gate 133 increases. In other words, the potential level of the edge area EA of the photo detection region 120 may be lower than the potential level of the central area CA of the photo detection region 120, and thus the internal electric field, which has opposite directions with respect to the E-FIELD in FIG. 7, may be formed based on such potential level profile. The first and second photo charges (e.g., the holes) may be drifted in the first and second directions D1 and D2 based on the internal electric field, respectively.

According to at least one example embodiment, the photo detection region 120 may have a uniform doping density, or the doping density in the photo detection region 120 may gradually decrease as the first distance from the first photo gate 131 or the second distance from the second photo gate 133 increases. In other words, the embodiment as described above with reference to FIGS. 1, 2 and 3 (e.g. adjusting the doping density) may be combined with the embodiment as described above with reference to FIGS. 5, 6 and 7 (e.g., additionally forming the first gate 122).

Figure 8:
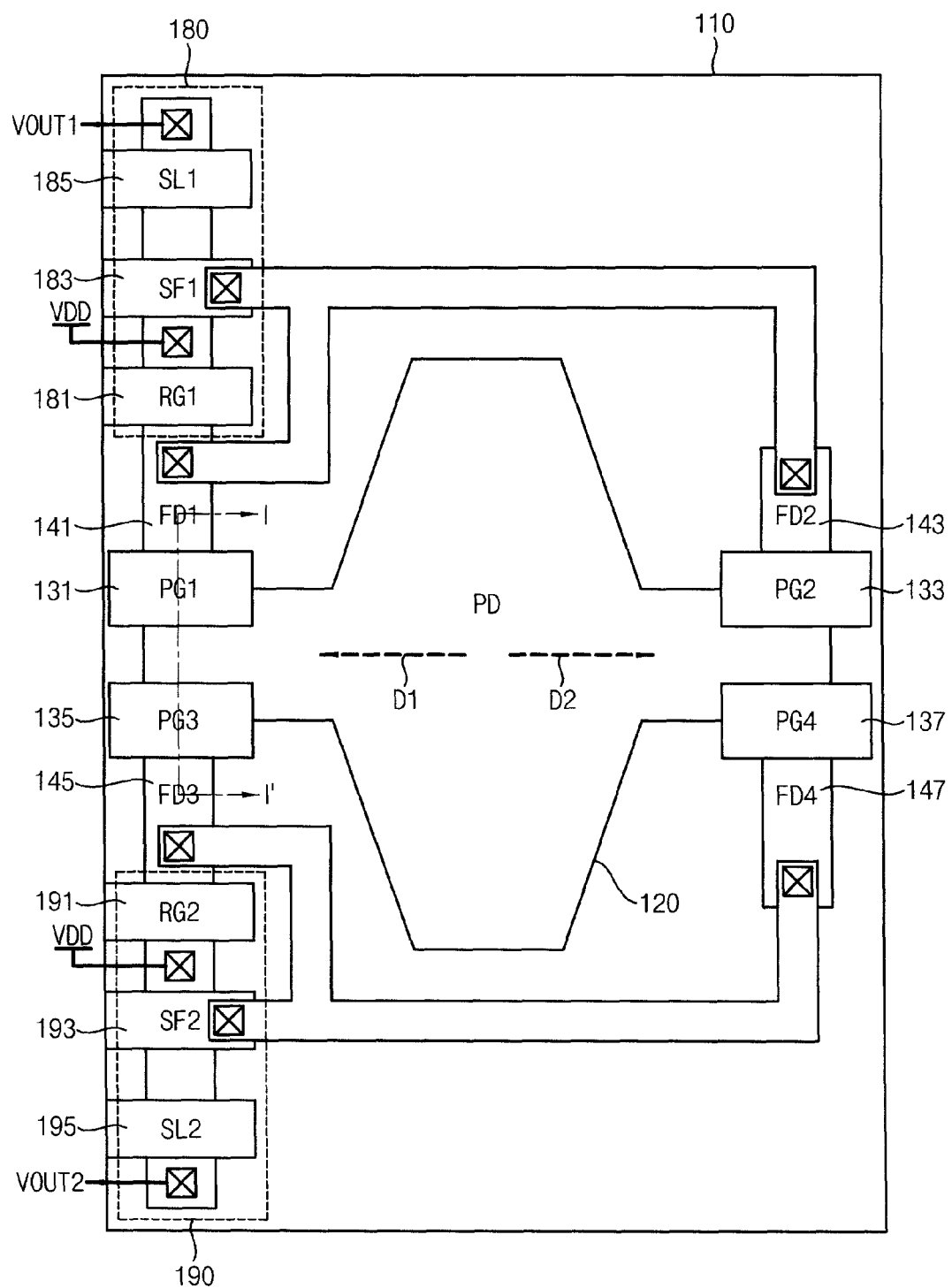
FIG. 8 is a plan view illustrating a depth pixel included in a 3D image sensor according to an example embodiment.
Figure 9:
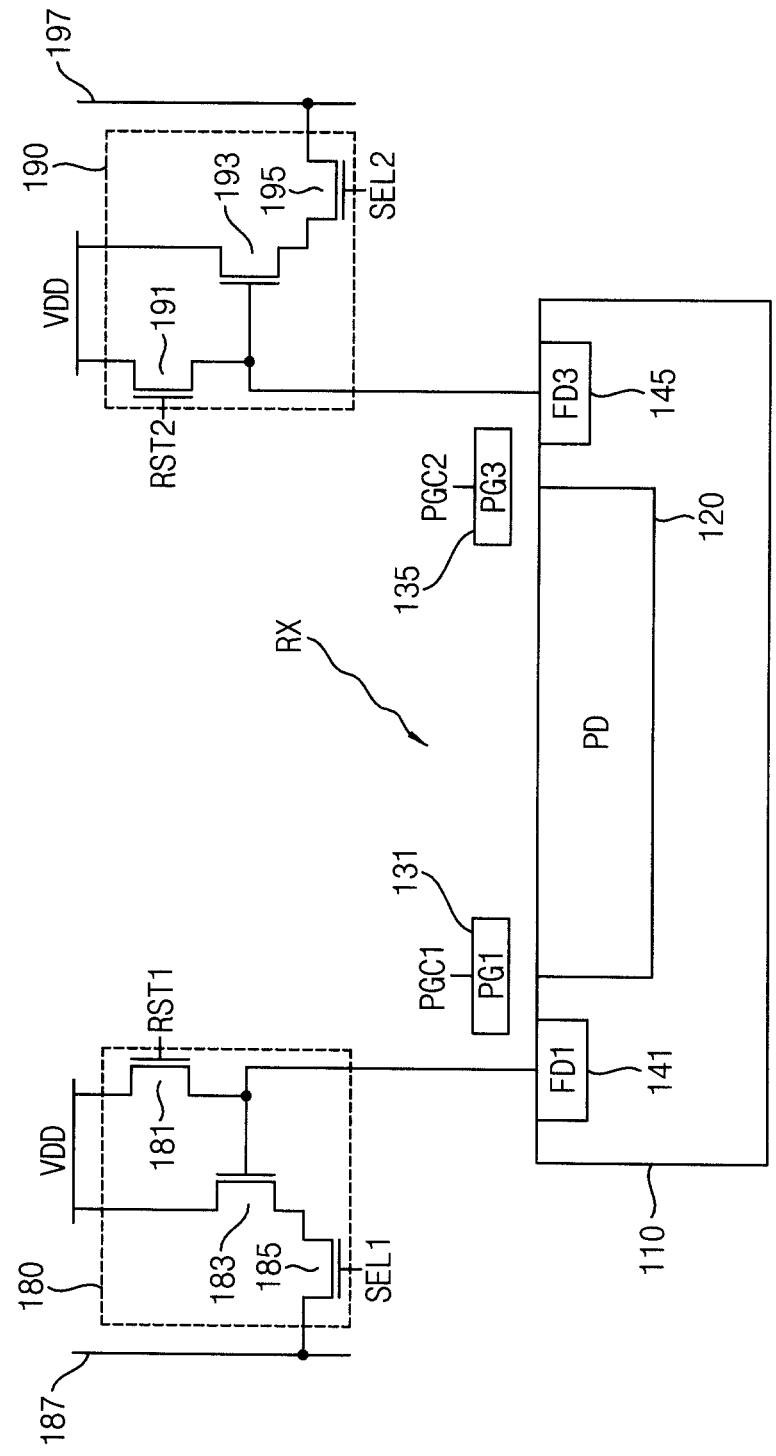
FIG. 9 is a diagram for describing a structure of the depth pixel of FIG. 8.

FIG. 8 is a plan view illustrating a depth pixel included in a 3D image sensor according to at least one example embodiment. FIG. 9 is a diagram for describing a structure of the depth pixel of FIG. 8. FIG. 9 is a cross-sectional view of the depth pixel taken along a line I-I' of FIG. 8.

Referring to FIGS. 8 and 9, a depth pixel 100c included in a 3D image sensor includes a photo detection region 120, a first photo gate 131, a first floating diffusion region 141, a second photo gate 133 and a second floating diffusion region 143. The depth pixel 100c may further include a third photo gate 135, a third floating diffusion region 145, a fourth photo gate 137, a fourth floating diffusion region 147, a first output unit 180 and a second output unit 190.

In comparison with the depth pixel 100a of FIG. 1, the depth pixel 100c of FIG. 8 may further include the third and fourth photo gates 135 and 137, the third and fourth floating diffusion regions 145 and 147 and the second output unit 190. The third and fourth photo gates 135 and 137, the third and fourth floating diffusion regions 145 and 147 and the second output unit 190 may be symmetrically formed to the first and second photo gates 131 and 133, the first and second floating diffusion regions 141 and 143 and the first output unit 180, respectively.

The third photo gate 135 may be formed over the semiconductor substrate 110, e.g., over the photo detection region 120, and may be spaced apart from the first photo gate 131. The fourth photo gate 137 may be formed over the semiconductor substrate 110, e.g., over the photo detection region 120, and may be spaced apart from the second and third photo gates 133 and 135. The third and fourth photo gates 135 and 137 may be turned on in response to a second photo control signal PGG2.

The third floating diffusion region 145 may be formed in the semiconductor substrate 110. The third floating diffusion region 145 may accumulate third photo charges of the collected photo charges CC when the third photo gate 135 is turned on. The third photo charges may be drifted in the first direction D1. The fourth floating diffusion region 147 may be formed in the semiconductor substrate 110. The fourth floating diffusion region 147 may accumulate fourth photo charges of the collected photo charges CC when the fourth photo gate 137 is turned on. The fourth photo charges may be drifted in the second direction D2.

The second output unit 190 may reset the third and fourth floating diffusion regions 145 and 147 in response to a second reset signal RST2 and may generate a second output voltage VOUT2 corresponding to a sum of the third photo charges accumulated in the third floating diffusion region 145 and the fourth photo charges accumulated in the fourth floating diffusion region 147.

The second output unit 190 may include a second reset transistor 191, a second drive transistor 193 and a second select transistor 195. The second reset transistor 191 may reset the third and fourth floating diffusion regions 145 and 147 in response to the second reset signal RST2. The second drive transistor 193 may amplify a voltage of the third floating diffusion region 145 and a voltage of the fourth floating diffusion region 147. The second select transistor 195 may output the voltages amplified by the second drive transistor 193 as the second output voltage VOUT2 in response to a second select signal SEL2. The second output voltage VOUT2 may be provided to a second output line 197.

In an example embodiment, the doping density in the photo detection region 120 may gradually decrease as the first distance from the first photo gate 131, the second distance from the second photo gate 133, a third distance from the third photo gate 135 or a fourth distance from the fourth photo gate 137 increases. The internal electric field may be induced based on such doping density profile.

Although not illustrated in FIGS. 8 and 9, the depth pixel 100c may further include a channel stop region that is formed in the semiconductor substrate 110 between the first and third photo detection regions 131 and 135 to prevent charge transfer between the two photo detection regions 131 and 135. The channel stop region may be highly doped with the impurities having the conductive type substantially the same as that of the semiconductor substrate 110. In addition, another channel stop region may be formed in the semiconductor substrate 110 between the second and fourth photo detection regions 133 and 137.

The depth pixel 100c of FIG. 8 may be separated as two half pixels. For example, a first half pixel may include the photo detection region 120, the first and second photo gates 131 and 133, the first and second floating diffusion regions 141 and 143, and the first output unit 180. A second half pixel may include the photo detection region 120, the third and fourth photo gates 135 and 137, the third and fourth floating diffusion regions 145 and 147, and the second output unit 190.

Figure 10:
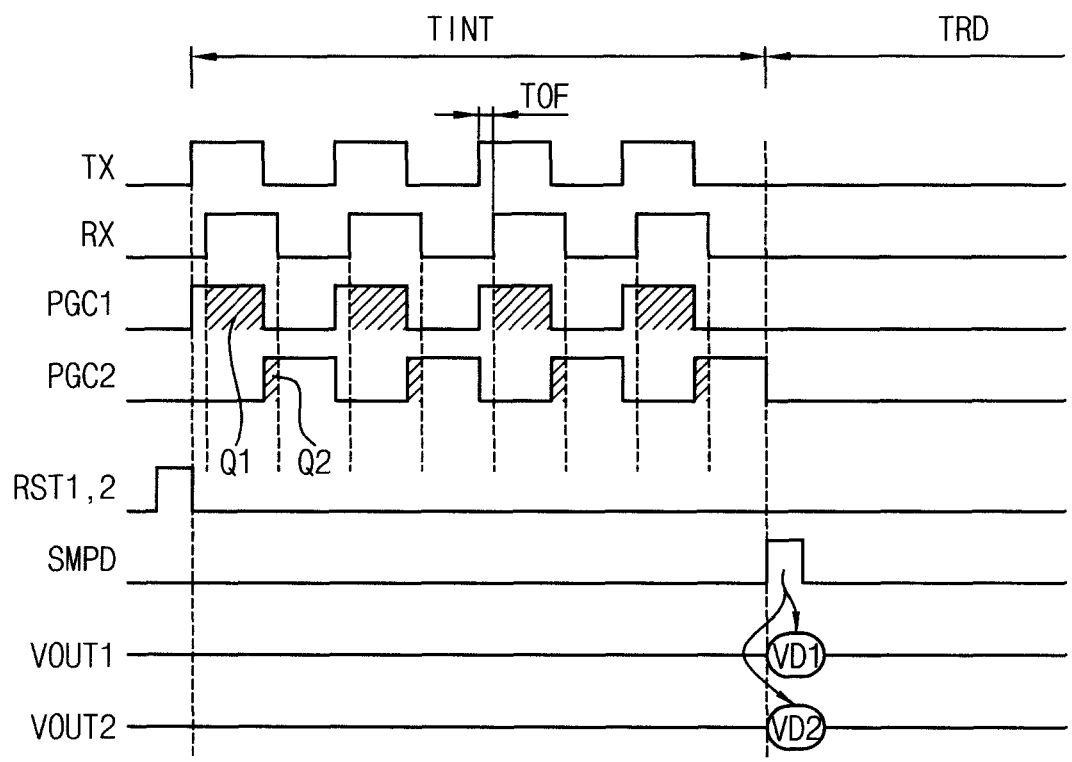
FIG. 10 is a timing diagram for describing an operation of the depth pixel of FIG. 8.

FIG. 10 is a timing diagram for describing an operation of the depth pixel of FIG. 8.

Referring to FIGS. 8, 9 and 10, the first and second reset signals RST1 and RST2 are activated to reset the first through fourth floating diffusion regions 141, 143, 145 and 147 before the integration time interval TINT.

The object is illuminated with the transmission light TX during the integration time interval TINT. The transmission light TX is reflected by the object and returned to the depth pixel 100c as the reception light RX. The reception light RX is delayed by the TOF with respect to the transmission light TX.

The first and second photo control signals PGC1 and PGC2, which are activated to have periodically varying intensity during the integration time interval TINT, have respective phase differences with respect to the transmission light TX. For example, the first photo control signal PGC1 may have a phase equal to the phase of the transmission light TX, and the second photo control signal PGC2 may have a phase opposite (e.g., a phase difference of 180 degrees) to the phase of the transmission light TX, as illustrated in FIG. 10. In other words, the first and second photo control signals PGC1 and PGC2 may be toggled between a first logic level (e.g., a logic low level) and a second logic level (e.g., a logic high level) during the integration time interval TINT and may have the first logic level during the readout time interval TRD.

Photo charges Q1 corresponding to an activation interval of the first photo control signal PGC1 are collected in the photo detection region 120 by the reception light RX. The photo charges Q1 are drifted in the first and second directions D1 and D2 based on the internal electric field. The first photo charges, that are drifted in the first direction D1, of the photo charges Q1 are accumulated in the first floating diffusion region 141 in response to the first photo control signal PGC1. The second photo charges, that are drifted in the second direction D2, of the photo charges Q1 are accumulated in the second floating diffusion region 143 in response to the first photo control signal PGC1. In addition, photo charges Q2 corresponding to an activation interval of the second photo control signal PGC2 are collected in the photo detection region 120 by the reception light RX. The photo charges Q2 are drifted in the first and second directions D1 and D2 based on the internal electric field. The third photo charges, that are drifted in the first direction D1, of the photo charges Q2 are accumulated in the third floating diffusion region 145 in response to the second photo control signal PGC2. The fourth photo charges, that are drifted in the second direction D2, of the photo charges Q2 are accumulated in the fourth floating diffusion region 147 in response to the second photo control signal PGC2.

During the readout time interval TRD, the sampling control signal SMPD is activated to sample the voltages of the first and second floating diffusion regions 141 and 143, that correspond to a sum of the first and second photo charges (e.g., the photo charges Q1), as a first demodulation voltage VD1 and to sample the voltages of the third and fourth floating diffusion regions 145 and 147, that correspond to a sum of the third and fourth photo charges (e.g., the photo charges Q2), as a second demodulation voltage VD2.

Figure 11:
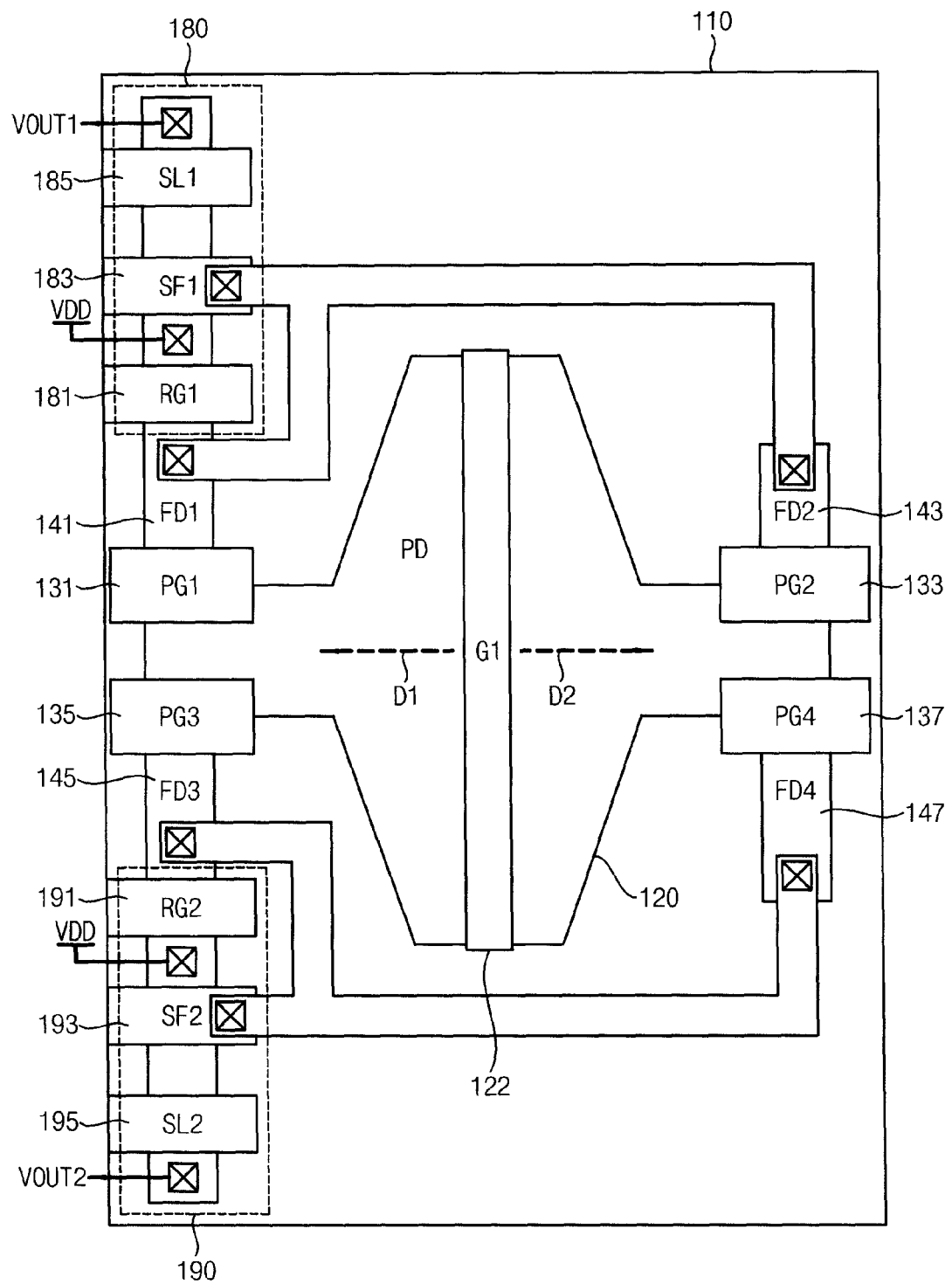
FIG. 11 is a plan view illustrating a depth pixel included in a 3D image sensor according to an example embodiment.

FIG. 11 is a plan view illustrating a depth pixel included in a 3D image sensor according to at least one example embodiment.

Referring to FIG. 11, a depth pixel 100d included in a 3D image sensor includes a photo detection region 120, a first photo gate 131, a first floating diffusion region 141, a second photo gate 133 and a second floating diffusion region 143. The depth pixel 100d may further include a first gate 122, a third photo gate 135, a third floating diffusion region 145, a fourth photo gate 137, a fourth floating diffusion region 147, a first output unit 180 and a second output unit 190.

In comparison with the depth pixel 100c of FIG. 8, the depth pixel 100d of FIG. 11 may further include the first gate 122. The internal electric field may be induced in the photo detection region 120 based on the first voltage V1 applied to the first gate 122. The first voltage V1 may be the negative voltage or the positive voltage depending on a type of photo charges that are collected in the photo detection region 120. The first gate 122 included in the depth pixel 100d of FIG. 11 may be substantially the same as the first gate 122 included in the depth pixel 100b of FIGS. 5 and 6. The depth pixel 100d of FIG. 11 may operate based on the timing diagram of FIG. 10.

According to at least one example embodiment, the photo detection region 120 may have the uniform doping density, or the doping density in the photo detection region 120 may gradually decrease as the first distance from the first photo gate 131, the second distance from the second photo gate 133, a third distance from the third photo gate 135 or a fourth distance from the fourth photo gate 137 increases.

Figure 12:
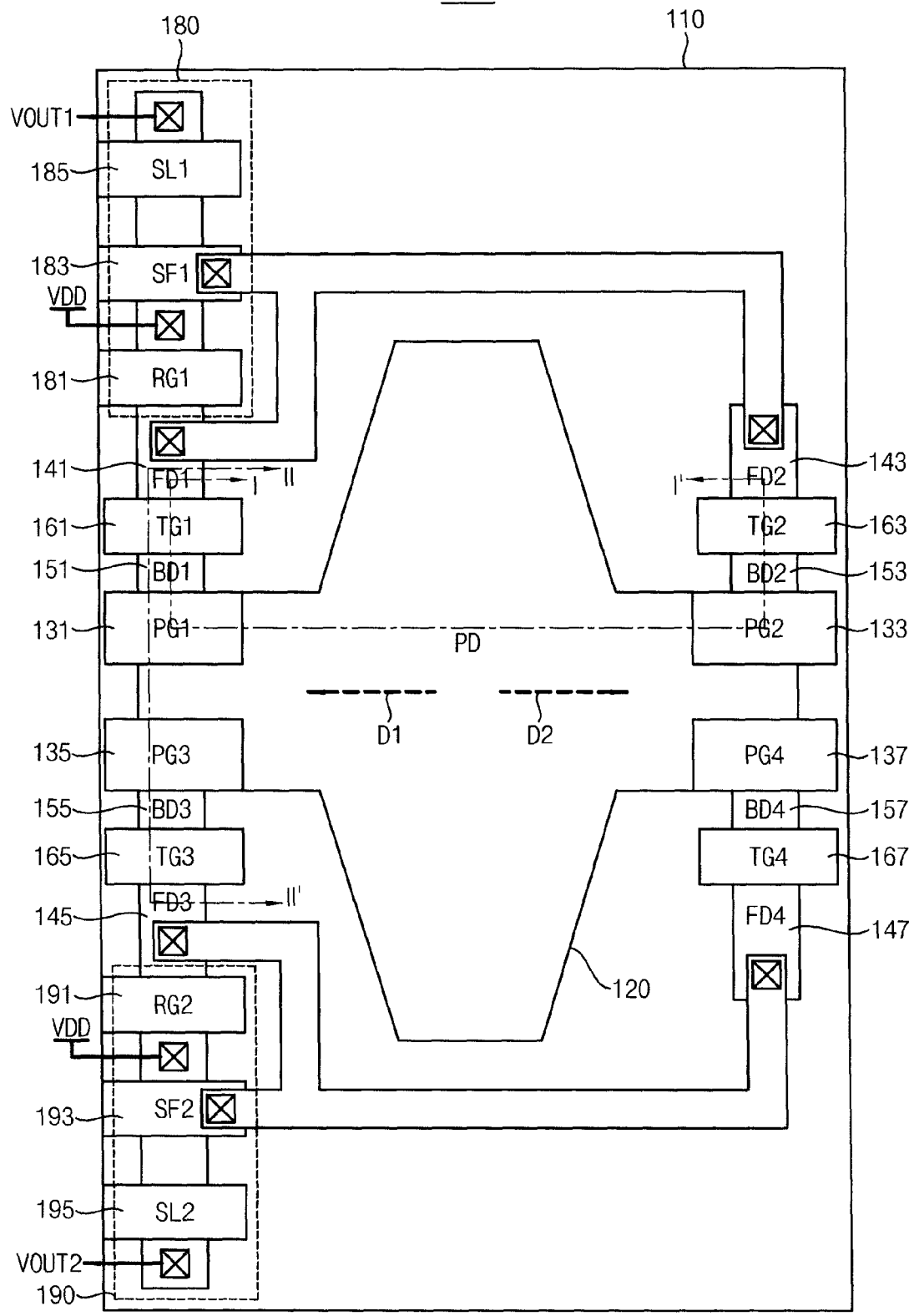
FIG. 12 is a plan view illustrating a depth pixel included in a 3D image sensor according to an example embodiment.
Figure 13B:
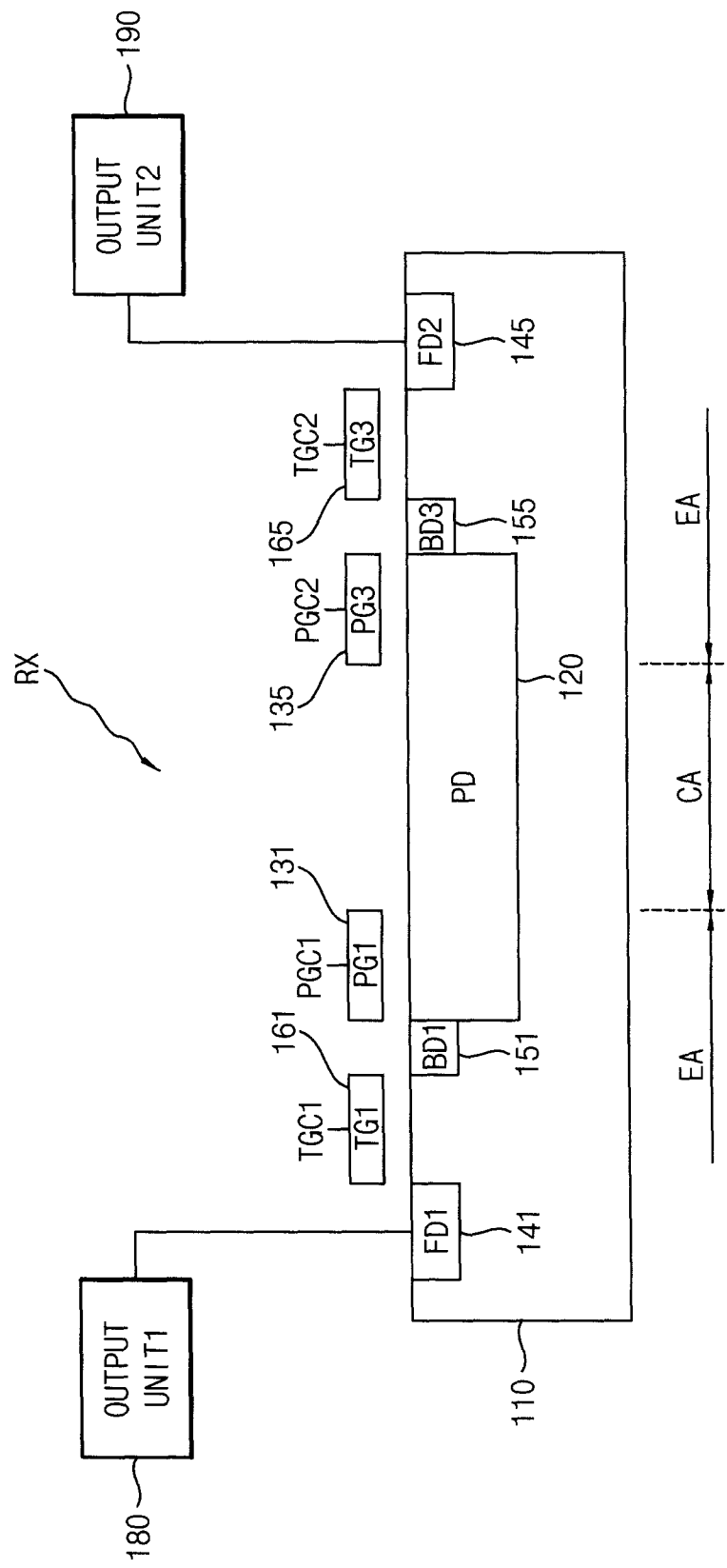

FIG. 12 is a plan view illustrating a depth pixel included in a 3D image sensor according to at least one example embodiment. FIGS. 13A and 13B are diagrams for describing a structure of the depth pixel of FIG. 12. FIG. 13A is a cross-sectional view of the depth pixel taken along a line I-I' of FIG. 12. FIG. 13B is a cross-sectional view of the depth pixel taken along a line II-II' of FIG. 12.

Referring to FIGS. 12, 13A and 13B, a depth pixel 100e included in a 3D image sensor includes a photo detection region 120, a first photo gate 131, a first floating diffusion region 141, a second photo gate 133 and a second floating diffusion region 143. The depth pixel 100e may further include a first bridge diffusion region 151, a first transfer gate 161, a second bridge diffusion region 153, a second transfer gate 163 and a first output unit 180. In addition, the depth pixel 100e may further include a third photo gate 135, a third bridge diffusion region 155, a third transfer gate 165, a third floating diffusion region 145, a fourth photo gate 137, a fourth bridge diffusion region 157, a fourth transfer gate 167, a fourth floating diffusion region 147 and a second output unit 190.

In comparison with the depth pixel 100c of FIG. 8, the depth pixel 100e of FIG. 12 may further include the first through fourth bridge diffusion regions 151, 153, 155 and 157 as temporary storage regions and may further include the first through fourth transfer gates 161, 163, 165 and 167. In the depth pixel 100e, the photo charges may be stored in the temporary storage regions (e.g., the bridge diffusion regions 151, 153, 155 and 157) before the photo charges are accumulated in the floating diffusion regions so that the noise voltage may be sampled before the demodulation voltage is sampled. Thus, the more exact effective voltage may be determined by enhancing the signal-to-noise ratio (SNR).

The first through fourth bridge diffusion regions 151, 153, 155 and 157 may be formed in the semiconductor substrate 110 and may be adjacent to the photo detection region 120, respectively. The first bridge diffusion region 151 may store the first photo charges when the first photo gate 131 is turned on. The second bridge diffusion region 153 may store the second photo charges when the second photo gate 133 is turned on. In other words, the first and second photo charges, that are collected in the photo detection region 120 and are drifted in the first and second directions D1 and D2, respectively, may be temporarily stored in the first and second bridge diffusion regions 151 and 153 in response to the first photo control signal PGC1, respectively. The third bridge diffusion region 155 may store the third photo charges when the third photo gate 135 is turned on. The fourth bridge diffusion region 157 may store the fourth photo charges when the fourth photo gate 137 is turned on. In other words, the third and fourth photo charges, that are collected in the photo detection region 120 and are drifted in the first and second directions D1 and D2, respectively, may be temporarily stored in the third and fourth bridge diffusion regions 155 and 157 in response to the second photo control signal PGG2, respectively.

Similar to the photo detection region 120 and the floating diffusion regions 141, 143, 145 and 147, the bridge diffusion regions 151, 153, 155 and 157 may be formed in the semiconductor substrate 110 by doping the impurities having the conductive type different from that of the semiconductor substrate 110.

The first and second transfer gates 161 and 163 may be formed over the semiconductor substrate 110 and may be turned on in response to a first transfer control signal TGC1, respectively. The first transfer gate 161 may be between the first bridge diffusion region 151 and the first floating diffusion region 141. The second transfer gate 163 may be between the second bridge diffusion region 153 and the second floating diffusion region 143. The first and second bridge diffusion regions 151 and 153 may be electrically connected to the first and second floating diffusion regions 141 and 143, respectively, when the first and second transfer gates 161 and 163 are turned on, and thus the first and second photo charges may be transferred from the first and second bridge diffusion regions 151 and 153 to the first and second floating diffusion regions 141 and 143, respectively. The third and fourth transfer gates 165 and 167 may be formed over the semiconductor substrate 110 and may be turned on in response to a second transfer control signal TGC2, respectively. The third transfer gate 165 may be between the third bridge diffusion region 155 and the third floating diffusion region 145. The fourth transfer gate 167 may be between the fourth bridge diffusion region 157 and the fourth floating diffusion region 147. The third and fourth bridge diffusion regions 155 and 157 may be electrically connected to the third and fourth floating diffusion regions 145 and 147, respectively, when the third and fourth transfer gates 165 and 167 are turned on, and thus the third and fourth photo charges may be transferred from the third and fourth bridge diffusion regions 155 and 157 to the third and fourth floating diffusion regions 145 and 147, respectively.

In an example embodiment, the doping density in the photo detection region 120 may gradually decrease as the first distance from the first photo gate 131, the second distance from the second photo gate 133, a third distance from the third photo gate 135 or a fourth distance from the fourth photo gate 137 increases.

Figure 14:
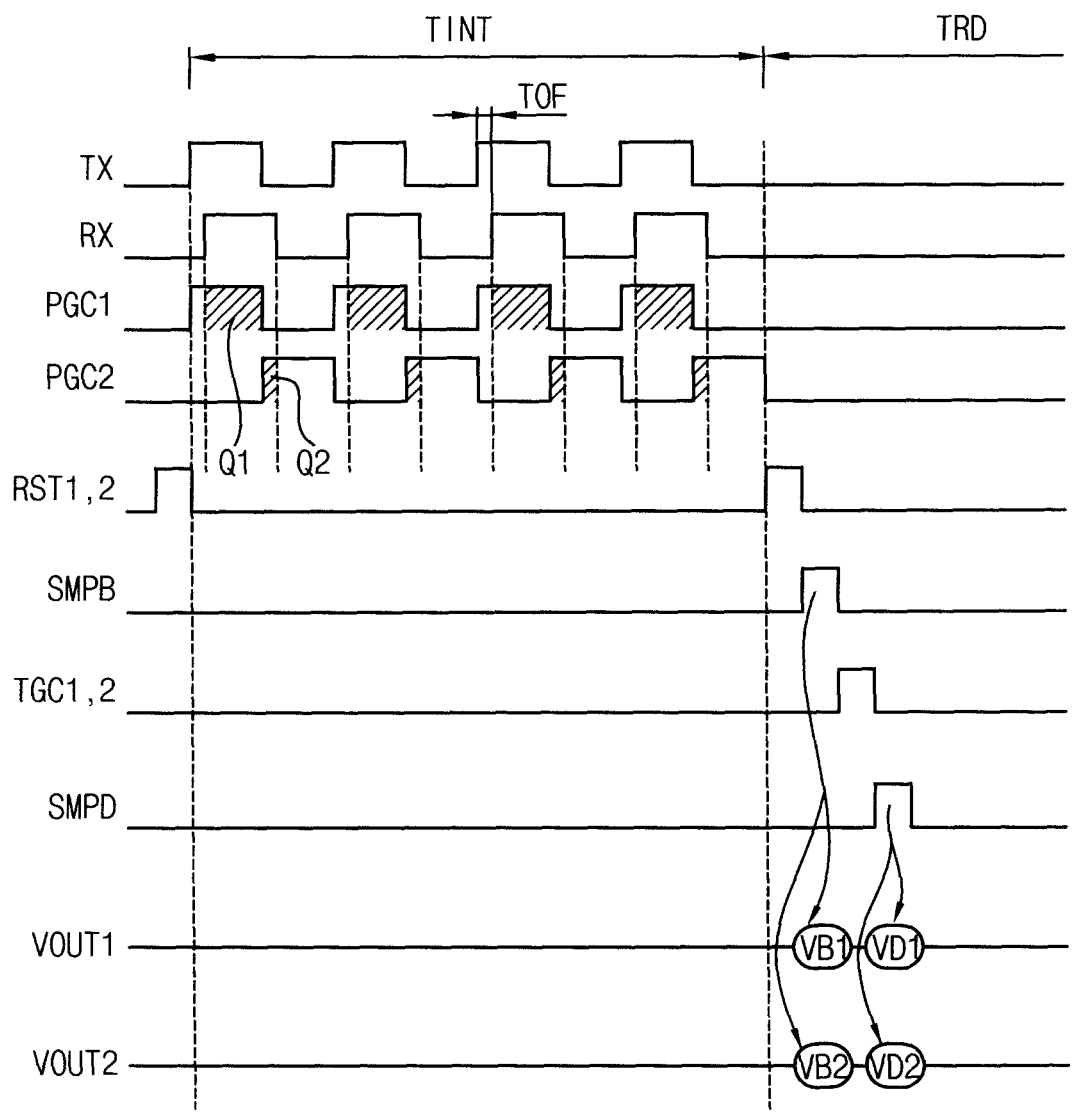
FIG. 14 is a timing diagram for describing an operation of the depth pixel of FIG. 12.

FIG. 14 is a timing diagram for describing an operation of the depth pixel of FIG. 12.

Referring to FIGS. 12, 13A, 13B and 14, the first and second reset signals RST1 and RST2 are activated to reset the first through fourth floating diffusion regions 141, 143, 145 and 147 before the integration time interval TINT.

The object is illuminated with the transmission light TX during the integration time interval TINT. The transmission light TX is reflected by the object and returned to the depth pixel 100e as the reception light RX. The reception light RX is delayed by the TOF with respect to the transmission light TX.

The first and second photo control signals PGC1 and PGC2, which are activated to have periodically varying intensity during the integration time interval TINT, have respective phase differences with respect to the transmission light TX. The photo charges Q1 corresponding to the activation interval of the first photo control signal PGC1 are collected in the photo detection region 120 by the reception light RX. The first photo charges, that are drifted in the first direction D1, of the photo charges Q1 are temporarily stored in the first bridge diffusion region 151 in response to the first photo control signal PGC1. The second photo charges, that are drifted in the second direction D2, of the photo charges Q1 are temporarily stored in the second bridge diffusion region 153 in response to the first photo control signal PGC1. In addition, the photo charges Q2 corresponding to the activation interval of the second photo control signal PGC2 are collected in the photo detection region 120 by the reception light RX. The third photo charges, that are drifted in the first direction D1, of the photo charges Q2 are temporarily stored in the third bridge diffusion region 155 in response to the second photo control signal PGC2. The fourth photo charges, that are drifted in the second direction D2, of the photo charges Q2 are temporarily stored in the fourth bridge diffusion region 157 in response to the second photo control signal PGG2.

During the readout time interval TRD, the first and second reset signals RST1 and RST2 are activated to reset the first through fourth floating diffusion regions 141, 143, 145 and 147. A first sampling control signal SMPB is activated after the floating diffusion regions 141, 143, 145 and 147 are reset, and then the voltages of the first and second floating diffusion regions 141 and 143 are sampled as a first noise voltage VB1 and the voltages of the third and fourth floating diffusion regions 145 and 147 are sampled as a second noise voltage VB2. The first and second transfer control signals TGC1 and TGC2 are activated after the noise voltages VB1 and VB2 are sampled, and then the first through fourth photo charges are transferred from the first through fourth bridge diffusion regions 151, 153, 155 and 157 to the first through fourth floating diffusion regions 141, 143, 145 and 147, respectively. A second sampling control signal SMPD is activated after the first through fourth photo charges are accumulated in the first through fourth floating diffusion regions 141, 143, 145 and 147, respectively, and then the voltages of the first and second floating diffusion regions 141 and 143, that correspond to the sum of the first and second photo charges (e.g., the photo charges Q1), are sampled as the first demodulation voltage VD1 and the voltages of the third and fourth floating diffusion regions 145 and 147, that correspond to the sum of the third and fourth photo charges (e.g., the photo charges Q2), are sampled as the second demodulation voltage VD2.

The effective voltages may be determined based on the noise voltages VB1 and VB2 and the demodulation voltages VD1 and VD2. For example, the difference between the first noise voltage VB1 and the first demodulation voltage VD1 may be determined as the first effective voltage V1(|VB1 −VD1|) and the difference between the second noise voltage VB2 and the second demodulation voltage VD2 may be determined as the second valid voltage V2 (=|VB2 −VD2|). If P1 is the phase difference between the first photo control signal PGC1 and the transmission light TX and P2 is the phase difference between the second photo control signal PGG2 and the transmission light TX, the phase of the reception light RX may be determined as (P1*V1+ P2*V2)/(V1+V2), and thus the TOF or the distance to the object may be determined.

Figure 15:
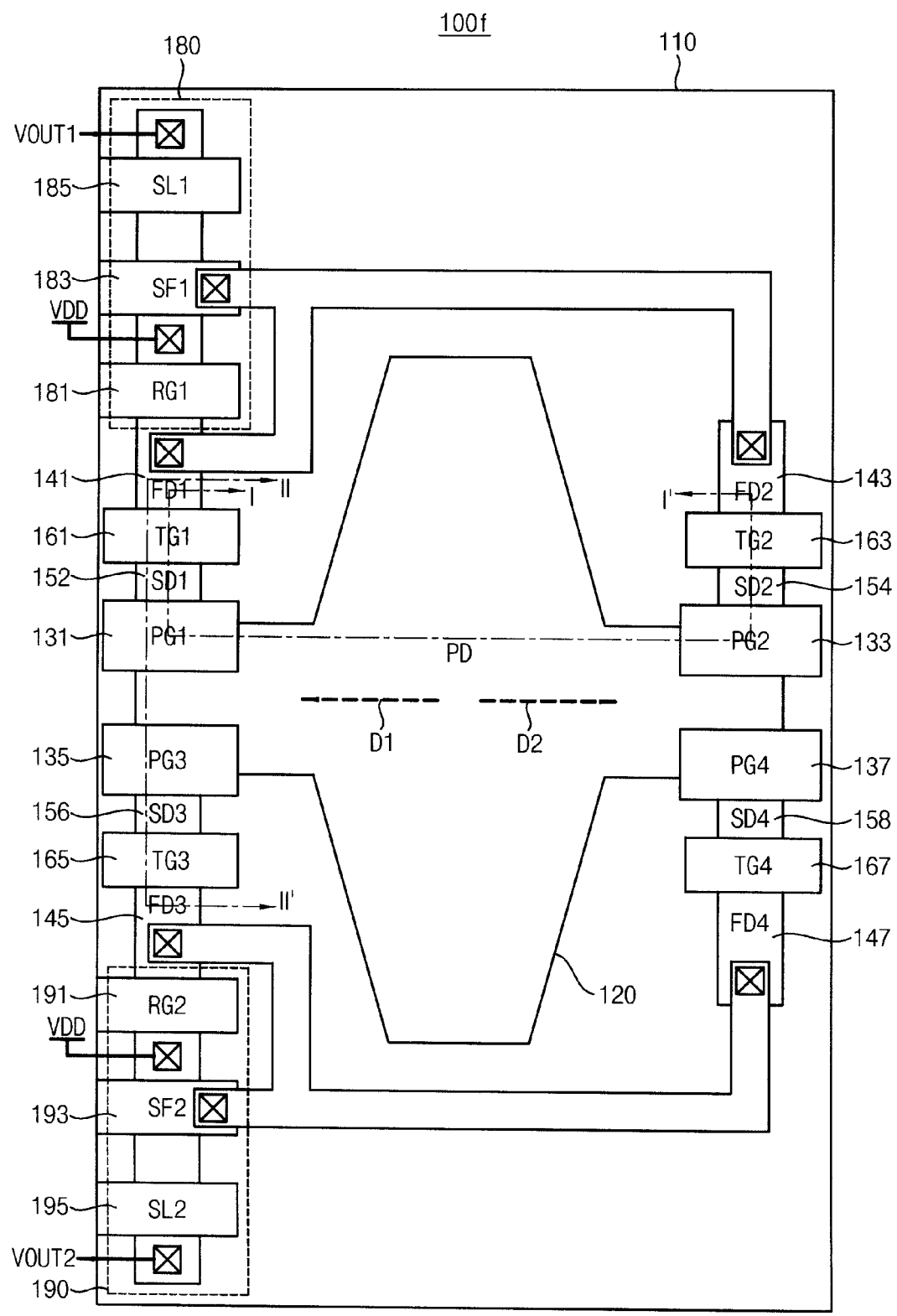
FIG. 15 is a plan view illustrating a depth pixel included in a 3D image sensor according to an example embodiment.
Figure 16A:
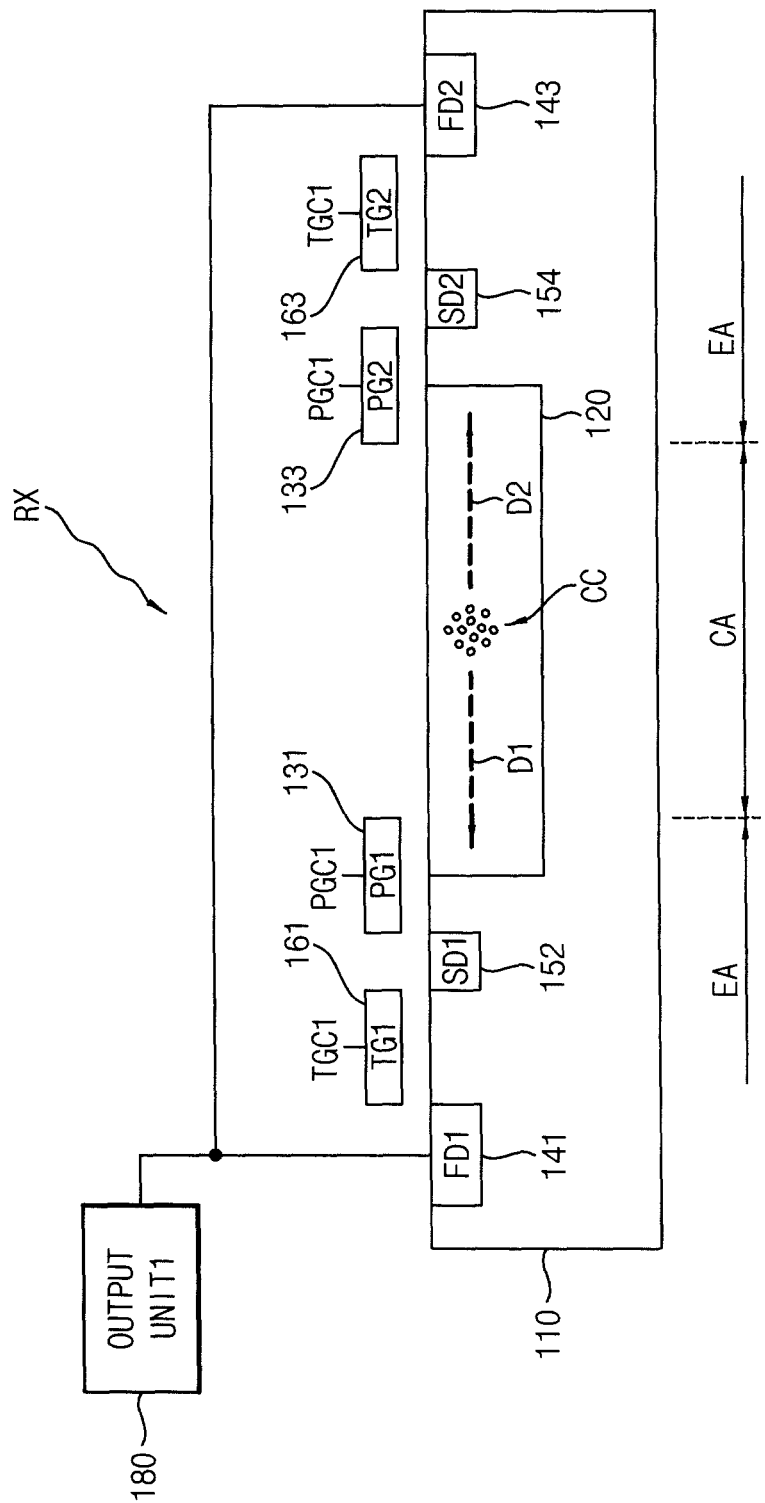
FIGS. 16A and 16B are diagrams for describing a structure of the depth pixel of FIG. 15.
Figure 16B:
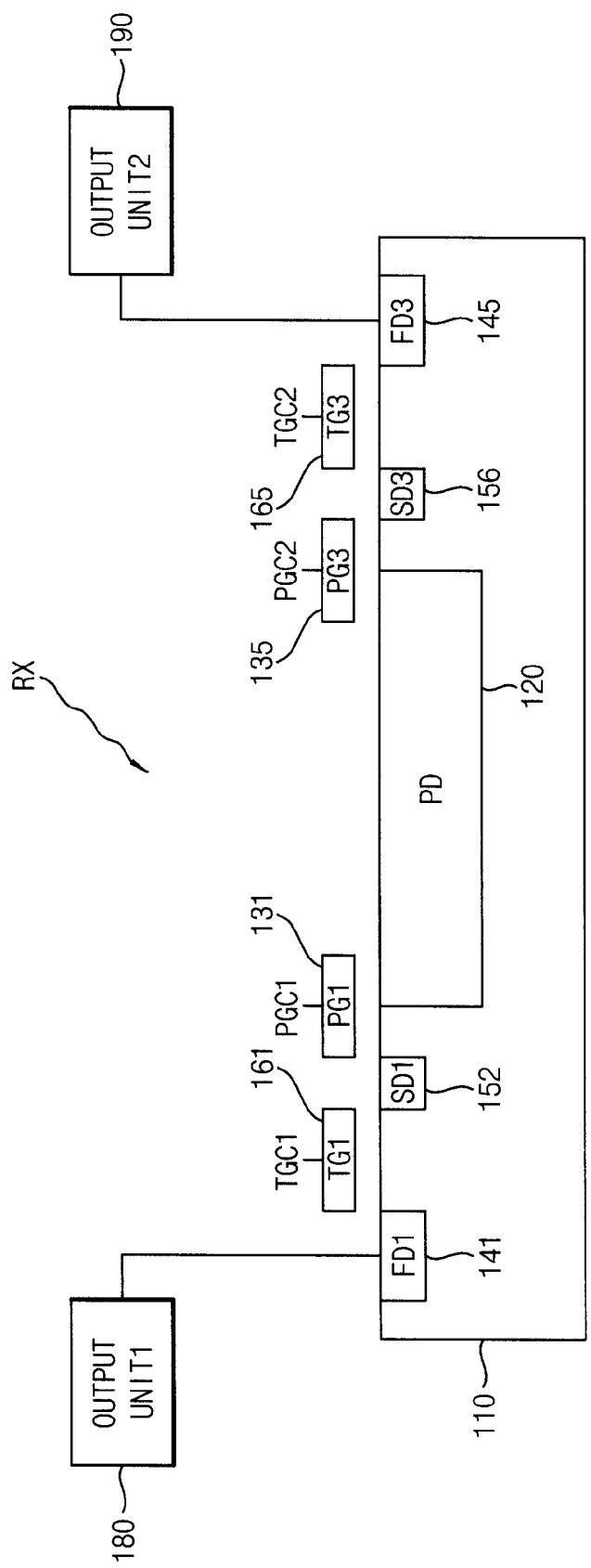

FIG. 15 is a plan view illustrating a depth pixel included in a 3D image sensor according to at least one example embodiment. FIGS. 16A and 16B are diagrams for describing a structure of the depth pixel of FIG. 15. FIG. 16A is a cross-sectional view of the depth pixel taken along a line I-I' of FIG. 15. FIG. 16B is a cross-sectional view of the depth pixel taken along a line II-II' of FIG. 15.

Referring to FIGS. 15, 16A and 16B, a depth pixel 100f included in a 3D image sensor includes a photo detection region 120, a first photo gate 131, a first floating diffusion region 141, a second photo gate 133 and a second floating diffusion region 143. The depth pixel 100f may further include a first storage region 152, a first transfer gate 161, a second storage region 154, a second transfer gate 163 and a first output unit 180. In addition, the depth pixel 100f may further include a third photo gate 135, a third storage region 156, a third transfer gate 165, a third floating diffusion region 145, a fourth photo gate 137, a fourth storage region 158, a fourth transfer gate 167, a fourth floating diffusion region 147 and a second output unit 190.

In comparison with the depth pixel 100c of FIG. 8, the depth pixel 100f of FIG. 15 may further include the first through fourth storage regions 152, 154, 156 and 158 as the temporary storage regions and may further include the first through fourth transfer gates 161, 163, 165 and 167. In the depth pixel 100f, the photo charges may be stored in the temporary storage regions (e.g., the storage regions 152, 154, 156 and 158) before the photo charges are accumulated in the floating diffusion regions so that the noise voltage may be sampled before the demodulation voltage is sampled. Thus, the more exact effective voltage may be determined by enhancing the SNR. The depth pixel 100f of FIG. 15 may operate based on the timing diagram of FIG. 14.

The first through fourth storage regions 152, 154, 156 and 158 may be formed in the semiconductor substrate 110 and may be spaced apart from the photo detection region 120, respectively. The first storage region 152 may store the first photo charges when the first photo gate 131 is turned on. The second storage region 154 may store the second photo charges when the second photo gate 133 is turned on. The third storage region 156 may store the third photo charges when the third photo gate 135 is turned on. The fourth storage region 158 may store the fourth photo charges when the fourth photo gate 137 is turned on. In other words, the first and second photo charges may be temporarily stored in the first and second storage regions 152 and 154 in response to the first photo control signal PGC1, respectively, and the third and fourth photo charges may be temporarily stored in the third and fourth storage regions 156 and 158 in response to the second photo control signal PGG2, respectively.

Similar to the photo detection region 120 and the floating diffusion regions 141, 143, 145 and 147, the storage regions 152, 154, 156 and 158 may be formed in the semiconductor substrate 110 by doping the impurities having the conductive type different from that of the semiconductor substrate 110.

The first and second storage regions 152 and 154 may be electrically connected to the first and second floating diffusion regions 141 and 143, respectively, in response to the first transfer control signal TGC1 applied to the first and second transfer gates 161 and 163, and thus the first and second photo charges may be transferred from the first and second storage regions 152 and 154 to the first and second floating diffusion regions 141 and 143, respectively. The third and fourth storage regions 156 and 158 may be electrically connected to the third and fourth floating diffusion regions 145 and 147, respectively, in response to the second transfer control signal TGC2 applied to the third and fourth transfer gates 165 and 167, and thus the third and fourth photo charges may be transferred from the third and fourth storage regions 156 and 158 to the third and fourth floating diffusion regions 145 and 147, respectively.

In an example embodiment, the doping density in the photo detection region 120 may gradually decrease as the first distance from the first photo gate 131, the second distance from the second photo gate 133, a third distance from the third photo gate 135 or a fourth distance from the fourth photo gate 137 increases.

Figure 17:
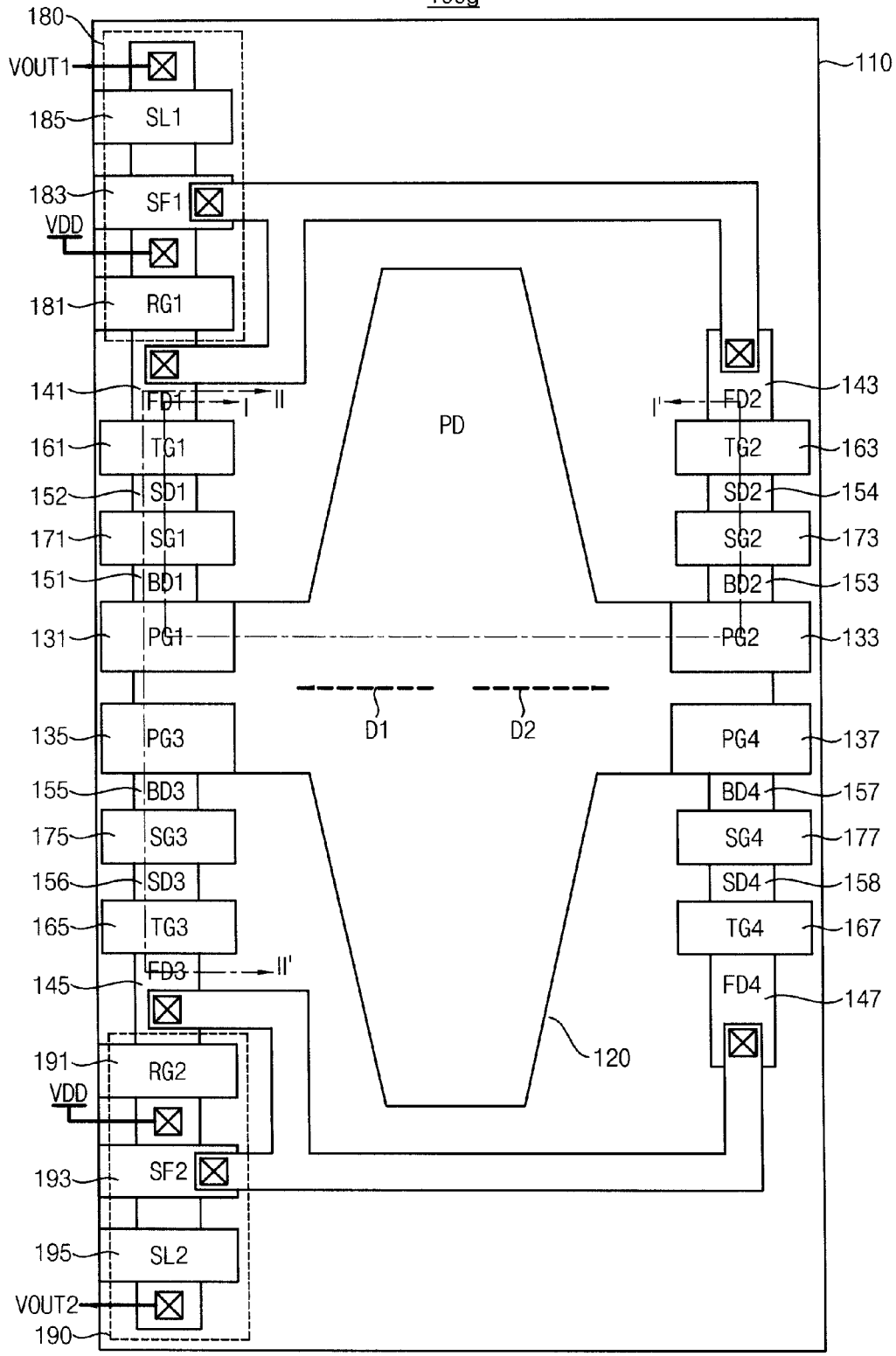
FIG. 17 is a plan view illustrating a depth pixel included in a 3D image sensor according to an example embodiment.

FIG. 17 is a plan view illustrating a depth pixel included in a 3D image sensor according to at least one example embodiment. FIGS. 18A and 18B are diagrams for describing a structure of the depth pixel of FIG. 17. FIG. 18A is a cross-sectional view of the depth pixel taken along a line I-I' of FIG. 17. FIG. 18B is a cross-sectional view of the depth pixel taken along a line II-II' of FIG. 17.

Referring to FIGS. 17, 18A and 18B, a depth pixel 100g included in a 3D image sensor includes a photo detection region 120, a first photo gate 131, a first floating diffusion region 141, a second photo gate 133 and a second floating diffusion region 143. The depth pixel 100g may further include a first bridge diffusion region 151, a first storage gate 171, a first storage region 152, a first transfer gate 161, a second bridge diffusion region 153, a second storage gate 173, a second storage region 154, a second transfer gate 163 and a first output unit 180. In addition, the depth pixel 100g may further include a third photo gate 135, a third bridge diffusion region 155, a third storage gate 175, a third storage region 156, a third transfer gate 165, a third floating diffusion region 145, a fourth photo gate 137, a fourth bridge diffusion region 157, a fourth storage gate 177, a fourth storage region 158, a fourth transfer gate 167, a fourth floating diffusion region 147 and a second output unit 190.

In comparison with the depth pixel 100c of FIG. 8, the depth pixel 100g of FIG. 17 may further include the first through fourth bridge diffusion regions 151, 153, 155 and 157 and the first through fourth storage regions 152, 154, 156 and 158 as the temporary storage regions, and may further include the first through fourth transfer gates 161, 163, 165 and 167 and the first through fourth storage gates 171, 173, 175 and 177.

The first through fourth bridge diffusion regions 151, 153, 155 and 157 may be formed adjacent to the photo detection region 120, respectively. The first through fourth storage regions 152, 154, 156 and 158 may be formed spaced apart from the first through fourth bridge diffusion regions 151, 153, 155 and 157, respectively. The first through fourth photo charges may be stored in the first through fourth bridge diffusion regions 151, 153, 155 and 157, respectively, when the first through fourth photo gates 131, 133, 135 and 137 are turned on.

The first through fourth storage gates 171, 173, 175 and 177 may be formed over the semiconductor substrate 110 and may be between the first through fourth bridge diffusion regions 151, 153, 155 and 157 and the first through fourth storage regions 152, 154, 156 and 158, respectively. The first and second bridge diffusion regions 151 and 153 may be electrically connected to the first and second storage regions 152 and 154, respectively, in response to a first storage control signal SGC1 applied to the first and second storage gates 171 and 173, and thus the first and second photo charges may be transferred from the first and second bridge diffusion regions 151 and 153 to the first and second storage regions 152 and 154, respectively. The third and fourth bridge diffusion regions 155 and 157 may be electrically connected to the third and fourth storage regions 156 and 158, respectively, in response to a second storage control signal SGC2 applied to the third and fourth storage gates 175 and 177, and thus the third and fourth photo charges may be transferred from the third and fourth bridge diffusion regions 155 and 157 to the third and fourth storage regions 156 and 158, respectively.

The first through fourth transfer gates 161, 163, 165 and 167 may be formed over the semiconductor substrate 110 and may be between the first through fourth storage regions 152, 154, 156 and 158 and the first through fourth floating diffusion regions 141, 143, 145 and 147, respectively. The first and second storage regions 152 and 154 may be electrically connected to the first and second floating diffusion regions 141 and 143, respectively, in response to the first transfer control signal TGC1 applied to the first and second transfer gates 161 and 163, and thus the first and second photo charges may be transferred from the first and second storage regions 152 and 154 to the first and second floating diffusion regions 141 and 143, respectively. The third and fourth storage regions 156 and 158 may be electrically connected to the third and fourth floating diffusion regions 145 and 147, respectively, in response to the second transfer control signal TGC2 applied to the third and fourth transfer gates 165 and 167, and thus the third and fourth photo charges may be transferred from the third and fourth storage regions 156 and 158 to the third and fourth floating diffusion regions 145 and 147, respectively.

In an example embodiment, the doping density in the photo detection region 120 may gradually decrease as the first distance from the first photo gate 131, the second distance from the second photo gate 133, a third distance from the third photo gate 135 or a fourth distance from the fourth photo gate 137 increases.

FIG. 19 is a timing diagram for describing an operation of the depth pixel of FIG. 17.

Referring to FIGS. 17, 18A, 18B and 19, an operation of the depth pixel 100g before and during the integration time interval TINT may be substantially the same as the operation of the depth pixel 100e described above with reference to FIG. 14.

During the readout time interval TRD, the first and second reset signals RST1 and RST2 are activated to reset the first through fourth floating diffusion regions 141, 143, 145 and 147. The first and second storage control signals SGC1 and SGC2 are activated to transfer the first through fourth photo charges from the first through fourth bridge diffusion regions 151, 153, 155 and 157 to the first through fourth storage regions 152, 154, 156 and 158, respectively. The first sampling control signal SMPB is activated to sample the voltages of the first and second floating diffusion regions 141 and 143 as the first noise voltage VB1 and to sample the voltages of the third and fourth floating diffusion regions 145 and 147 as the second noise voltage VB2. The first and second transfer control signals TGC1 and TGC2 are activated to transfer the first through fourth photo charges from the first through fourth storage regions 152, 154, 156 and 158 to the first through fourth floating diffusion regions 141, 143, 145 and 147, respectively. The second sampling control signal SMPD is activated to sample the voltages of the first and second floating diffusion regions 141 and 143, that correspond to the sum of the first and second photo charges (e.g., the photo charges Q1), as the first demodulation voltage VD1 and to sample the voltages of the third and fourth floating diffusion regions 145 and 147, that correspond to the sum of the third and fourth photo charges (e.g., the photo charges Q2), as the second demodulation voltage VD2. The effective voltages may be determined based on the noise voltages VB1 and VB2 and the demodulation voltages VD1 and VD2.

According to at least one example embodiment, the depth pixel 100e of FIG. 12, the depth pixel 100f of FIG. 15 and the depth pixel 100g of FIG. 17 may further include the first gate. As described above with reference to FIGS. 5 and 11, the first gate may be formed over the central area CA of the photo detection region 120. The internal electric field may be induced in the photo detection region 120 based on the first voltage applied to the first gate. When the depth pixels 100e, 100f and 100g include the first gate, the photo detection region 120 may have a uniform doping density, or the doping density in the photo detection region 120 may gradually decrease as the first distance from the first photo gate 131, the second distance from the second photo gate 133, a third distance from the third photo gate 135 or a fourth distance from the fourth photo gate 137 increases.

According to at least one example embodiment, the depth pixel 100e of FIG. 12, the depth pixel 100f of FIG. 15 and the depth pixel 100g of FIG. 17 may be implemented with only one of two half pixels. For example, the photo gates 135 and 137, the bridge diffusion regions 155 and 157, the transfer gates 165 and 167, the floating diffusion regions 145 and 147 and the output unit 190 may be omitted in the depth pixel 100e. The photo gates 135 and 137, the storage regions 156 and 158, the transfer gates 165 and 167, the floating diffusion regions 145 and 147 and the output unit 190 may be omitted in the depth pixel 100f. The photo gates 135 and 137, the bridge diffusion regions 155 and 157, the storage gates 175 and 177, the storage regions 156 and 158, the transfer gates 165 and 167, the floating diffusion regions 145 and 147 and the output unit 190 may be omitted in the depth pixel 100g.

Figure 20:
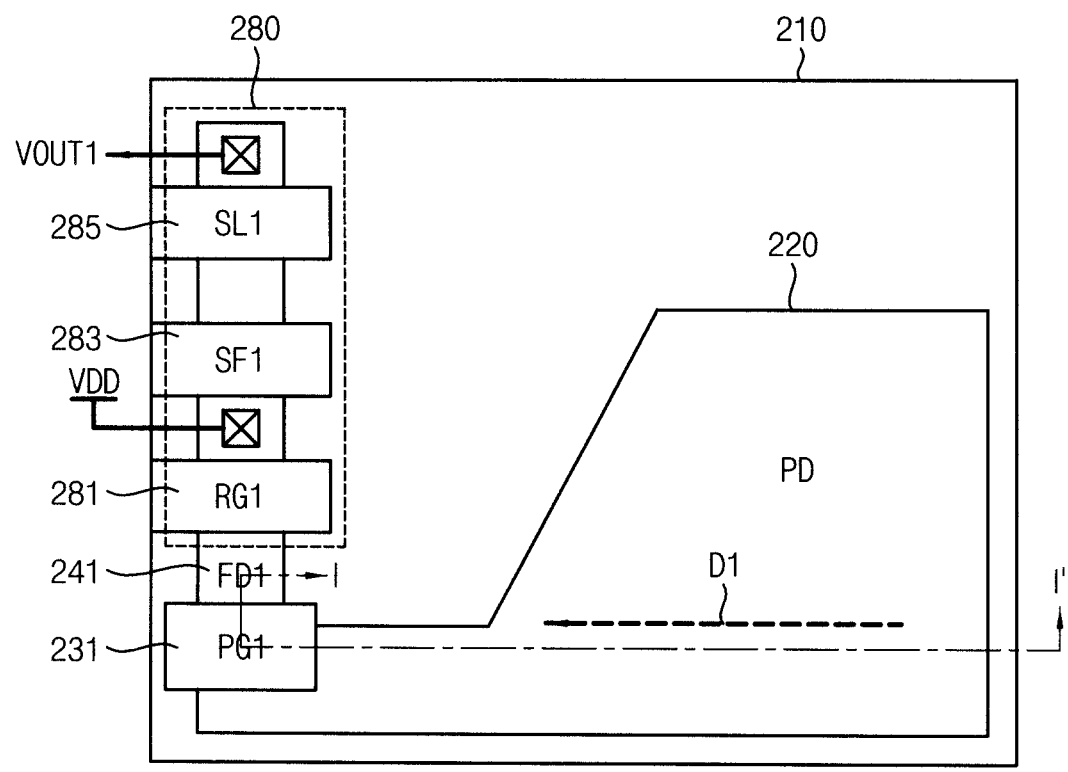
FIG. 20 is a plan view illustrating a depth pixel included in a 3D image sensor according to an example embodiment.
Figure 21:
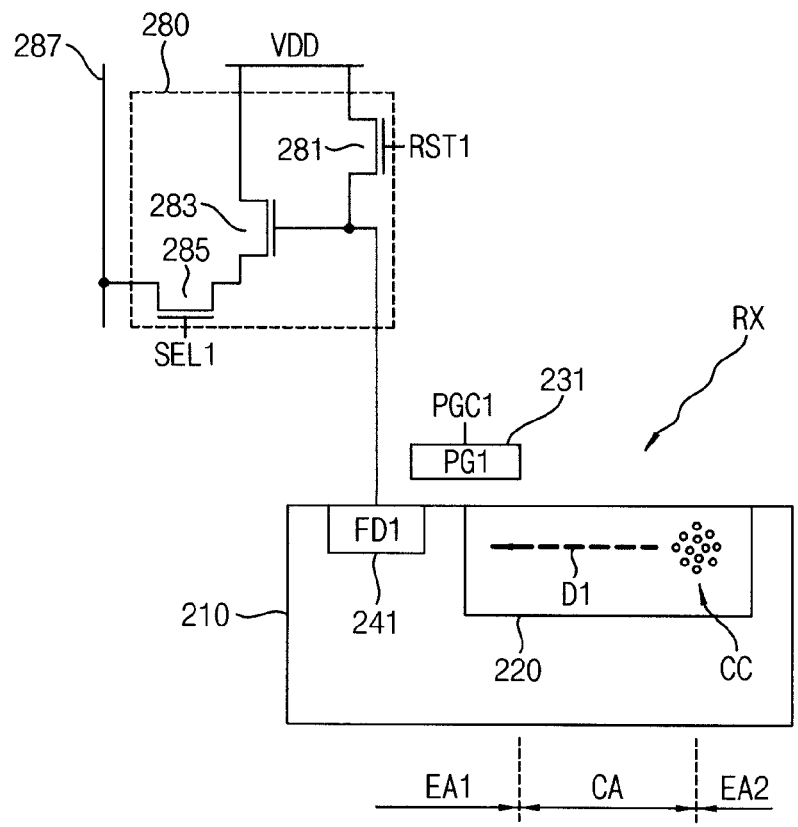
FIGS. 21 and 22 are diagrams for describing a structure of the depth pixel of FIG. 20.
Figure 22:
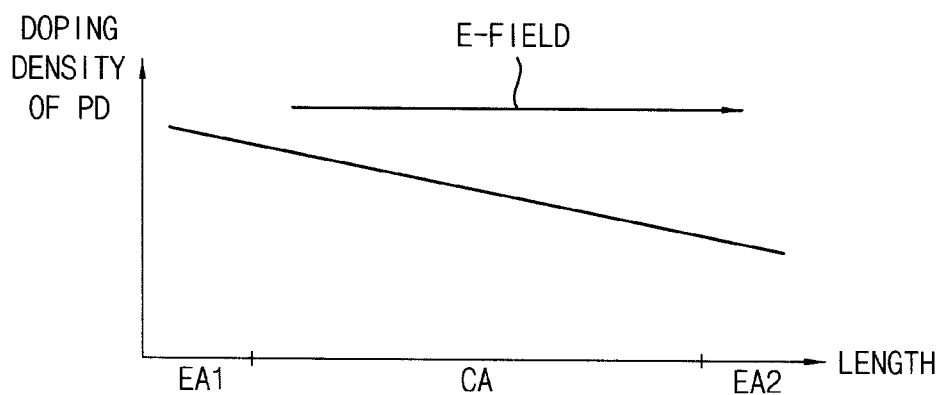

FIG. 20 is a plan view illustrating a depth pixel included in a 3D image sensor according to at least one example embodiment. FIGS. 21 and 22 are diagrams for describing a structure of the depth pixel of FIG. 20. FIG. 21 is a cross-sectional view of the depth pixel taken along a line I-I' of FIG. 20. FIG. 22 illustrates a doping density profile in a photo detection region included in the depth pixel of FIG. 20.

Referring to FIGS. 20, 21 and 22, a depth pixel 200a included in a 3D image sensor includes a photo detection region 220, a first photo gate 231 and a first floating diffusion region 241. The depth pixel 200a may further include a first output unit 280.

The photo detection region 220 is formed in a semiconductor substrate 210. The photo detection region 220 collects photo charges CC based on a reception light RX reflected by an object. An internal electric field is formed in the photo detection region 220 such that the collected photo charges CC are drifted in a first direction D1 (e.g., unidirectionally) based on the internal electric field.

The first photo gate 231 is formed over the semiconductor substrate 210, e.g., over the photo detection region 220. The first photo gate 231 is turned on in response to a first photo control signal PGC1. The first floating diffusion region 241 is formed in the semiconductor substrate 210. The first floating diffusion region 241 accumulates first photo charges of the collected photo charges CC when the first photo gate 231 is turned on. The first photo charges are drifted in the first direction D1. In other words, the photo detection region 220 and the first floating diffusion region 241 may be electrically connected to each other in response to the first photo control signal PGC1.

The first photo gate 231 may be formed over a first edge area EA1 of the photo detection region 220. The photo detection region 220 and the first floating diffusion region 241 may be formed in the semiconductor substrate 210 by doping impurities having a conductive type different from that of the semiconductor substrate 210. Doping density in the photo detection region 220 may gradually decrease as a first distance from the first photo gate 231 increases.

In an example embodiment, the photo detection region 220 and the first floating diffusion region 241 may be doped with impurities of the n-type when the semiconductor substrate 210 is the p-type. In this case, the photo detection region 220 may collect electrons of electron-hole pairs (e.g., the first photo charges may be the electrons). In addition, as illustrated in FIG. 22, doping density of the first edge area EA1 of the photo detection region 220 may be higher than doping density of a central area CA of the photo detection region 220 and doping density of a second edge area EA2 of the photo detection region 220 (e.g., the first edge area EA1 may be (n+)-type region, the central area CA may be n-type region, and the second edge area EA2 may be (n−)-type region), and thus the internal electric field E-FIELD may be formed based on such doping density profile. The first photo charges (e.g., the electrons) may be drifted in the first direction D1 based on the internal electric field E-FIELD. The first direction D1 may be from the second edge area EA2 of the photo detection region 220 to the first edge area EA1 of the photo detection region 220 (e.g., to the first photo gate 231).

In another example embodiment, the photo detection region 220 and the first floating diffusion region 241 may be doped with impurities of the p-type when the semiconductor substrate 210 is the n-type. In this case, the photo detection region 220 may collect holes of the electron-hole pairs (e.g., the first photo charges may be the holes). Doping density of the first edge area EA1 of the photo detection region 220 may be higher than doping density of the central area CA of the photo detection region 220 and doping density of the second edge area EA2 of the photo detection region 220 (e.g., the first edge area EA1 may be (p+)-type region, the central area CA may be p-type region, and the second edge area EA2 may be (p−)-type region), and thus the internal electric field, which has an opposite direction with respect to the E-FIELD in FIG. 22, may be formed based on such doping density profile. The first photo charges (e.g., the holes) may be drifted in the first direction D1 based on the internal electric field.

In an example embodiment, a size of the first photo gate 231 may be smaller than a size of the photo detection region 220. Since the collected photo charges CC are drifted in the first direction D1 based on the internal electric field, the depth pixel 200a may effectively store and transfer the collected photo charges CC even if the size of the first photo gate 231 decreases. When the size of the first photo gate 231 decreases, a capacitance of the first photo gate 231 may decrease and surface defects caused by manufacturing processes may be reduced. As the capacitance of the first photo gate 231 decreases, the depth pixel 200a may have relatively low power consumption, and a demodulation contrast of the depth pixel 200a may be maintained even if the depth pixel 200a has relatively high modulation frequency. As the surface defects are reduced, dark currents caused by the surface defects and noises caused by the dark currents may be reduced. Therefore, the depth pixel 200a and the 3D image sensor including the depth pixel 200a may have relatively improved performance.

The first output unit 280 may reset the first floating diffusion region 241 in response to a first reset signal RST1 and may generate a first output voltage VOUT1 corresponding to the first photo charges accumulated in the first floating diffusion region 241.

The first output unit 280 may include a first reset transistor 281, a first drive transistor 283 and a first select transistor 285. The first reset transistor 281 may reset the first floating diffusion region 241 in response to the first reset signal RST1. The first drive transistor 283 may amplify a voltage of the first floating diffusion region 241. The first select transistor 285 may output the voltage amplified by the first drive transistor 283 as the first output voltage VOUT1 in response to a first select signal SEL1. The first output voltage VOUT1 may be provided to a first output line 287.

The depth pixel 200a of FIG. 20 may operate based on the timing diagram of FIG. 4.

Figure 23:
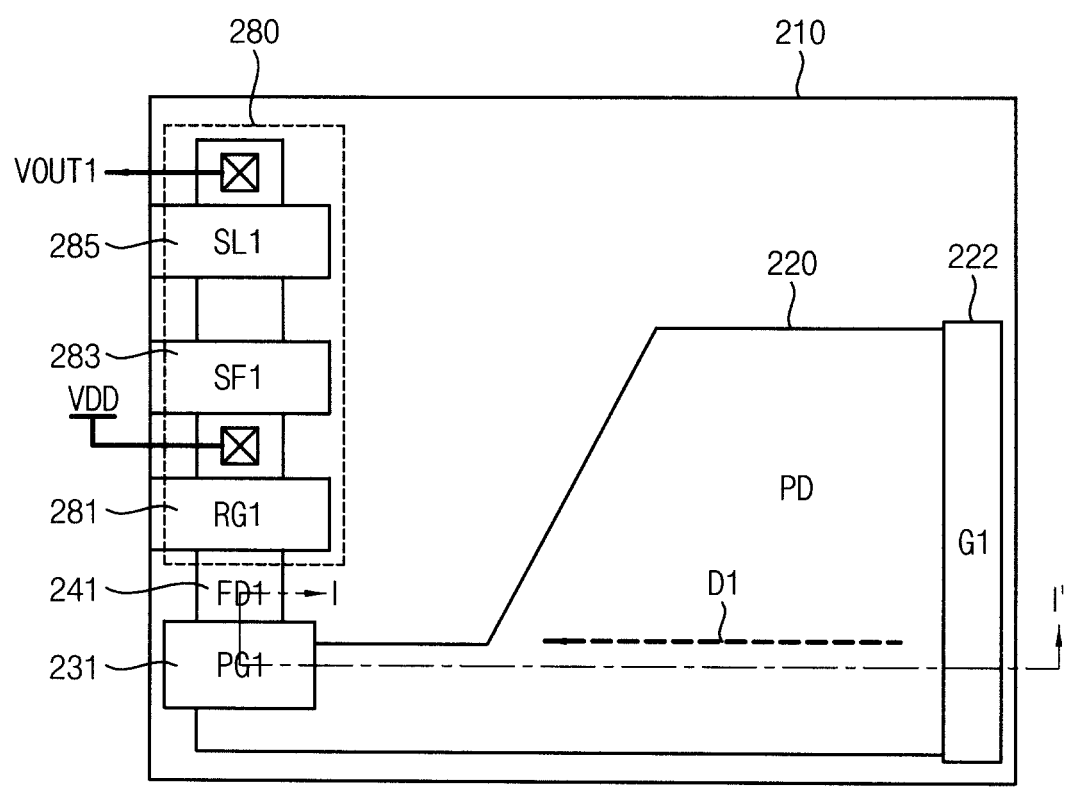
FIG. 23 is a plan view illustrating a depth pixel included in a 3D image sensor according to an example embodiment.
Figure 24:
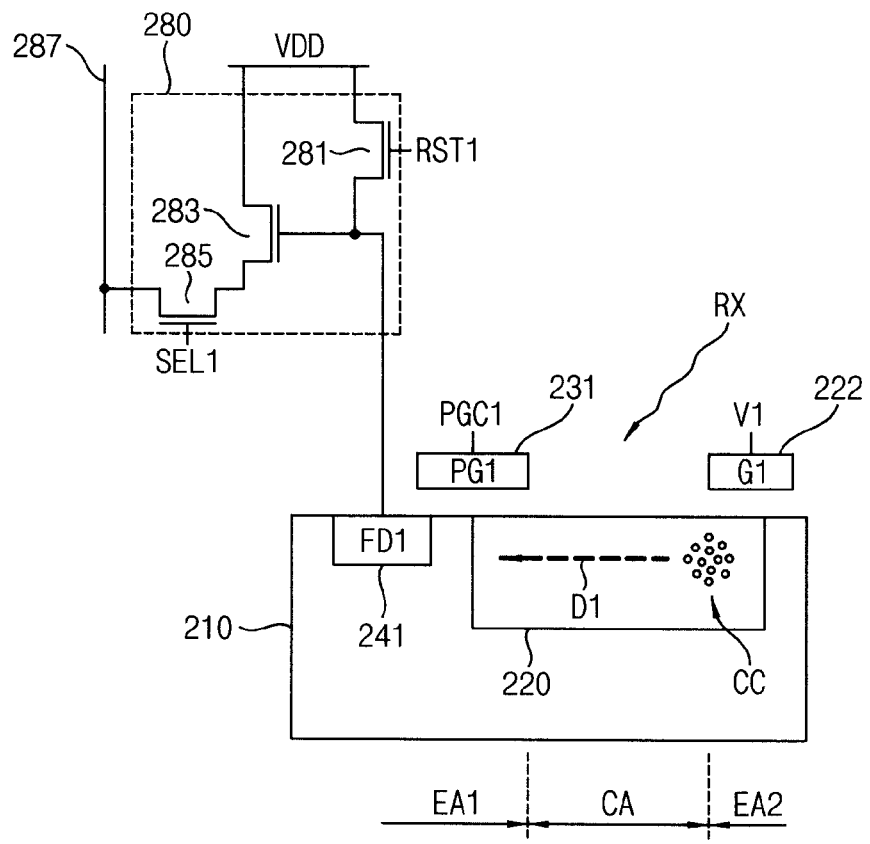
FIGS. 24 and 25 are diagrams for describing a structure of the depth pixel of FIG. 23.
Figure 25:
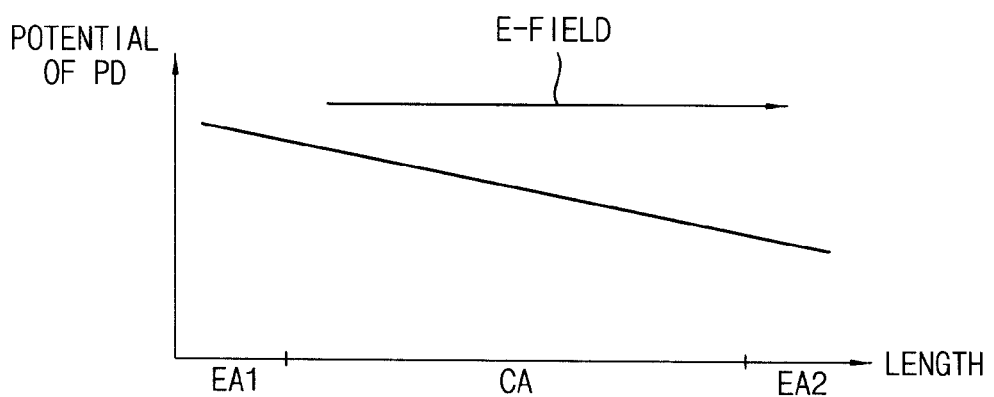

FIG. 23 is a plan view illustrating a depth pixel included in a 3D image sensor according to at least one example embodiment. FIGS. 24 and 25 are diagrams for describing a structure of the depth pixel of FIG. 23. FIG. 24 is a cross-sectional view of the depth pixel taken along a line I-I' of FIG. 23. FIG. 25 illustrates a potential level profile in a photo detection region included in the depth pixel of FIG. 23.

Referring to FIGS. 23, 24 and 25, a depth pixel 200b included in a 3D image sensor includes a photo detection region 220, a first photo gate 231 and a first floating diffusion region 241. The depth pixel 200b may further include a first output unit 280 and a first gate 222.

In comparison with the depth pixel 200a of FIG. 20, the depth pixel 200b of FIG. 23 may further include the first gate 222. The first photo gate 231, the first floating diffusion region 241 and the first output unit 280 included in the depth pixel 200b of FIG. 23 may be substantially the same as the first photo gate 231, the first floating diffusion region 241 and the first output unit 280 included in the depth pixel 200a of FIG. 20, respectively. The depth pixel 200b of FIG. 23 may operate based on the timing diagram of FIG. 4.

The first gate 222 may be formed over the photo detection region 220 and may be spaced apart from the first photo gate 231. For example, the first photo gate 231 and the first gate 222 may be formed over an edge area of the photo detection region 220, respectively. The first photo gate 231 may be formed over the first edge area EA1 of the photo detection region 220, and the first gate 222 may be formed over the second edge area EA2 of the photo detection region 220. The first gate 222 may be formed using the processes (e.g., the deposition process, the etch process, etc) that is used for the first photo gate 231.

The internal electric field may be induced in the photo detection region 220 based on a first voltage V1 applied to the first gate 222. The first voltage V1 may be a negative voltage or a positive voltage.

In an example embodiment, when the semiconductor substrate 210 is the p-type and the photo detection region 220 is doped with impurities of the n-type (e.g., when the photo detection region 220 collects the electrons of the electron-hole pairs), the first voltage V1 may be the negative voltage. In this case, as illustrated in FIG. 25, a potential level in the photo detection region 220 may gradually decrease as the first distance from the first photo gate 231 increases. In other words, a potential level of the first edge area EA1 of the photo detection region 220 may be higher than a potential level of the central area CA of the photo detection region 220, the potential level of the central area CA of the photo detection region 220 may be higher than a potential level of the second edge area EA2 of the photo detection region 220, and thus the internal electric field E-FIELD may be formed based on such potential level profile. The first photo charges (e.g., the electrons) may be drifted in the first direction D1 based on the internal electric field E-FIELD. The first direction D1 may be from the first gate 222 to the first photo gate 231.

In another example embodiment, when the semiconductor substrate 210 is the n-type and the photo detection region 220 is doped with impurities of the p-type (e.g., when the photo detection region 220 collects the holes of the electron-hole pairs), the first voltage V1 may be the positive voltage. In this case, the potential level in the photo detection region 220 may gradually increase as the first distance from the first photo gate 231 increases. In other words, the potential level of the first edge area EA1 of the photo detection region 220 may be lower than the potential level of the central area CA of the photo detection region 220, the potential level of the central area CA of the photo detection region 220 may be lower than the potential level of the second edge area EA2 of the photo detection region 220, and thus the internal electric field, which has an opposite direction with respect to the E-FIELD in FIG. 25, may be formed based on such potential level profile. The first photo charges (e.g., the holes) may be drifted in the first direction D1 based on the internal electric field.

According to at least one example embodiment, the photo detection region 220 may have a uniform doping density, or the doping density in the photo detection region 220 may gradually decrease as the first distance from the first photo gate 231 increases. In other words, the embodiment as described above with reference to FIGS. 20, 21 and 22 (e.g., adjusting the doping density) may be combined with the embodiment as described above with reference to FIGS. 23, 24 and 25 (e.g., additionally forming the first gate 222).

FIGS. 26, 27, 28, 29 and 30 are plan views illustrating depth pixels included in a 3D image sensor according to some example embodiments.

Figure 26:
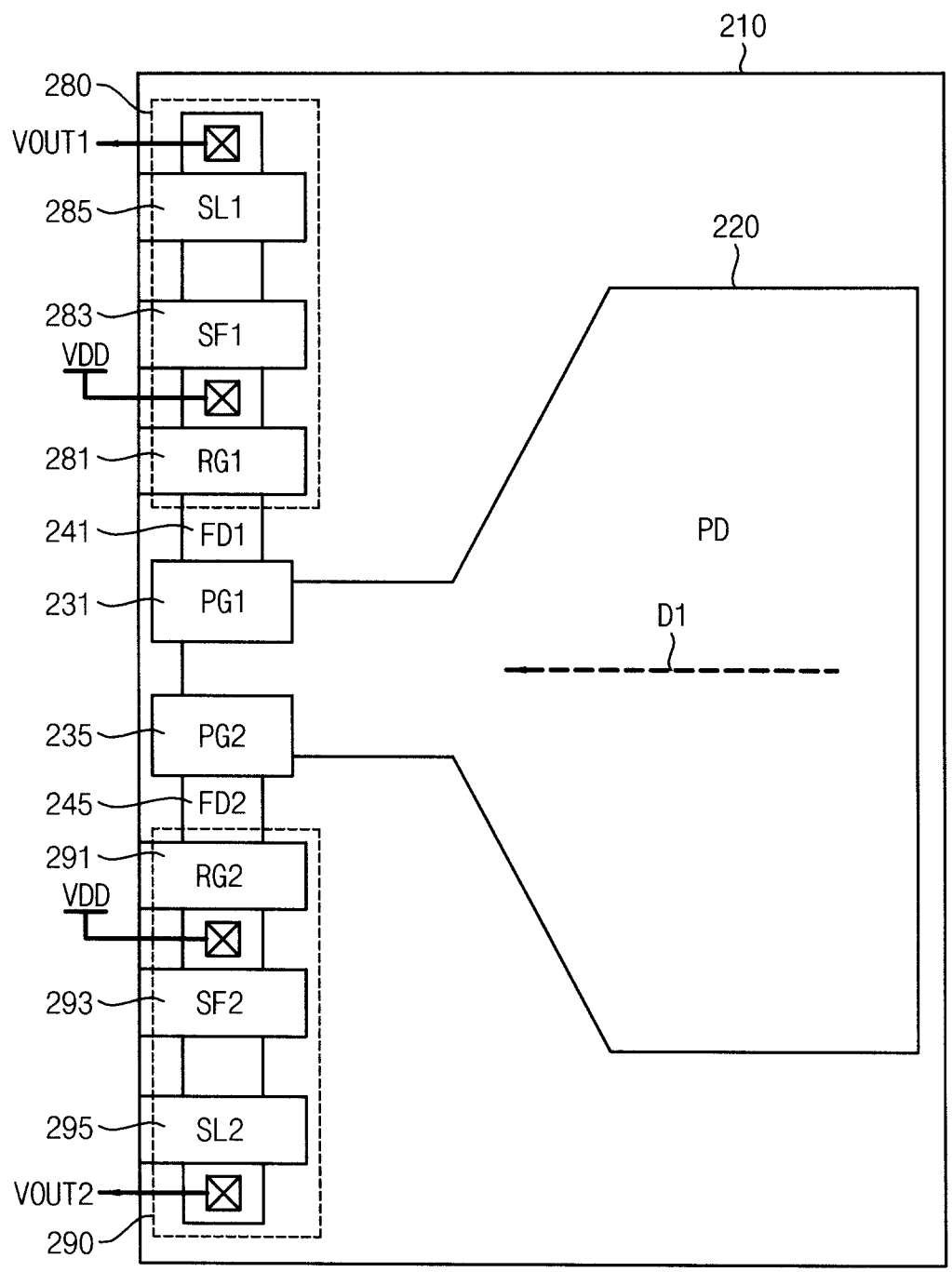
FIGS. 26, 27, 28, 29 and 30 are plan views illustrating depth pixels included in a 3D image sensor according to some example embodiments.

Referring to FIG. 26, a depth pixel 200c included in a 3D image sensor includes a photo detection region 220, a first photo gate 231 and a first floating diffusion region 241. The depth pixel 200c may further include a second photo gate 235, a second floating diffusion region 245, a first output unit 280 and a second output unit 290.

In comparison with the depth pixel 200a of FIG. 20, the depth pixel 200c of FIG. 26 may further include the second photo gate 235, the second floating diffusion region 245 and the second output unit 290. The second photo gate 235, the second floating diffusion region 245 and the second output unit 290 may be symmetrically formed to the first photo gate 231, the first floating diffusion region 241 and the first output unit 280, respectively.

The second photo gate 235, the second floating diffusion region 245 and the second output unit 290 may be substantially the same as the third photo gate 135, the third floating diffusion region 145 and the second output unit 190 in FIG. 8, respectively. For example, the second photo gate 235 may be formed over the semiconductor substrate 210, e.g., over the photo detection region 220, and may be spaced apart from the first photo gate 231. The second photo gate2 235 may be turned on in response to a second photo control signal PGG2. The second floating diffusion region 245 may be formed in the semiconductor substrate 210. The second floating diffusion region 245 may accumulate second photo charges of the collected photo charges CC when the second photo gate 235 is turned on. The second photo charges may be drifted in the first direction D1. The second output unit 290 may generate a second output voltage VOUT2 corresponding to the second photo charges accumulated in the second floating diffusion region 245. The second output unit 290 may include a second reset transistor 291, a second drive transistor 293 and a second select transistor 295.

In an example embodiment, the doping density in the photo detection region 220 may gradually decrease as the first distance from the first photo gate 231 or a second distance from the second photo gate 235 increases. The internal electric field may be induced based on such doping density profile.

The depth pixel 200c of FIG. 26 may be separated as two half pixels. For example, a first half pixel may include the photo detection region 220, the first photo gate 231, the first floating diffusion region 241 and the first output unit 280. A second half pixel may include the photo detection region 220, the second photo gate 235, the second floating diffusion region 245 and the second output unit 290.

Figure 27:
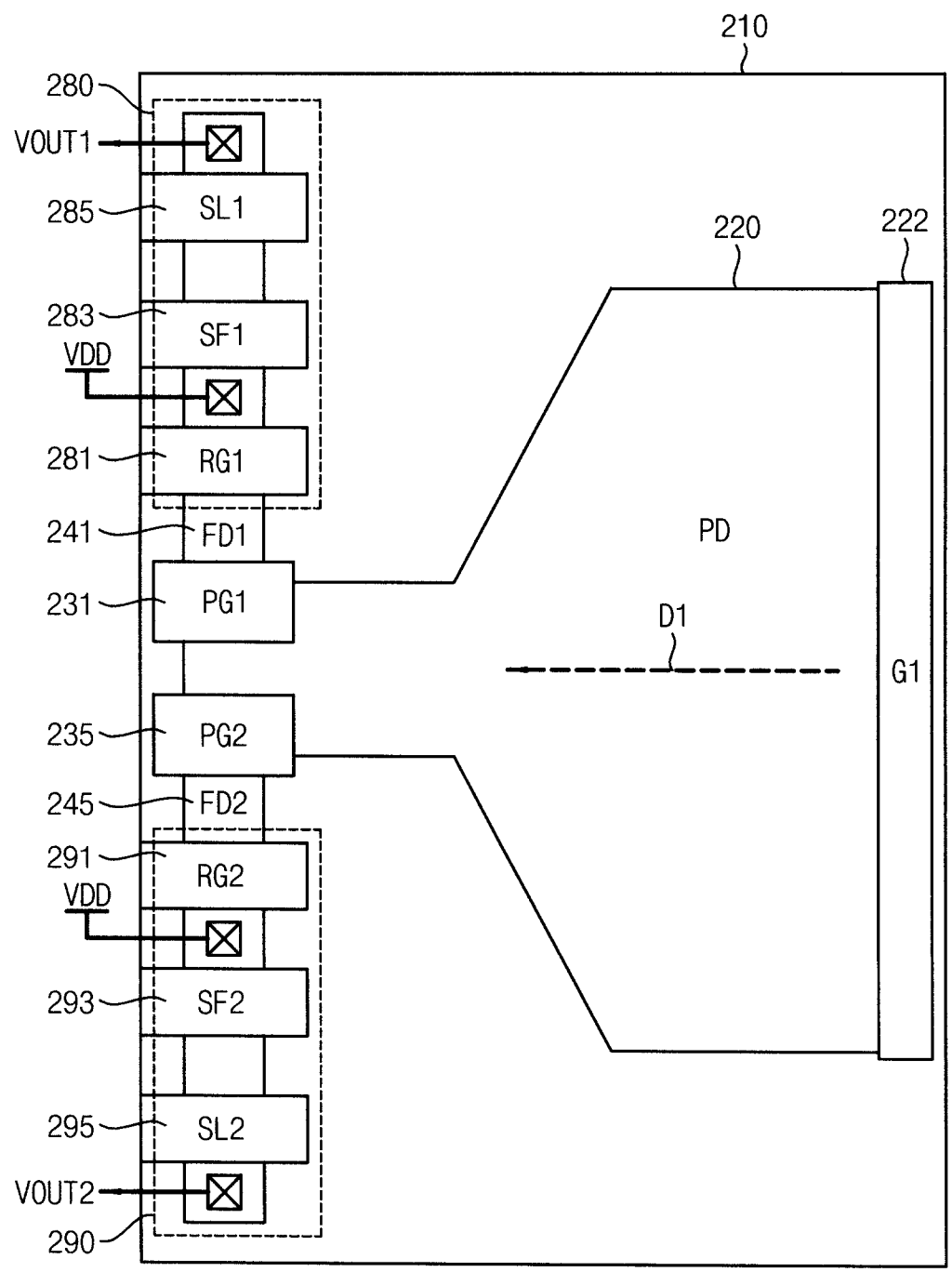

Referring to FIG. 27, a depth pixel 200d included in a 3D image sensor includes a photo detection region 220, a first photo gate 231 and a first floating diffusion region 241. The depth pixel 200d may further include a first gate 222, a second photo gate 235, a second floating diffusion region 245, a first output unit 280 and a second output unit 290.

In comparison with the depth pixel 200c of FIG. 26, the depth pixel 200d of FIG. 27 may further include the first gate 222. The internal electric field may be induced in the photo detection region 220 based on the first voltage V1 applied to the first gate 222. The first voltage V1 may be the negative voltage or the positive voltage depending on a type of photo charges that are collected in the photo detection region 220. The first gate 222 included in the depth pixel 200d of FIG. 27 may be substantially the same as the first gate 222 included in the depth pixel 200b of FIGS. 23 and 24.

The depth pixel 200c of FIG. 26 and the depth pixel 200d of FIG. 27 may operate based on the timing diagram of FIG. 10.

Figure 28:
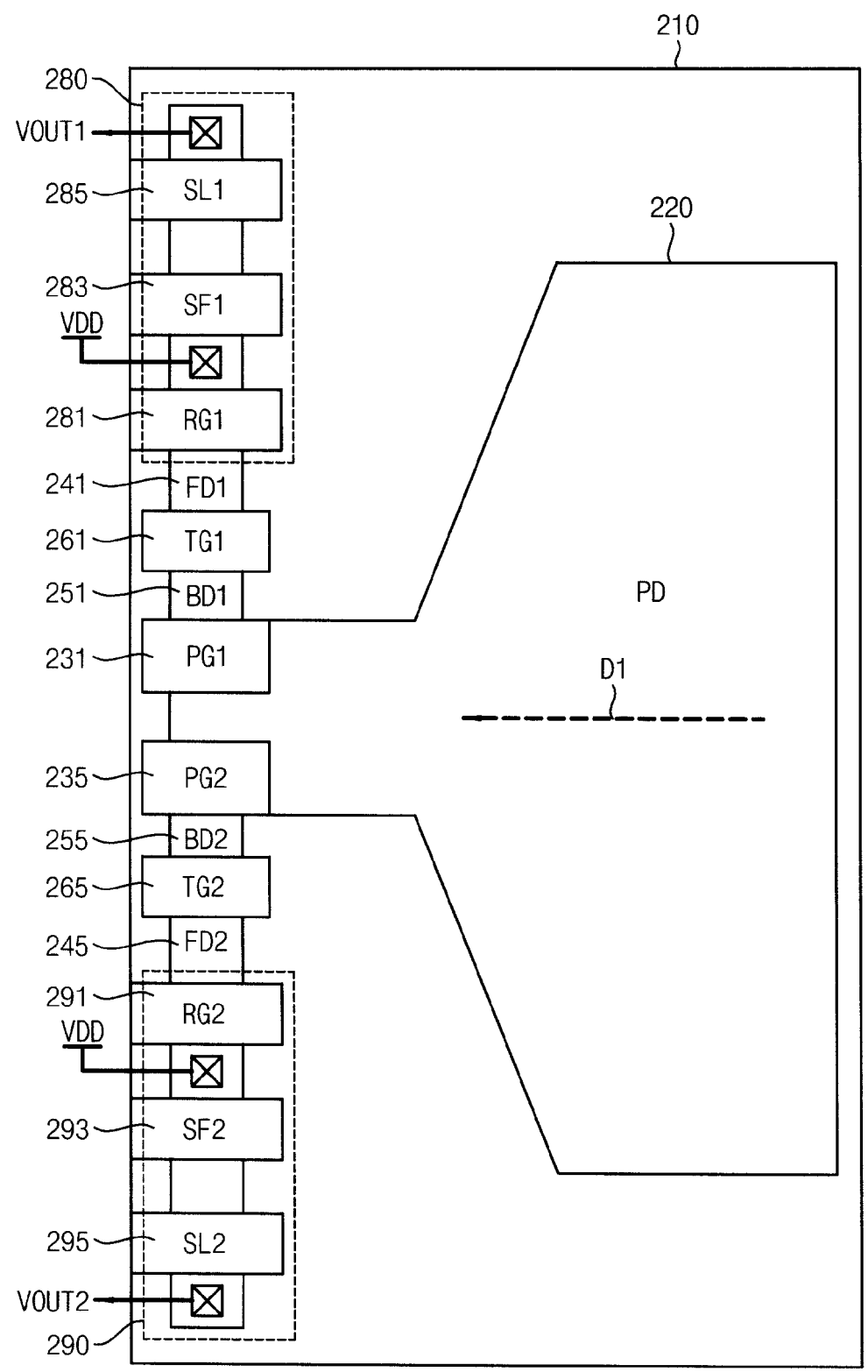

Referring to FIG. 28, a depth pixel 200e included in a 3D image sensor includes a photo detection region 220, a first photo gate 231 and a first floating diffusion region 241. The depth pixel 200e may further include a first bridge diffusion region 251, a first transfer gate 261 and a first output unit 280. In addition, the depth pixel 200e may further include a second photo gate 235, a second bridge diffusion region 255, a second transfer gate 265, a second floating diffusion region 245 and a second output unit 290.

In comparison with the depth pixel 200c of FIG. 26, the depth pixel 200e of FIG. 28 may further include the first and second bridge diffusion regions 251 and 255 as temporary storage regions and may further include the first and second transfer gates 261 and 265.

The first and second bridge diffusion regions 251 and 255 and the first and second transfer gates 261 and 265 may be substantially the same as the first and third bridge diffusion regions 151 and 155 and the first and third transfer gates 161 and 165 in FIG. 12, respectively. For example, the first and second bridge diffusion regions 251 and 255 may be formed in the semiconductor substrate 210 and may be adjacent to the photo detection region 220, respectively. The first bridge diffusion region 251 may store the first photo charges when the first photo gate 231 is turned on. The second bridge diffusion region 255 may store the second photo charges when the second photo gate 235 is turned on. The first and second transfer gates 261 and 265 may be turned on in response to first and second transfer control signals TGC1 and TGC2, respectively. The first and second bridge diffusion regions 251 and 255 may be electrically connected to the first and second floating diffusion regions 241 and 245, respectively, when the first and second transfer gates 261 and 265 are turned on, and thus the first and second photo charges may be transferred from the first and second bridge diffusion regions 251 and 255 to the first and second floating diffusion regions 241 and 245, respectively.

In an example embodiment, the doping density in the photo detection region 220 may gradually decrease as the first distance from the first photo gate 231 or the second distance from the second photo gate 235 increases.

Figure 29:
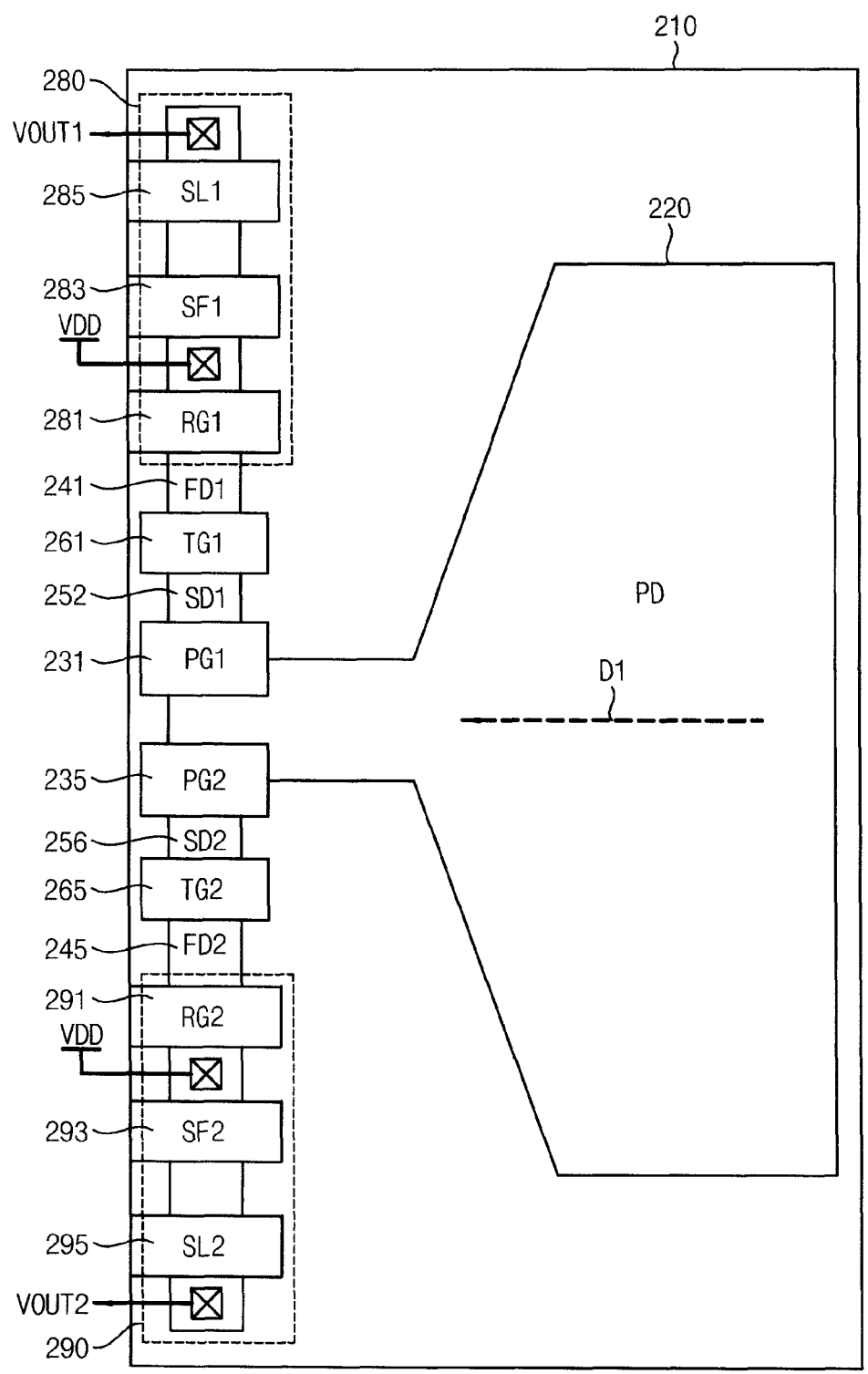

Referring to FIG. 29, a depth pixel 200f included in a 3D image sensor includes a photo detection region 220, a first photo gate 231 and a first floating diffusion region 241. The depth pixel 200f may further include a first storage region 252, a first transfer gate 261 and a first output unit 280. In addition, the depth pixel 200f may further include a second photo gate 235, a second storage region 256, a second transfer gate 265, a second floating diffusion region 245 and a second output unit 190.

In comparison with the depth pixel 200c of FIG. 26, the depth pixel 200f of FIG. 29 may further include the first and second storage regions 252 and 256 as the temporary storage regions and may further include the first and second transfer gates 261 and 265.

The first and second storage regions 252 and 256 and the first and second transfer gates 261 and 265 may be substantially the same as the first and third storage regions 152 and 156 and the first and third transfer gates 161 and 165 in FIG. 15, respectively. For example, the first and second storage regions 252 and 256 may be formed in the semiconductor substrate 210 and may be spaced apart from the photo detection region 220, respectively. The first storage region 252 may store the first photo charges when the first photo gate 231 is turned on. The second storage region 256 may store the second photo charges when the second photo gate 235 is turned on. The first and second storage regions 252 and 256 may be electrically connected to the first and second floating diffusion regions 241 and 245, respectively, in response to the first and second transfer control signals TGC1 and TGC2 applied to the first and second transfer gates 261 and 263, and thus the first and second photo charges may be transferred from the first and second storage regions 252 and 256 to the first and second floating diffusion regions 241 and 245, respectively.

In an example embodiment, the doping density in the photo detection region 220 may gradually decrease as the first distance from the first photo gate 231 or the second distance from the second photo gate 235 increases.

The depth pixel 200e of FIG. 28 and the depth pixel 200f of FIG. 29 may operate based on the timing diagram of FIG. 14.

Figure 30:
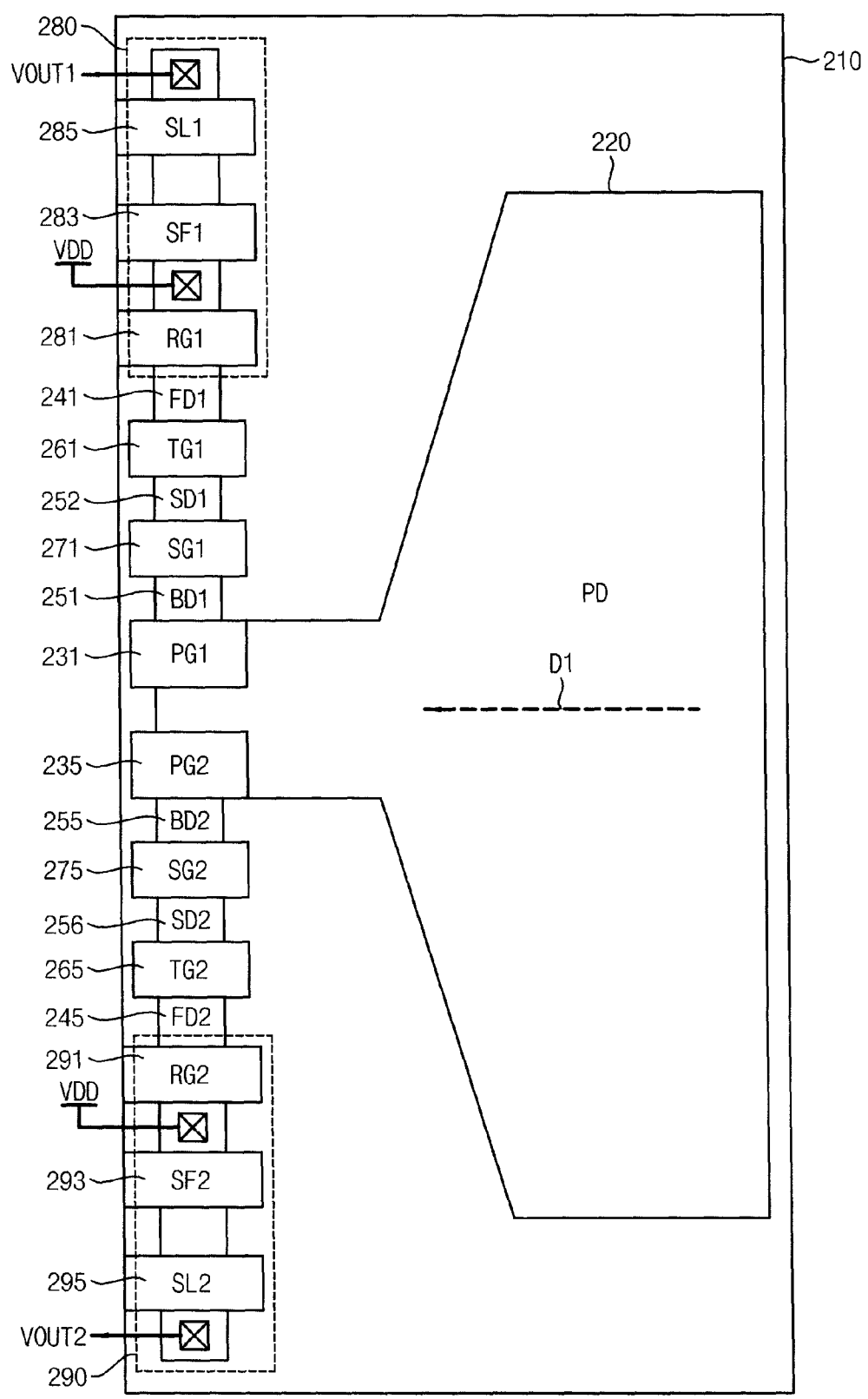

Referring to FIG. 30, a depth pixel 200g included in a 3D image sensor includes a photo detection region 220, a first photo gate 231 and a first floating diffusion region 241. The depth pixel 200g may further include a first bridge diffusion region 251, a first storage gate 271, a first storage region 252, a first transfer gate 261 and a first output unit 280. In addition, the depth pixel 200g may further include a second photo gate 235, a second bridge diffusion region 255, a second storage gate 275, a second storage region 256, a second transfer gate 265, a second floating diffusion region 245 and a second output unit 290.

In comparison with the depth pixel 200c of FIG. 26, the depth pixel 200g of FIG. 30 may further include the first and second bridge diffusion regions 251 and 255 and the first and second storage regions 252 and 256 as the temporary storage regions, and may further include the first and second transfer gates 261 and 265 and the first and second storage gates 271 and 275.

The first and second bridge diffusion regions 251 and 255, the first and second storage gates 271 and 275, the first and second storage regions 252 and 256 and the first and second transfer gates 261 and 265 may be substantially the same as the first and third bridge diffusion regions 151 and 155, the first and third storage gates 171 and 175, the first and third storage regions 152 and 156 and the first and third transfer gates 161 and 165 in FIG. 17, respectively. For example, the first and second bridge diffusion regions 251 and 255 may be formed adjacent to the photo detection region 120, respectively. The first and second photo charges may be stored in the first and second bridge diffusion regions 251 and 255, respectively, when the first and second photo gates 231 and 235 are turned on. The first and second storage regions 252 and 256 may be formed spaced apart from the first and second bridge diffusion regions 251 and 255, respectively. The first and second bridge diffusion regions 251 and 255 may be electrically connected to the first and second storage regions 252 and 256, respectively, in response to first and second storage control signals SGC1 and SGC2 applied to the first and second storage gates 271 and 275, and thus the first and second photo charges may be transferred from the first and second bridge diffusion regions 251 and 255 to the first and second storage regions 252 and 256, respectively. The first and second storage regions 252 and 256 may be electrically connected to the first and second floating diffusion regions 241 and 245, respectively, in response to the first and second transfer control signals TGC1 and TGC2 applied to the first and second transfer gates 261 and 265, and thus the first and second photo charges may be transferred from the first and second storage regions 252 and 256 to the first and second floating diffusion regions 241 and 245, respectively.

In an example embodiment, the doping density in the photo detection region 220 may gradually decrease as the first distance from the first photo gate 231 or the second distance from the second photo gate 235 increases.

The depth pixel 200g of FIG. 30 may operate based on the timing diagram of FIG. 19.

The depth pixel 200e of FIG. 28, the depth pixel 200f of FIG. 29 and the depth pixel 200g of FIG. 30 may further include the first gate. According to at some example embodiments, the depth pixel 200e of FIG. 28, the depth pixel 200f of FIG. 29 and the depth pixel 200g of FIG. 30 may be implemented with only one of two half pixels.

Figure 32:
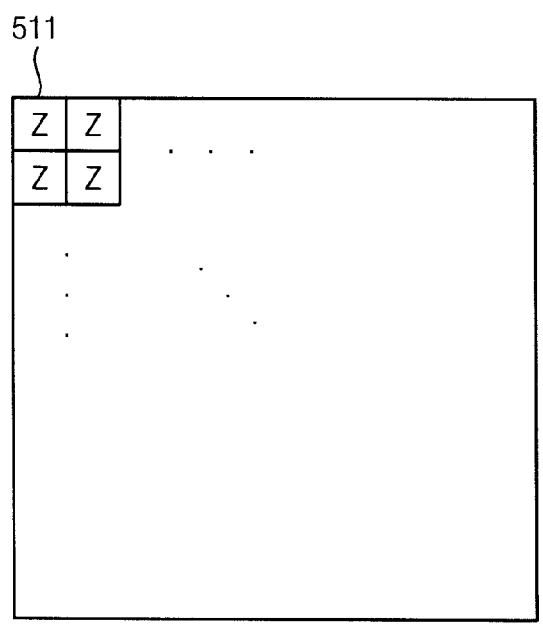
FIG. 32 is a diagram illustrating an example of a pixel array included in the 3D image sensor of FIG. 31.

FIG. 31 is a block diagram illustrating a 3D image sensor according to at least one example embodiment. FIG. 32 is a diagram illustrating an example of a pixel array included in the 3D image sensor of FIG. 31.

Referring to FIGS. 31 and 32, a 3D image sensor 500 includes a pixel array 510, a row driving unit 520, an analog-to-digital conversion (ADC) unit 530, a light source module 540, a digital signal processing (DSP) unit 550 and a control unit 560.

The light source module 540 emits a transmission light TX having a wavelength. An object 580 is illuminated with the transmission light TX. For example, the light source module 540 may emit infrared light or near-infrared light. The light source module 540 may include a light source 541 and a lens 543, and may further include a filter (not illustrated). The light source 541 may be controlled by the control unit 560 to output the transmission light TX such that the intensity of the transmission light TX periodically changes. For example, the intensity of the transmission light TX may be modulated to have a waveform of a pulse wave, a sine wave, a cosine wave, or the like. The light source 541 may be implemented by a light emitting diode (LED), a laser diode, or the like. The transmission light TX generated by the light source 541 may be focused on the object 580 by the lens 543 and may be filtered by the filter.

The pixel array 510 includes a plurality of depth pixels 511. The pixel array 510 generates depth information from the 3D image sensor 500 to the object 580 based on a reception light RX reflected by the object 580. In other words, the plurality of depth pixels 511 may receive the reception light RX, may convert the reception light RX into electrical signals, and may provide information about a distance (or a depth) of the object 580 from the 3D image sensor 500 (e.g., the depth information), respectively. The reception light RX may be reflected from the object 580 after being emitted to the object 580 by the light source module 540. In an example embodiment, the 3D image sensor 500 may further include an infrared filter or a near-infrared filter that is formed over the plurality of depth pixels 511 when infrared light or near-infrared light included in the reception light RX is used in the 3D image sensor 500.

Each of the plurality of depth pixels 511 may be one of the depth pixel 100a of FIG. 1, the depth pixel 100b of FIG. 5, the depth pixel 100c of FIG. 8, the depth pixel 100d of FIG. 11, the depth pixel 100e of FIG. 12, the depth pixel 100f of FIG. 15, the depth pixel 100g of FIG. 17, the depth pixel 200a of FIG. 20, the depth pixel 200b of FIG. 23, the depth pixel 200c of FIG. 26, the depth pixel 200d of FIG. 27, the depth pixel 200e of FIG. 28, the depth pixel 200f of FIG. 29 and the depth pixel 200g of FIG. 30. For example, each of the plurality of depth pixels 511 may include a photo detection region and at least one photo gate. An internal electric field may be formed in the photo detection region by adjusting doping density in the photo detection region and/or additionally forming a first gate over the photo detection region. Photo charges that are collected based on the reception light RX may be bidirectionally or unidirectionally drifted based on the internal electric field, and thus each depth pixel may effectively store and transfer the collected photo charges even if the size of the at least one photo gate decreases. Accordingly, each depth pixel may have relatively low power consumption, a demodulation contrast of each depth pixel may be maintained even if each depth has relatively high modulation frequency, dark currents and noises in each depth pixel may be reduced, and the 3D image sensor 500 including the plurality of depth pixels 511 may have relatively improved performance.

The row driving unit 520 may be connected with each row of the pixel array 510. The row driving unit 520 may generate driving signals to drive each row. For example, the row driving unit 520 may drive the plurality of depth pixels 511 included in the pixel array 510 row by row.

The ADC unit 530 may be connected with each column of the pixel array 510. The ADC unit 530 may convert analog signals output from the pixel array 510 into digital signals. In some example embodiments, the ADC unit 530 may perform a column analog-to-digital conversion that converts analog signals in parallel using a plurality of analog-to-digital converters respectively coupled to a plurality of column lines. In other example embodiments, the ADC unit 530 may perform a single analog-to-digital conversion that sequentially converts the analog signals using a single analog-to-digital converter.

According to at least one example embodiment, the ADC unit 530 may further include a correlated double sampling (CDS) unit for extracting an effective signal component. In some example embodiments, the CDS unit may perform an analog double sampling that extracts the effective signal component based on a difference between an analog reset signal including a reset component and an analog data signal including a signal component. In other example embodiments, the CDS unit may perform a digital double sampling that converts the analog reset signal and the analog data signal into two digital signals and extracts the effective signal component based on a difference between the two digital signals. In still other example embodiments, the CDS unit may perform a dual correlated double sampling that performs both the analog double sampling and the digital double sampling.

The DSP unit 550 may receive the digital signals output from the ADC unit 530, and performs image data processing on the digital signals. For example, the DSP unit 550 may perform image interpolation, color correction, white balance, gamma correction, color conversion, etc.

The control unit 560 may control the row driving unit 520, the ADC unit 530, the light source module 540 and the DSP unit 550 by providing control signals, such as a clock signal, a timing control signal, or the like. According to some example embodiments, the control unit 560 may include a control logic circuit, a phase locked loop circuit, a timing control circuit, a communication interface circuit, or the like.

Figure 33A:
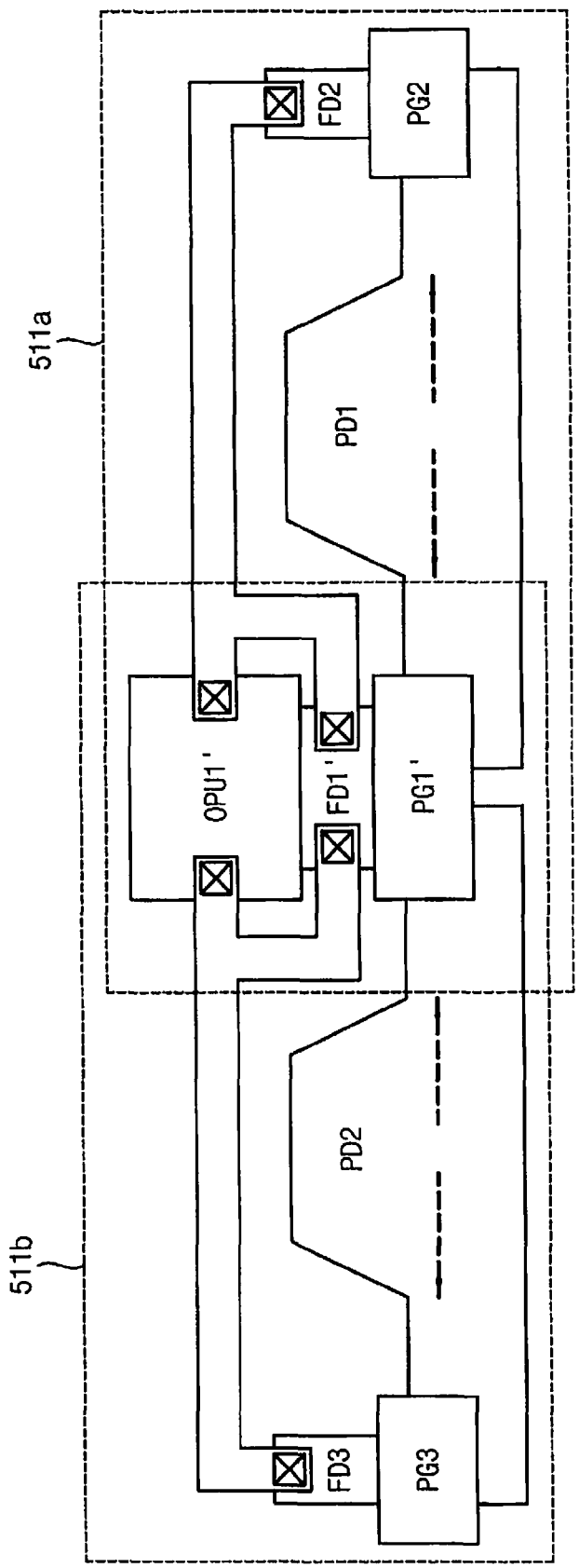
FIGS. 33A and 33B are diagrams illustrating examples of depth pixels included in the pixel array of FIG. 32.
Figure 33B:
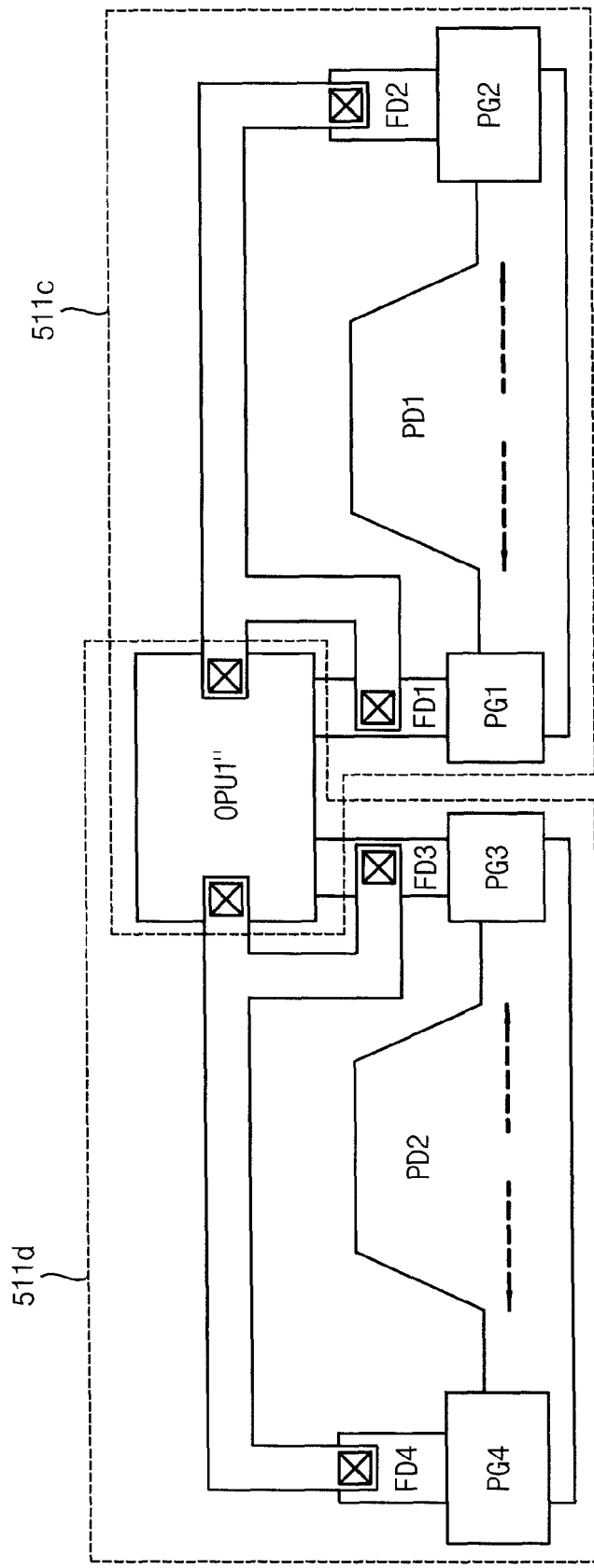

FIGS. 33A and 33B are diagrams illustrating examples of depth pixels included in the pixel array of FIG. 32.

Referring to FIGS. 32, 33A and 33B, some elements may be shared by at least two depth pixels that are included in the pixel array 510 and are adjacent to each other.

In an example embodiment, as illustrated in FIG. 33A, a first depth pixel 511a may include a first photo detection region PD1, a first photo gate PG1', a first floating diffusion region FD1', a second photo gate PG2, a second floating diffusion region FD2 and a first output unit OPU1'. A second depth pixel 511b may include a second photo detection region PD2, the first photo gate PG1', the first floating diffusion region FD1', a third photo gate PG3, a third floating diffusion region FD3 and the first output unit OPU1'. In other words, the first photo gate PG1', the first floating diffusion region FD1' and the first output unit OPU1' may be shared by the first depth pixel 511a and the second depth pixel 511b that is adjacent to the first depth pixel 511a.

In another example embodiment, as illustrated in FIG. 33B, a third depth pixel 511c may include a first photo detection region PD1, a first photo gate PG1, a first floating diffusion region FD1, a second photo gate PG2, a second floating diffusion region FD2 and a first output unit OPU1". A fourth depth pixel 511d may include a second photo detection region PD2, the third photo gate PG3, the third floating diffusion region FD3, a fourth photo gate PG4, a fourth floating diffusion region FD4 and the first output unit OPU1". In other words, the first output unit OPU1" may be shared by the third depth pixel 511c and the fourth depth pixel 511d that is adjacent to the third depth pixel 511c.

Although FIGS. 33A and 33B illustrate that the depth pixels 511a, 511b, 511c and 511d correspond to the embodiment of FIG. 1, depth pixels that are included in the pixel array and sharing some elements may be one of the embodiments of FIGS. 5, 8, 11, 12, 15, 17, 20, 23, 26, 27, 28, 29 and 30.

Figure 35A:
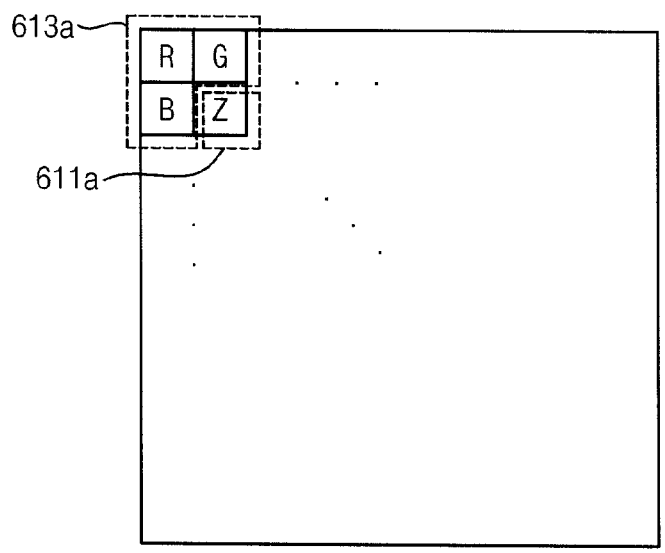
FIGS. 35A and 35B are diagrams illustrating examples of a pixel array included in the 3D image sensor of FIG. 34.
Figure 35B:
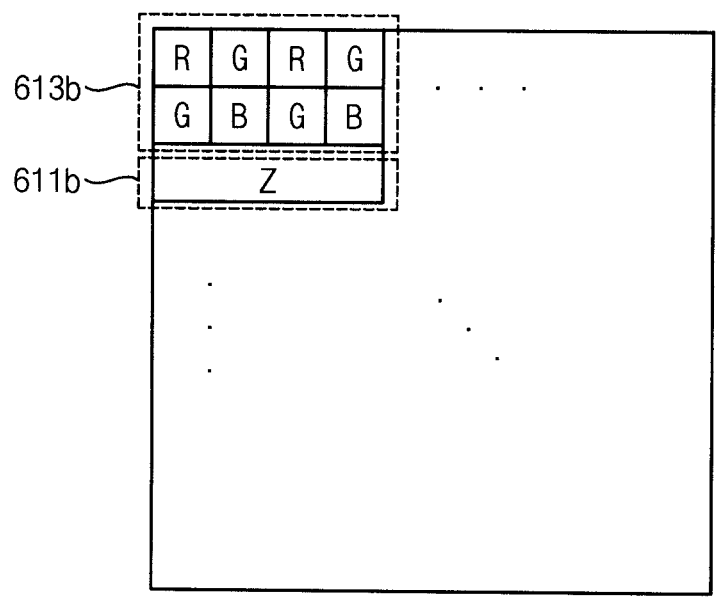

FIG. 34 is a block diagram illustrating a 3D image sensor according to at least one example embodiment. FIGS. 35A and 35B are diagrams illustrating examples of a pixel array included in the 3D image sensor of FIG. 34.

Referring to FIGS. 34, 35A and 35B, a 3D image sensor 600 includes a pixel array 610, a first row driving unit 620a, a second row driving unit 620b, a first analog-to-digital conversion (ADC) unit 630a, a second ADC unit 630b, a light source module 640, a digital signal processing (DSP) unit 650 and a control unit 660.

The light source module 640 emits a transmission light TX having a wavelength. An object 680 is illuminated with the transmission light TX. The light source module 640 may include a light source 641 and a lens 643. The light source module 640 may be substantially the same as the light source module 540 in FIG. 31.

The pixel array 610 generates depth information from the 3D image sensor 600 to the object 680 based on a reception light RX reflected by the object 680. The pixel array 610 may include a plurality of depth pixels and a plurality of color pixels. According to at least one example embodiment, a ratio of the number of the depth pixels to the number of the color pixels and/or a ratio of a size of the depth pixels to a size of the color pixels may vary as desired. For example, as illustrated in FIG. 35A, a pixel array 610a may include depth pixels 611a and color pixels 613a. For another example, as illustrated in FIG. 35B, a pixel array 610b may include depth pixels 611b and color pixels 613b. An infrared filter and/or a near-infrared filter may be formed on the depth pixels, and a color filter (e.g., red, green and blue filters) may be formed on the color pixels.

The first row driving unit 620a may be connected with each row of the color pixels and may generate first driving signals to drive each row of the color pixels. The second row driving unit 620b may be connected with each row of the depth pixels and may generate second driving signals to drive each row of the depth pixels. The first ADC unit 630a may be connected with each column of the color pixels and may convert first analog signals output from the color pixels into first digital signals. The second ADC unit 630b may be connected with each column of the depth pixels and may convert second analog signals output from the depth pixels into second digital signals. The DSP unit 650 may receive the first and second digital signals output from the first and second ADC units 630a and 630b, and performs image data processing on the first and second digital signals. The control unit 660 may control the first and second row driving units 620a and 620b, the first and second ADC units 630a and 630b, the light source module 640 and the DSP unit 650.

Figure 36:
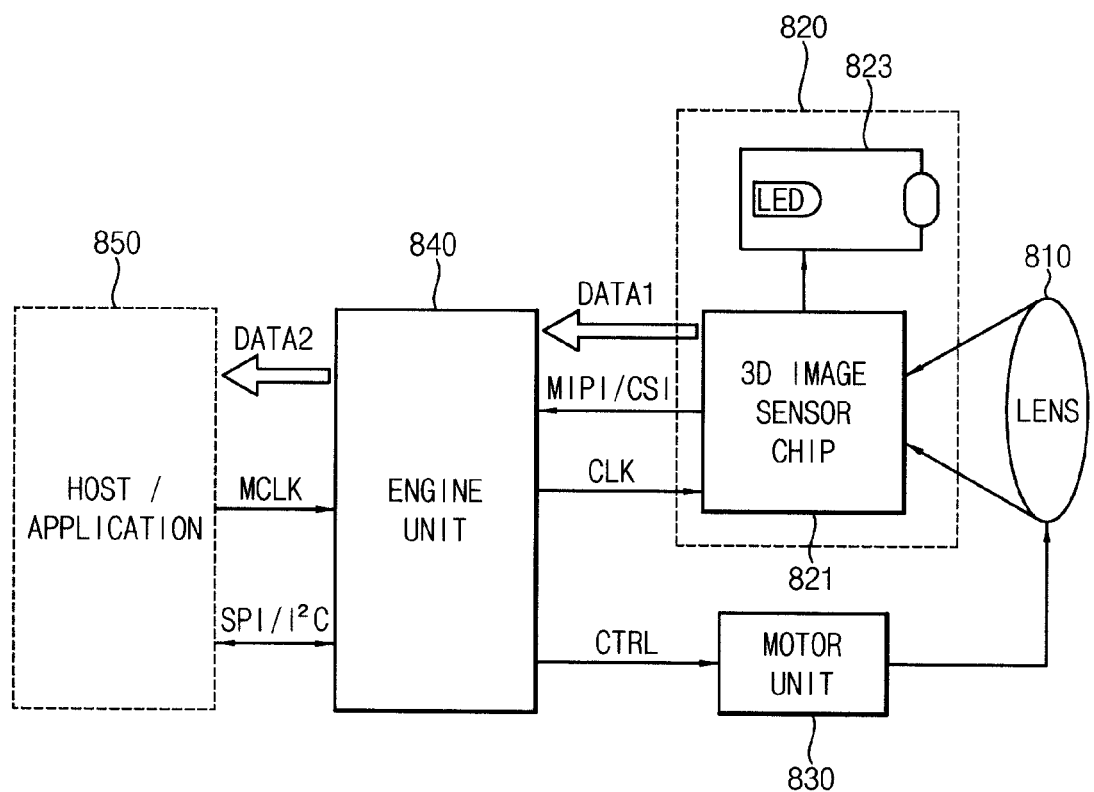
FIG. 36 is a block diagram illustrating a camera including a 3D image sensor according to an example embodiment.

FIG. 36 is a block diagram illustrating a camera including a 3D image sensor according to at least one example embodiment.

Referring to FIG. 36, a camera 800 includes a photo-receiving lens 810, a 3D image sensor 820, a motor unit 830 and an engine unit 840. The 3D image sensor 820 may be one of the 3D image sensor 500 of FIG. 31 and the 3D image sensor 600 of FIG. 34 and may include an image sensor chip 821 and a light source module 823. In some example embodiments, the image sensor chip 821 and the light source module 823 may be implemented with separated devices, or at least a portion of the light source module 823 may be included in the image sensor chip 821. In some example embodiments, the photo-receiving lens 810 may be included in the image sensor chip 821.

The photo-receiving lens 810 may focus incident light on a photo-receiving region (e.g., depth pixels and/or color pixels included in a pixel array) of the image sensor chip 821. The image sensor chip 821 may generate data DATA1 including depth information and/or color image information based on the incident light passing through the photo-receiving lens 810. For example, the data DATA1 generated by the image sensor chip 821 may include depth data generated using infrared light or near-infrared light emitted from the light source module 823 and RGB data of a Bayer pattern generated using external visible light.

The image sensor chip 821 may include the depth pixels and/or the color pixels to generate the depth information and/or the color image information. Each depth pixel may include a photo detection region and at least one photo gate, and an internal electric field may be formed in the photo detection region. Photo charges that are collected based on the reception light RX may be bidirectionally or unidirectionally drifted based on the internal electric field, and thus each depth pixel may effectively store and transfer the collected photo charges even if the size of the at least one photo gate decreases. Accordingly, each depth pixel may have relatively low power consumption, a demodulation contrast of each depth pixel may be maintained even if each depth has relatively high modulation frequency, dark currents and noises in each depth pixel may be reduced, and the image sensor chip 821 including the depth pixels may have relatively improved performance.

The image sensor chip 821 may provide the data DATA1 to the engine unit 840 based on a clock signal CLK. In some embodiments, the image sensor chip 821 may interface with the engine unit 840 via mobile industry processor interface MIPI and/or camera serial interface CSI.

The motor unit 830 may control the focusing of the photo-receiving lens 810 or may perform shuttering in response to a control signal CTRL received from the engine unit 840. In some example embodiments, a relative position of a light source and a lens included in the light source module 823 may be controlled by the motor unit 830 or the image sensor 821.

The engine unit 840 may control the 3D image sensor 820 and the motor unit 830. The engine unit 840 may process the data DATA1 received from the image sensor chip 821. For example, the engine unit 840 may generate three-dimensional color data based on the data DATA1 received from the image sensor chip 821. For another example, the engine unit 840 may generate YUV data including a luminance component, a blue-luminance difference component, and a red-luminance difference component based on the RGB data included in the data DATA1, or compressed data, such as joint photography experts group (JPEG) data. The engine unit 840 may be connected to a host/application 850 and may provide data DATA2 to the host/application 850 based on a master clock MCLK. Further, the engine unit 840 may interface with the host/application 850 via serial peripheral interface (SPI) and/or inter integrated circuit (I²C).

Figure 37:
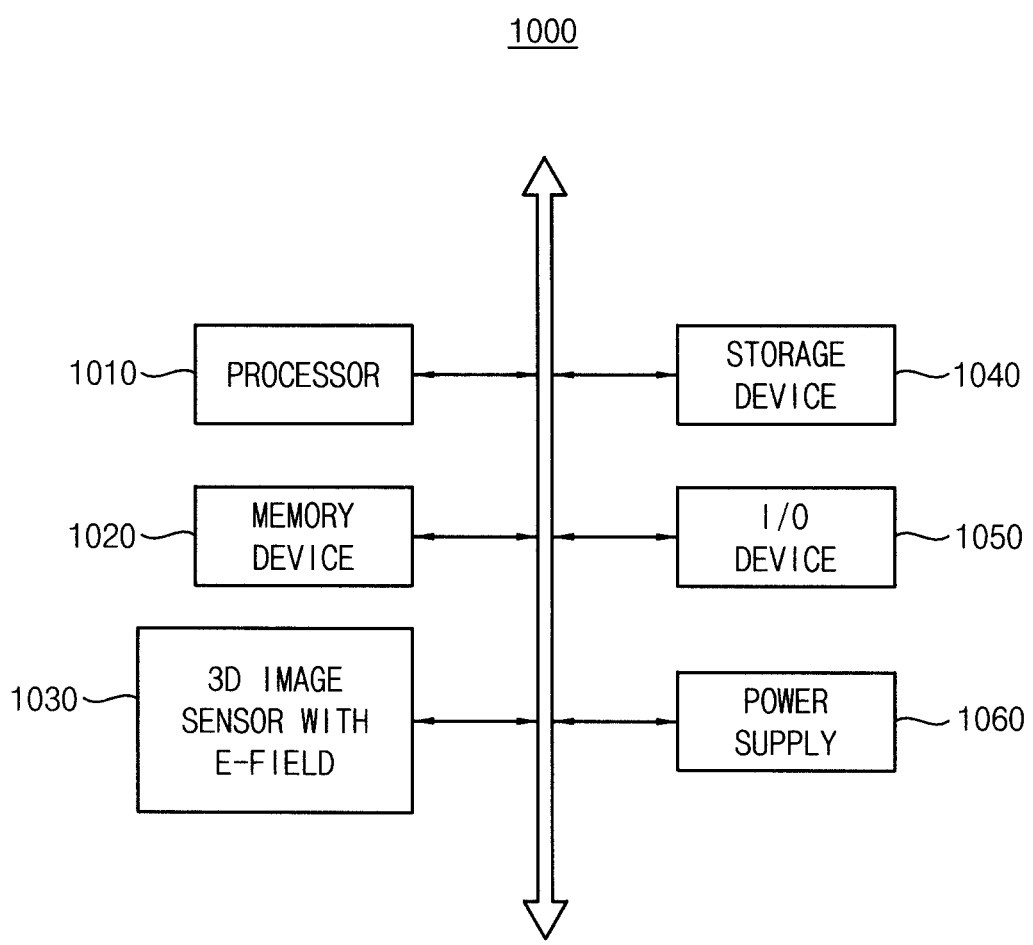
FIG. 37 is a block diagram illustrating a computing system including a 3D image sensor according to an example embodiment.

FIG. 37 is a block diagram illustrating a computing system including a 3D image sensor according to at least one example embodiment.

Referring to FIG. 37, a computing system 1000 may include a processor 1010, a memory device 1020, a 3D image sensor 1030, a storage device 1040, an input/output device 1050 and a power supply 1060. Although not illustrated in FIG. 37, the computing system 1000 may further include ports that communicate with a video card, a sound card, a memory card, a USB device, or other electronic devices.

The processor 1010 may perform various calculations or tasks. According to at least one example embodiment, the processor 1010 may be a microprocessor or a CPU. The processor 1010 may communicate with the memory device 1020, the storage device 1040 and the input/output device 1050 via an address bus, a control bus, and/or a data bus. In some embodiments, the processor 1010 may be coupled to an extended bus, such as a peripheral component interconnection (PCI) bus.

The memory device 1020 may store data for operating the computing system 1000. For example, the memory device 1020 may be implemented with at least one volatile memory device, e.g., a dynamic random access memory (DRAM) device, a static random access memory (SRAM) device, etc., and/or at least one nonvolatile memory device, e.g., an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc.

The storage device 1040 may include a solid state drive (SSD), a hard disk drive (HDD), a CD-ROM, etc. The input/output device 1050 may include an input device (e.g., a keyboard, a keypad, a mouse, etc.) and an output device (e.g., a printer, a display device, etc.). The power supply 1060 may supply operation voltages for the computing system 1000.

The 3D image sensor 1030 may communicate with the processor 1010 via the bus or other communication links. The 3D image sensor 1030 may include the depth pixels and/or the color pixels to generate the depth information and/or the color image information. Each depth pixel may include a photo detection region and at least one photo gate, and an internal electric field may be formed in the photo detection region. Photo charges that are collected based on the reception light RX may be bidirectionally or unidirectionally drifted based on the internal electric field, and thus each depth pixel may effectively store and transfer the collected photo charges even if the size of the at least one photo gate decreases. Accordingly, each depth pixel may have relatively low power consumption, a demodulation contrast of each depth pixel may be maintained even if each depth has relatively high modulation frequency, dark currents and noises in each depth pixel may be reduced, and the 3D image sensor 1030 including the depth pixels may have relatively improved performance.

The 3D image sensor 1030 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The computing system 1000 may be any computing system using a 3D image sensor. For example, the computing system 1000 may include a digital camera, a mobile phone, a smart phone, a portable multimedia player (PMP), a personal digital assistant (PDA), a personal computer, a server computer, a workstation, a laptop computer, a tablet computer, a digital television, a set-top box, a music player, a portable game console, a navigation system, etc.

FIG. 38 is a block diagram illustrating an example of an interface employable in the computing system of FIG. 37.

Referring to FIG. 37, a computing system 1100 may be implemented by a data processing device that uses or supports a mobile industry processor interface (MIPI) interface. The computing system 1100 may include an application processor 1110, a 3D image sensor 1140, a display device 1150, etc.

A CSI host 1112 of the application processor 1110 may perform a serial communication with a CSI device 1141 of the three-dimensional image sensor 1140 via a camera serial interface (CSI). In some example embodiments, the CSI host 1112 may include a deserializer (DES), and the CSI device 1141 may include a serializer (SER). A DSI host 1111 of the application processor 1110 may perform a serial communication with a DSI device 1151 of the display device 1150 via a display serial interface (DSI). In some example embodiments, the DSI host 1111 may include a serializer (SER), and the DSI device 1151 may include a deserializer (DES).

The computing system 1100 may further include a radio frequency (RF) chip 1160 performing a communication with the application processor 1110. A physical layer (PHY) 1113 of the computing system 1100 and a physical layer (PHY) 1161 of the RF chip 1160 may perform data communications based on a MIPI DigRF. The application processor 1110 may further include a DigRF MASTER 1114 that controls the data communications of the PHY 1161.

The computing system 1100 may further include a global positioning system (GPS) 1120, a storage 1170, a MIC 1180, a DRAM device 1185, and a speaker 1190. In addition, the computing system 1100 may perform communications using an ultra wideband (UWB) 1120, a wireless local area network (WLAN) 1220, a worldwide interoperability for microwave access (WIMAX) 1130, etc. However, the structure and the interface of the electric device 1000 are not limited thereto.

The above described example embodiments may be applied to a 3D image sensor, and an electronic system having the 3D image sensor. For example, the electronic system may be a system using the 3D image sensor, e.g., a computer, a digital camera, a 3D camera, a cellular phone, a personal digital assistant (PDA), a scanner, a navigation system, a video phone, a surveillance system, an auto-focusing system, a tracking system, a motion-sensing system and/or an image-stabilization system.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of inventive concepts. Accordingly, all such modifications are intended to be included within the scope of inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A depth pixel included in a three-dimensional (3D) image sensor, comprising:
    a photo detection region configured to collect photo charges based on light reflected by an object, and configured to direct the collected photo charges in a first direction and a second direction different from the first direction based on an internal electric field in the photo detection region;
    a first photo gate over the photo detection region, the first photo gate configured to be activated in response to a first photo control signal;
    a first floating diffusion region configured to accumulate first photo charges of the collected photo charges if the first photo gate is activated where the first photo charges are drifted in the first direction;
    a second photo gate over the photo detection region and spaced apart from the first photo gate, the second photo gate configured to be activated in response to the first photo control signal; and
    a second floating diffusion region configured to accumulate second photo charges of the collected photo charges if the second photo gate is activated where the second photo charges are drifted in the second direction.

2. The depth pixel of claim 1, further comprising:
    a semiconductor substrate, wherein the photo detection region has a conductive type different from that of the semiconductor substrate, and a doping density in the photo detection region gradually decreases as a first distance from the first photo gate or a second distance from the second photo gate increases.

3. The depth pixel of claim 2, wherein the first photo gate and the second photo gate are over an edge area of the photo detection region, and a doping density of the edge area of the photo detection region is higher than a doping density of a central area of the photo detection region.

4. The depth pixel of claim 3, wherein the first direction is from the central area of the photo detection region to the first photo gate, and the second direction is from the central area of the photo detection region to the second photo gate.

5. The depth pixel of claim 1, further comprising:
a first gate over the photo detection region and between the first photo gate and the second photo gate, the first gate configured to control the internal electric field based on a first voltage.

6. The depth pixel of claim 5, wherein the first photo gate and the second photo gate are over respective edge areas of the photo detection region and the first gate is over a central area of the photo detection region.

7. The depth pixel of claim 6, wherein the first direction is from the first gate to the first photo gate, and the second direction is from the first gate to the second photo gate.

8. The depth pixel of claim 5, wherein the first voltage is a negative voltage if the photo detection region collects electrons of electron-hole pairs and the first voltage is a positive voltage if the photo detection region collects holes of the electron-hole pairs.

9. The depth pixel of claim 1, wherein a size of the first photo gate and a size of the second photo gate are smaller than a size of the photo detection region.

10. The depth pixel of claim 1, further comprising:
a first output unit configured to generate a first output voltage corresponding to a sum of the first photo charges and the second photo charges.

11. The depth pixel of claim 10, wherein the first output unit includes:
a first reset transistor configured to reset the first floating diffusion region and the second floating diffusion region in response to a first reset signal;
a first drive transistor configured to amplify a voltage of the first floating diffusion region and a voltage of the second floating diffusion region; and
a first select transistor configured to output the voltages amplified by the first drive transistor as the first output voltage.

12. The depth pixel of claim 1, further comprising:
a third photo gate over the photo detection region, the third photo gate configured to be activated in response to a second photo control signal;
a third floating diffusion region configured to accumulate third photo charges of the collected photo charges if the third photo gate is activated where the third photo charges are drifted in the first direction;
a fourth photo gate over the photo detection region and spaced apart from the third photo gate, the fourth photo gate configured to be activated in response to the second photo control signal; and
a fourth floating diffusion region configured to accumulate fourth photo charges of the collected photo charges if the fourth photo gate is activated where the fourth photo charges are drifted in the second direction.

13. The depth pixel of claim 1, further comprising:
a first temporary storage region configured to store the first photo charges if the first photo gate is activated;
a second temporary storage region configured to store the second photo charges if the second photo gate is activated; and
first and second transfer gates configured to be activated in response to a first transfer control signal,
wherein the first and second transfer gates are configured to transfer the first and second photo charges to the first and second floating diffusion regions, respectively, if the first and second transfer gates are activated.

14. The depth pixel of claim 13, wherein the first and second temporary storage regions are adjacent to the photo detection region or spaced apart from the photo detection region.

15. The depth pixel of claim 1, further comprising:
first and second bridge diffusion regions adjacent to the photo detection region, the first and second bridge diffusion regions configured to store the first and second photo charges, respectively, if the first and second photo gates are activated;
first and second storage regions spaced apart from the first and second bridge diffusion regions, respectively;
first and second storage gates configured to be activated in response to a first storage control signal; and
first and second transfer gates configured to be activated in response to a first transfer control signal,
wherein the first and second storage gates are configured to transfer the first and second photo charges stored in the first and second bridge diffusion regions to the first and second storage regions, respectively, if the first and second storage gates are activated, and
the first and second transfer gates are configured to transfer the first and second photo charges stored in the first and second storage regions to the first and second floating diffusion regions, respectively, if the first and second transfer gates are activated.

16. An image sensor comprising:
a photo detection region configured to obtain charges based on light received, the photo detection region having a central area and an edge area, a doping density in the edge area being greater than a doping density in the central area, wherein the photo detection region is configured to direct the obtained charges in a first direction and a second direction different from the first direction based on an internal electric field in the photo detection region.

17. The image sensor of claim 16, wherein the doping density increases from the central area to the edge area.

18. The image sensor of claim 16, further comprising:
a first floating diffusion region; and
a first photo gate between the photo detection region and the first floating diffusion region, the first floating diffusion region configured to accumulate the charges based on an operational state of the first photo gate.

19. The image sensor of claim 18, wherein the first photo gate is smaller than the photo detection region.

20. The image sensor of claim 18, further comprising:
a second floating diffusion region; and
a second photo gate between the photo detection region and the second floating diffusion region, the second floating diffusion region and the second photo gate being on a different side of the photo detection region than the first floating diffusion region and the second floating diffusion region.

21. The image sensor of claim 20, wherein the second photo gate is smaller than the photo detection region.

22. The image sensor of claim 20, further comprising:
a first gate between the first photo gate and the second photo gate.

23. The image sensor of claim 16, further comprising:
a first gate over the photo detection region.

24. The image sensor of claim 16, wherein the doping density continuously increases from the central area to the edge area.

25. The image sensor of claim 16, further comprising:
a plurality of storage regions configured to store the obtained charges, the plurality of storage regions being different than the photo detection region.

* * * * *